United States Patent [19]
Hazani

[11] Patent Number: 6,136,652
[45] Date of Patent: Oct. 24, 2000

[54] PREVENTING DIELECTRIC THICKENING OVER A CHANNEL AREA OF A SPLIT-GATE TRANSISTOR

[76] Inventor: Emanuel Hazani, 1210 Sesame Dr., Sunnyvale, Calif. 94087

[21] Appl. No.: 08/890,724

[22] Filed: Jul. 9, 1997

Related U.S. Application Data

[60] Division of application No. 08/497,608, Jun. 30, 1995, Pat. No. 5,677,867, which is a continuation-in-part of application No. 08/179,587, Jan. 10, 1994, Pat. No. 5,440,518, which is a division of application No. 07/713,995, Jun. 12, 1991, Pat. No. 5,278,785, which is a continuation-in-part of application No. 07/377,311, Jul. 10, 1989, Pat. No. 5,099,297.

[51] Int. Cl.⁷ .............................................. H01L 21/8247
[52] U.S. Cl. .......................... 438/260; 438/264; 438/266
[58] Field of Search .................................. 438/266, 265, 438/260, 261, 264

[56] References Cited

U.S. PATENT DOCUMENTS

| | | | |
|---|---|---|---|
| 3,996,657 | 12/1976 | Simko et al. ............................. | 29/571 |
| 4,069,067 | 1/1978 | Ichinohe ................................... | 148/1.5 |
| 4,115,314 | 9/1978 | Harari ....................................... | 29/571 |
| 4,267,632 | 5/1981 | Shappir .................................... | 29/571 |
| 4,288,256 | 9/1981 | Ning et al. ............................... | 148/1.5 |
| 4,361,847 | 11/1982 | Harari ....................................... | 357/23 |
| 4,380,113 | 4/1983 | Malwah .................................... | 29/577 |
| 4,404,577 | 9/1983 | Cranford, Jr. et al. .................... | 357/23 |
| 4,720,323 | 1/1988 | Sato .......................................... | 437/69 |
| 4,727,043 | 2/1988 | Matsumoto et al. ...................... | 437/29 |
| 4,757,360 | 7/1988 | Faraone ................................... | 357/23.5 |
| 4,763,299 | 8/1988 | Hazani ..................................... | 365/51 |
| 4,795,719 | 1/1989 | Eitan ........................................ | 437/43 |
| 4,804,637 | 2/1989 | Smayling et al. ........................ | 437/52 |
| 4,810,666 | 3/1989 | Taji .......................................... | 437/30 |
| 4,814,286 | 3/1989 | Tam ......................................... | 438/266 |
| 4,833,096 | 5/1989 | Huang et al. ............................. | 437/29 |
| 4,845,538 | 7/1989 | Hazani ..................................... | 357/23.5 |
| 4,849,369 | 7/1989 | Jeuch et al. .............................. | 437/43 |
| 4,851,365 | 7/1989 | Jeuch ....................................... | 437/43 |
| 4,868,619 | 9/1989 | Mukherjee ............................... | 357/23.15 |
| 4,892,840 | 1/1990 | Esquivel et al. .......................... | 437/52 |
| 5,040,036 | 8/1991 | Hazani ..................................... | 357/23.5 |

(List continued on next page.)

FOREIGN PATENT DOCUMENTS 60-167472  8/1985  Japan .

OTHER PUBLICATIONS

R.S. Muller & T.I. Kamins, Device Electronics for Integrated Circuits, 1977, pp 42–52 and pp 383–387.

T. Kamins, "Polycrystalline Silicon For Integrated Circuit Applications", Kluwer Academic Publishers, pp. 134–141, published 1988.

(List continued on next page.)

*Primary Examiner*—Richard Booth

[57] ABSTRACT

A process for a split-gate transistor (e.g. flash-EEPROM cell), which includes a channel's drain-area, a first insulator disposed over the drain-area and a first gate disposed over the first insulator, and a control (select) gate is insulatively disposed over the channel's source-area and over a channel's gap-area located between the drain area and source area.

It includes growing a second thin thermal oxide to be in contact with the first gate and the channel's source-area and gap-area that is adjacent he channel's drain-area, depositing TEOS based LPCVD oxide on the second oxide and then depositing the control gate on the first gate and over the channel's source and gap areas.

It prevents the formation of an oxide beak under the first gate, thereby the first insulator has a uniform thickness. The polysilicon of the control gate conforms to the side wall of the first gate and does not protrude under the first gate.

The transistor programs efficiently, is reliable, has low manufacture cost and is physically and electrically down scalable.

31 Claims, 37 Drawing Sheets

U.S. PATENT DOCUMENTS

| | | |
|---|---|---|
| 5,047,814 | 9/1991 | Hazani .................................... 357/23.5 |
| 5,063,172 | 11/1991 | Manley .................................... 438/265 |
| 5,095,344 | 3/1992 | Harari .................................... 357/23.5 |
| 5,098,855 | 3/1992 | Komori et al. ........................... 437/52 |
| 5,099,297 | 3/1992 | Hazani .................................... 357/23.5 |
| 5,162,247 | 11/1992 | Hazani .................................... 437/43 |
| 5,166,904 | 11/1992 | Hazani .................................... 365/218 |
| 5,200,351 | 4/1993 | Hadjizadeh-Amini . |
| 5,242,848 | 9/1993 | Yeh . |
| 5,278,785 | 7/1994 | Hazani .................................... 365/182 |
| 5,304,505 | 4/1994 | Hazani .................................... 437/52 |
| 5,332,914 | 10/1991 | Hazani .................................... 257/320 |
| 5,440,518 | 8/1995 | Hazani .................................... 365/218 |
| 5,665,620 | 9/1997 | Nguyen et al. . |

OTHER PUBLICATIONS

B. Kwong et al., "Novram Reliability Report", Xivor 1985 Databook, RR–502A, p. 6–1, and pp. 6–4 through 6–7, and p. 6–16, Fev. 1985.

S. Morie et al., "Reliable CVD Inter–Poly Dielectrics For Advanced E&EPROM", 1985 Symposium On VLSI Technology, pp 16–17, May 14–17, May 14–16, 1985.

P. Burgeraff, "Lithography's Leading Edge, Part 1: Phase Shift Technology", Semiconductor International, pp 42–47, Feb. 1992.

Y.C. See et al., "An Alignment–Tolerant Contanct Process Using Landing Pads", Motorola Inc. Technical Developments, vol. 12, pp 17–18, , Apr. 1991.

S. Ghandhi, VLSI Fabrication Principles, John Wiley & Sons, pp. 371–400, 1983.

D.K. Brown et al., "Flaws in Sidewall Oxides Grown on Polysilicon Gate", J. Electrochem. Soc., pp 1084–1089, May 1982.

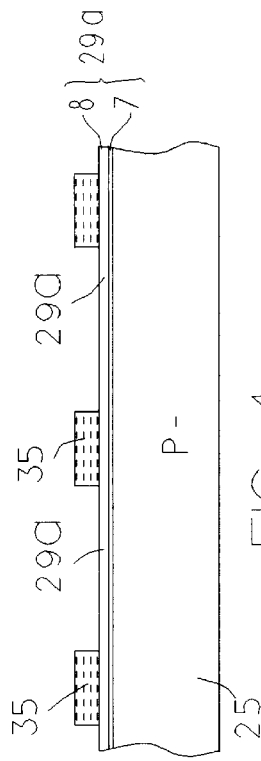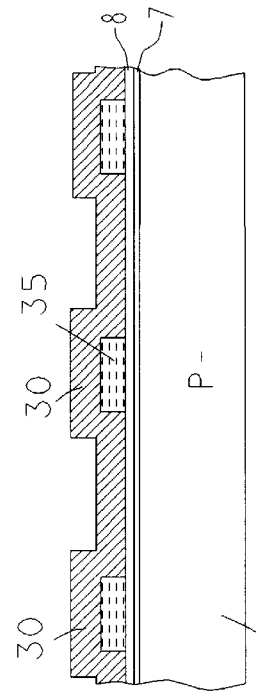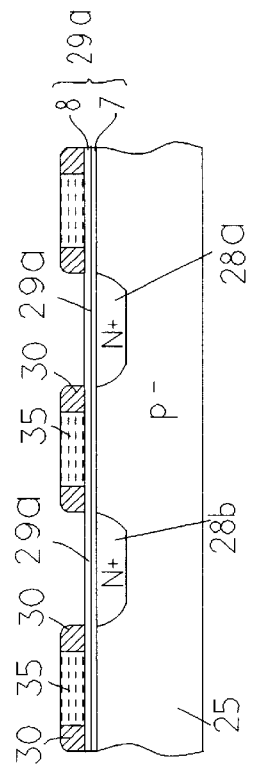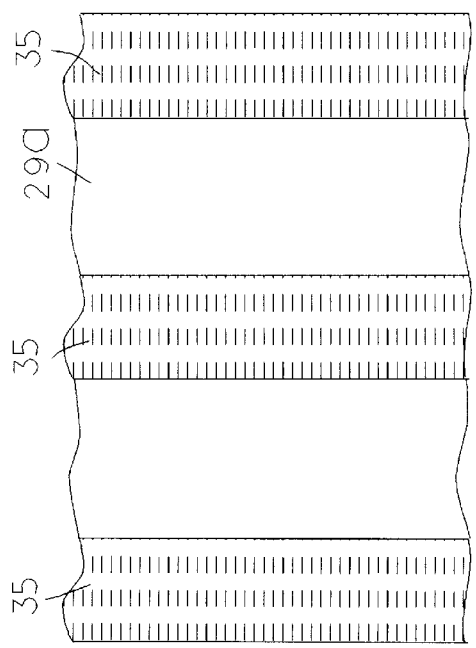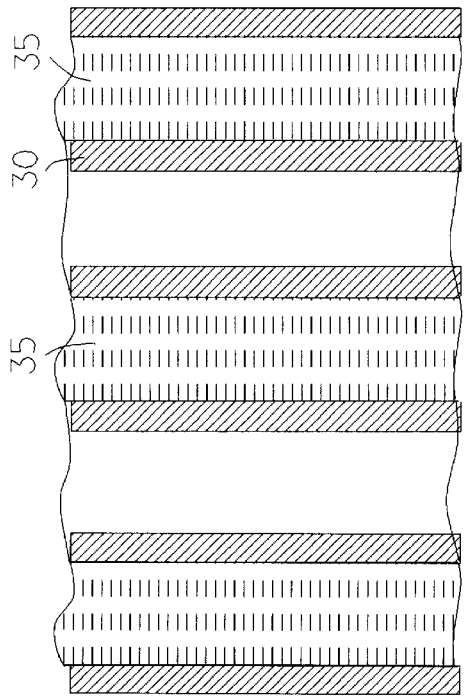

PREVENTING DIELECTRIC THICKENING OVER A CHANNEL AREA OF A SPLIT-GATE TRANSISTOR

The instant application is a division of application Ser. No. 08/497,608, filed Jun. 30, 1995, now U.S. Pat. No. 5,677,867 which is a continuation-in-part of application Ser. No. 08/179,587, filed Jan. 10, 1994, now U.S. Pat. No. 5,440,518, which is a division of application Ser. No. 07/713,995, filed Jun. 12, 1991, now U.S. Pat. No. 5,278,785, which is a continuation-in-part of application Ser. No. 07/377,311, filed Jul. 10, 1989, now U.S. Pat. No. 5,099,297, which all said applications are expressly and entirely incorporated herein by reference.

The instant application is also a continuation-in-part of application Ser. No. 08/677,066, filed Jul. 09, 1996, now U.S. Pat. No. 5,659,514, which is a division of application Ser. No. 08/179,587, filed Jan. 10, 1994, now U.S. Pat. No. 5,440,518, which is a division of application Ser. No. 07/713,995, filed Jun. 12, 1991, now U.S. Pat. No. 5,278,785, which is a continuation-in-part of application Ser. No. 07/377,311, filed Jul. 10, 1989, now U.S. Pat. No. 4,099,297, which all said applications are expressly and entirely incorporated herein by reference.

The instant application is also a continuation-in-part of application Ser. No. 08/229,615, filed Apr. 19, 1994, which is a continuation-in part of application Ser. No. 07/613,235, filed Nov. 14, 1990, now U.S. Pat. No. 5,162,247, which is a division of application Ser. No. 07/326,934, filed Mar. 22, 1989, now U.S. Pat. No. 5,040,036, all incorporated herein by reference.

The instant application is also a continuation-in-part of application Ser. No. 08/229,615, filed Apr. 19, 1994, which is a division of application Ser. No. 07/813,374, filed Dec. 23, 1991, now U.S. Pat. No. 5,304,505, which is a division of application Ser. No. 07/377,311, filed Jul. 10, 1989, now U.S. Pat. No. 5,099,297, which is a continuation-in-part ("CIP") of application Ser. No. 07/327,663, filed Mar. 22, 1989, now U.S. Pat. No. 5,047,814, which is a CIP of application Ser. No. 07/152,702, filed Feb. 5, 1988, now U.S. Pat. No. 4,845,538.

Said application Ser. No. 07/813,374 filed Dec. 23, 1991, now U.S. Pat. No. 5,304,505, is also a CIP of application Ser. No. 07/613,235, filed Nov. 14, 1989, now U.S. Pat. No. 5,162,247, which is a division of application Ser. No. 07/326,934, filed Mar. 22, 1989, now U.S. Pat. No. 5,040,036.

The instant application is also a continuation-in-part of application Ser. No. 08/229,615, filed Apr. 19, 1994, which is a division of application Ser. No. 07/778,573, filed Oct. 17, 1991, now U.S. Pat. No. 5,332,914, all said applications are incorporated herein by reference.

OTHER RELATED U.S. PATENT APPLICATIONS

The present application is related to application Ser. No. 07/813.374, filed Dec. 23, 1991, now U.S. Pat. No. 5,304,505, which is a division of application Ser. No. 07/377,311, filed Jul. 10, 1989, now U.S. Pat. No. 5,099,297.

The present application is also related to U.S. application Ser. No. 613,255, filed Nov. 14, 1990, now U.S. Pat. No. 5,162,247, which is a division of U.S. Ser. No. 07/713,995, filed Jun. 12, 1991, now U.S. Pat. No. 5,278,785, which is a continuation-in-part of above referenced application Ser. No. 07/377,311, now U.S. Pat. No. 5,099,297. All said related patent applications are expressly and entirely incorporated herein by reference.

The present application is also related to U.S. Pat. Nos. 4,763,299 issued Aug. 9, 1988, and 4,845,538 issued Jul. 4, 1989, and 5,040,036 issued Aug. 13, 1991, and 5,047,814 issued Sep. 10, 1991, and 5,332,914 issued Jul. 26, 1994, and 5,166,904 issued Nov. 24, 1992, all issued to the same Applicant of the instant application and are all expressly incorporated herein by reference.

FIELD OF THE INVENTION

The present invention relates to electronic memory devices and, more particularly, to a device having an improved cell structure, cell array, and methods of operation of a semiconductor memory.

BACKGROUND OF THE INVENTION

MOS (metal oxide semiconductor) transistor technology was developed and became practical few decades ago, several types of memory devices were introduced since that time among them are UVEPROMs, full-featured EEPROMs, Flash-EEPROMs, Analog Storage EEPROMs, volatile DRAMs, non-volatile DRAMs, volatile SRAMs, non-volatile SRAMs, Programmable Logic Devices (PLDs), Field Programmable Gate Arrays (FPGAs), Artificial Neural Network (ANN) devices, and other customized memory devices.

Volatile SRAM is a static read/write random access memory whose storage cells are remain in a given state until the information is intentionally changed, or the power to the memory circuit is cut off.

Volatile dynamic random access memories (DRAMs) is likewise a semiconductor memory that stores binary information. The word "dynamic" refers to the fact that the charge representing the stored information is refreshed or replenished. Typically the information stored in the capacitor of each memory cell is either a "1" or a "0" representing one digital bit per one physical memory cell. Later this data may be read out from the memory cell of the device. The most commonly used DRAM chip is a read/write random access memory which is based on a memory cell that is structures to include one transistor one capacitor combination, in which the digital information is represented by charges that are stored in the storage capacitor. The storage capacitor has one of its plates acting as a storage node and the other plate acting as a plate that is connected to adjacent memory cell capacitors and is biased at some voltage. When the memory cell is not-selected (also referred to below as deselected) the memory cell transistor is turned off and disconnects the storage plate of the capacitor from any voltage or current source and the storage plate of the DRAM's capacitor is said to be floating.

In a dynamic random access memory or DRAM the information is refreshed or rewritten as needed to avoid losing information because of electrical activity and read/write operations in the memory array including operations associated with neighboring memory cells. In this way a high or "1" logical level signal is restored to a stored "1." The refresh operation occurs by sensing or reading what is stored in a memory cell and restoring it to the proper voltage level that represents the same logical state.

There have been significant advances in the art of memory cells. Many such advances are equally applicable to both EEPROMS and DRAMs, and it should be understood that new or improved element of a cell structure can be of great utility in any semiconductor memory cell. The utility is more noticeable when the memory cell is comprised of fewer elements. For example a DRAM memory cell (either volatile or non-volatile) having a transistor and a capacitor typically uses a MOSFET transistor and a capacitor structure of the same materials that are used in some EEPROMs such as the EEPROMs disclosed in U.S. Pat. Nos. 4,845,538 and 5,166,904 issued to the applicant of this application and are expressly incorporated herein by reference.

Non-Volatile SRAMs (NOVRAMs) were developed in the early 1980's and include a cell that is comprised of a combination of SRAM cell element and at least a portion of an EEPROM cell element.

Generally the goal in forming any memory device is to minimize the physical size of the memory cell and memory array thereby to maximize the packing density of cells per chip area which results in exponential increase in the production yield of good chips from a semiconductor wafer.

Generally, it is desirable to have the highest value of charge possible stores in the memory cell capacitor, especially since the memory cells are getting smaller in each new generation of DRAMs and EEPROMs. Storing higher value of charge in the capacitor generally leads to more reliable operation, higher immunity to soft errors caused by alpha-particles and higher speed operation due to the improved ratio of cell signal to array noise. To increase the amount of stored charge in the memory cell, either the voltage or the capacitance, or both, must be increased according to the charge equation $Q=CV$, where Q is the charge value, C is the capacitance value and V is the voltage value. Certain tradeoffs are involved in the method selected to increase the stored charge. If one decides to increase the capacitance of the memory cell, either a larger physical capacitor footprint area is needed which exponentially increases manufacturing cost of the memory chip, or some innovative solution is required (such as disclosed and claimed by the Applicant of the instant application in U.S. Pat. No. 5,166,904) in order to reduce the physical footprint area of the storage node of the capacitor using economically affordable semiconductor chip fabrication processing steps. On the other hand, increasing the voltage on the chip is not desired because it increases the programming time in of the cells in EEPROMs, causes reliability constrains which prevents the use of thin dielectric layers within the memory cell capacitor and under interconnect lines that form the memory array and its associated peripheral circuits and reduces efficiency. It would be greatly advantageous to provide a memory cell with increased capacitance and reduced operating voltages inside the chip.

U.S. Pat. No. 4,763,299 issued to the applicant herein programs by using hot electrons from the substrate. It has a very high programming efficiency. The programming time of a single cell of this embodiment is much shorter than that of a tunneling-program mechanism alone, in the range of one micro second (1 uS). This programming efficiency also reduces the programming drain-source current to about one microampere (1 uA), which is much lower in comparison to other cells that program by use of hot electrons from the substrate. The shorter programming time of the cell of '299 patent together with the low programming current becomes extremely advantageous in applications such as Solid-State-Disks for computers, hand-held computers, and for IC-Card Cameras in which the digitally processed image is rapidly stored in a EEPROM semiconductor memory which can be produce at lower cost than SRAM memory. It is estimated that the IC-Card Camera will take over the multi-billion dollar photographic market place in the near future. Construction of IC-Cards from memories that are based on chips that are constructed using memory cells that comprise one capacitor-one transistor configuration are much more suitable for use in IC-Cards because of the lower cost afforded by these type of memories as oppose to SRAM based IC-Cards.

It is desired to further reduce the programming/erasure voltage of EEPROM cells, while compensating by increasing the capacitance of the cells, while reducing the cell size in order to reduce production cost. Preferably, the foregoing should be accomplished using conventional photolithography equipment (such as photo-light based step-and-repeat cameras and projection aligners, conventional chemicals and photoresists, etc.)

The memory array of memory chips can be further reduced in size if the arrangements of the memory cells, or groups of memory cells is configured in a novel way and in order to take advantage of certain constrains induced by characteristics of materials and known practical limitations of processing equipment for forming structures such as interconnect wires from those materials. For example it is known that a common interconnect metal in chips is formed of aluminum-silicon-copper, which has a low ohmic sheet resistance per square of below 40 milliohm, however the definition of a minimum line width of interconnect is typically much wider than the line width of polycrystalline silicon interconnect which has ohmic sheet resistance per square of about 30 ohms. This brings about the need to take advantage of this facts in order to further reduce the size of the memory array matrix beyond the size reduction that is contributed by the advantage of the memory cell.

The storage density of information in a memory chip can also be increased beyond the contribution of the advantages of the physical memory cell by storing more than one logical bit per physical memory cell. This is disclosed in some details in U.S. Pat. No. 5,278,785 issued to the applicant of this application and which is incorporated herein by reference. Memory chips or memory systems that use such a storage concept can benefit from improved reliability of the stored data within the physical memory cell and from improved performance of such memory cells.

SUMMARY OF THE INVENTION

The invention provides an improved memory cell employing the polysilicon tunneling concept to erase and to program.

The invention provides a smaller memory cell size with an additional polysilicon which is shared between two read control word-lines, the addition of the polisilicon line making the implementation of EEPROM memories using substrate materials other than silicon easier.

The invention provides a cell array and process for production thereof in which four cells share a diffusion terminal and a polysilicon erase terminal that is partially disposed over a diffusion bit line, and each cell's floating gate is an elongated member that has a programming section and an erase section disposed about the bit-line axis.

The invention provides cell structures pertaining to UVE-PROM (ultra-violet erasable and hot electron programmable ROM), One-Time Programmable (OTP) EPROM, Flash-EEPROM, thin tunneling dielectric EEPROMs or DRAMs that use insulated control gate for the memory transistor.

The invention allows better control of the channel length dimension of the floating gate by use of chemical definition, as opposed to a photolithography equipment.

This invention provides other EEPROM cells that use the polysilicon to polysilicon tunneling concept to erase and also to program. The process to fabricate the cell and array is also an improved process to build embodiments of memory cells such as the cell of U.S. Pat. No. 4,763,299 (the '299 patents), which result in a smaller cell size thus reduce production cost.

One aspect of the invention discloses an operation as an EEPROM with a memory cell size smaller than the cell disclosed in U.S. Pat. No. 4,845,538, due to the use of a new capacitor structure that uses an additional polysilicon line that is used as an upper capacitor plate and that is shared with other memory cells.

Another embodiment of the present split-gate invention pertaining to UVEPROM (ultra-violet erasable and hot electron programmable ROM), One-Time Programmable (OTP) EPROM, Flash-EEPROM, or other EEPROMs that require only one insulated control gate for the memory transistor, improves on the previous art by providing a smaller cell size if the same minimum critical- dimension of photolithography equipment are used in fabrication of the cell. Also it provides better control of the channel length dimension of the floating gate, by using chemical definition, as oppose to a definition by photolithography equipment which depends on the precision of the machinery's resolution and misalignment, in addition to the photoresist resolution. The embodiment provides by means of self-alignment a better control over the coupling overlap-area between the drain diffusion and the floating gate in order to minimize this coupling while keeping it to a controlled value. This self-alignment together with a uniform capacitive coupling between the floating gates and their associated word-lines independently to the floating gate's location within the array provide for a more uniform read current and for more uniform programming voltage and timing conditions for all the memory cells and therefore provide for improved manufacturing yield.

Another aspect of the invention provides a structure that reduces the chance that undesirable parasitic electrons will travel to the floating gate of a transistor from its channel area thereby increasing the reliability and reducing the data error problem due to this effect. The structure includes a sandwich of thermal oxide and deposited TEOS oxide as a gate oxide under the floating gate.

Another aspect of the invention provides an improved split-gate non-volatile memory transistor that is suited to store large number of quantized charge level that represent digital bits or analog signal voltage. This is done by forming the gate oxide directly under the control gate, which gate oxide is adjacent the gate oxide of the floating gate, of a sandwich of thermal oxide and deposited TEOS oxide. Thereby reducing the threshold voltage variation among memory cells and among chips of different manufacturing batches.

Another aspect of the invention improves the alignment between the erase gate and the control gate of a memory cell. It also improves the alignment between the erase gate and the erase region of the floating gate. This is accomplished while retaining the thickness of the dielectric layer (for example silicon dioxide) between the floating gate and the control gate uniform. This uniformity is achieved by preventing encroachment of the oxide that is formed after the control gate is formed from encroaching into the area between the control gate and the floating gate. This is done by thermally growing a thin silicon dioxide layer that does not consume much polysilicon material from the two layers and thereafter depositing a silicon dioxide at lower temperature on the thin thermal oxide.

Preventing this encroachment is important because if it occurs it makes thickness of the dielectric near the edges of the control gate thicker than the thickness of the same dielectric near the center of the control gate. This has the negative effect of reducing the coupling capacitance between the control gate and the floating gate and prevents easy scaling down of the transistor..

Another aspect of the invention provides a capacitor structure that increases the capacitance per unit-area of the underlying substrate when the unit-area that is considered is the area that is disposed directly under the bottom plate of the capacitor. The increase in capacitance results from the fact that a surface of the bottom plate that comes in contact with the dielectric material of the capacitor is textures or engraved to form undulations or apserities and thereby increase the effective capacitor area which directly increases the capacitance value of the capacitance. However to reduce charge transport between the plates of the capacitor an insulator that is characterized by exhibiting a bulk-limited type of electron conduction is used as part of the dielectric in order to reduce the possibility of charge transport between the plates. The insulator also has a dielectric constant that is higher than the dielectric constant of a silicon dioxide thereby further increasing the capacitance of the capacitor and thereby further reducing the possibility of charge transport between the plates under the voltage operating conditions across the capacitor plates.

This capacitor structure improves the operation of several type of electrically readable and electrically writable memory cells including volatile DRAM such as a DRAM disclosed in U.S. Pat. No. 4,937,650, issued to Shinriki and is expressly incorporated herein by reference, or a DRAM described in an article titled "A 1 Mb DRAM with 3-Dimensional Stacked Capacitor Cells", by Y. Takmae, et al., in ISSCC-Digest of Papers, Feb. 15, 1985, pg 250, and is expressly incorporated herein by reference, or a Non-Volatile DRAM and dynamic latch circuits that are used in logic circuits such as D-flip-flops. The capacitor is also fit for use in other electronic circuits such as voltage multipliers and charge pumps that are use for power conversions. The capacitor is also fit for use in analog circuits such as switch-capacitor filter circuits, digital-to-analog (D/A) and analog-to-digital (A/D) circuits, and analog sample-and-hold circuits.

Another aspect of the invention is an architecture for an array of memory cells that uses two select lines in each end of an array segment to allow access to an embedded bit-line diffusion thereby eliminating the need for a physically wide metal wire that connects to and along that embedded bit-line. The isolation between adjacent bit-lines that are embedded is performed by a shield gate which also provide the isolation between adjacent bit-lines that are not embedded. This results in reduction in memory array area per given number of memory cells.

Another aspect of the invention is an architecture for an array of memory cells that uses only one select line in each end of an array segment and another select line that is used to connect between two adjacent array segments along the bit line axis and to allow access to an embedded bit-line diffusion segment that is isolatable and extendable thereby eliminating the need for a physically wide metal line that connects to and along that embedded bit-line. This results in reduction in memory array area per given number of memory cells.

BRIEF DESCRIPTION OF DRAWINGS

FIG. 4a is a cross section illustrating the stage of manufacturing of the device of FIG. 2 after the definition of the isolation region. Here nitride is deposited and etched.

FIG. 4b is a top view of the array of FIG. 1 illustrating the same initial stage of manufacturing of the device of FIG. 2.

FIG. 5 illustrates the deposition of the first poly-silicon layer.

FIGS. 6a and 6b illustrate a cross section and top view, which result after the first anisotropic etching of the first polysilicon and after ion implantation of the bit-line diffusion.

FIG. 7a is a cross section along line 101—101' of FIG. 7b.

FIG. 8a is a section cut along line 201—201' of FIG. 8b.

FIG. 9 is a cross section cut along line 202—202' of FIG. 8b before the removal of the photoresist that protects the floating gate along the even numbered word-lines from the etchant.

FIG. 10a is a cross section cut along line 301—301' of FIG. 10b before the removal of the photoresist that protects the floating gates from the etchant.

FIG. 12 also illustrates the structure of the capacitor with increase capacitance of the present invention.

FIGS. 16a–c illustrate the use of CVD oxide spacer in the formation of N– diffusion implant in one side of the floating gate in order to create an asymmetry in programming of a non-split-gate EEPROM embodiment.

FIGS. 34A, 34B and 34C are simplified cross sections along lines A, B and C of FIG. 33, which do not show the details of the gate oxide layers, the floating gate to drain overlap and do not show the sandwich of thermal oxide and deposited oxide over the bit line diffusions regions. These details are shown in the embodiment of FIG. 26.

DETAILED DESCRIPTION OF THE INVENTION

Figure 1:
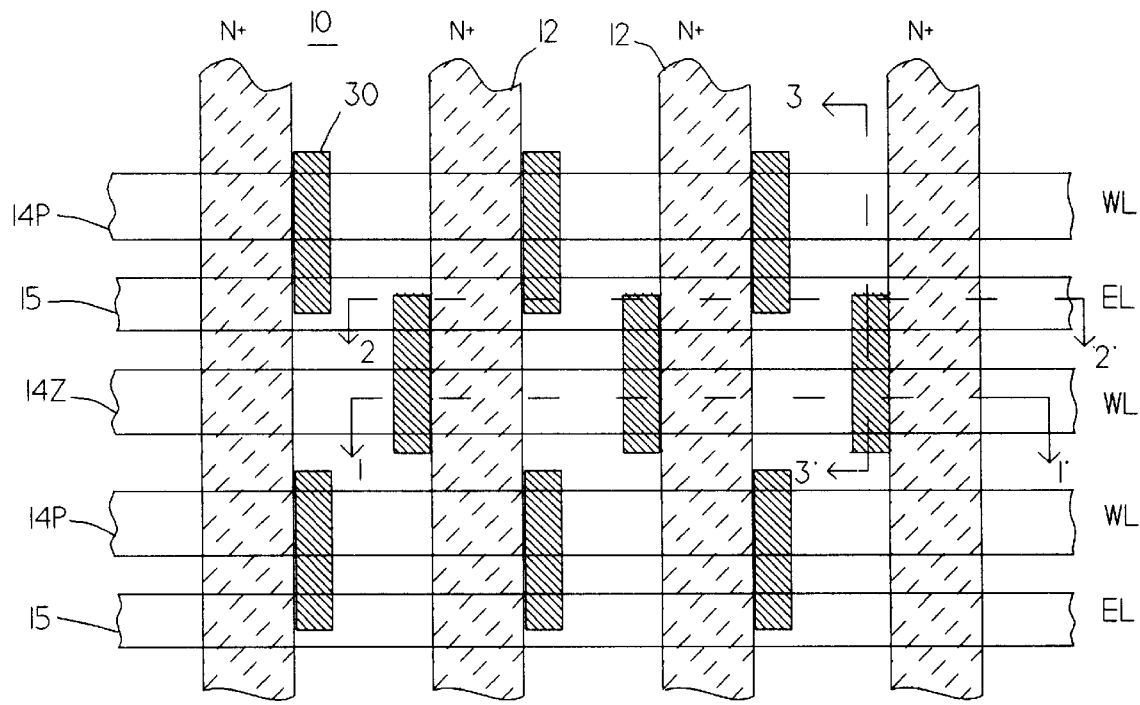
FIG. 1 is a plan view of a portion of a memory chip containing an array of the first embodiment of the present invention.

FIG. 1 depicts the overall layout of an array of memory cells, here EEPROM cells in accordance with one embodiment of the present invention. Referring now to FIG. 1, the array is laid out on the major surface 10 of a P doped monocrystalline silicon substrate. A first set of equispaced, vertical N+ regions form the source/drain lines of the array. These source/drain lines are crossed by a first set of horizontal polycrystalline silicon (polysilicon) read word lines 14. The source/drain lines 12 are also crossed by a second set of horizontal polysilicon program/erase word lines 15. A third set of floating gate polysilicon layers 30 each include a first region disposed below an associated word line 14.

The read word lines 14 and the program/erase word lines 15 and floating gates 30 may be formed from separate poly layers that are deposited over the substrate and then selectively etched.

An area of one type of EEPROM memory cell is defined at the intersection of each source/drain line 12 with the two word lines; the read word line 14 and the program/erase word line 15.

The structure of several embodiments of the memory cell and its arrays will now be described with reference to FIGS. 1 to 36.

Figure 2:
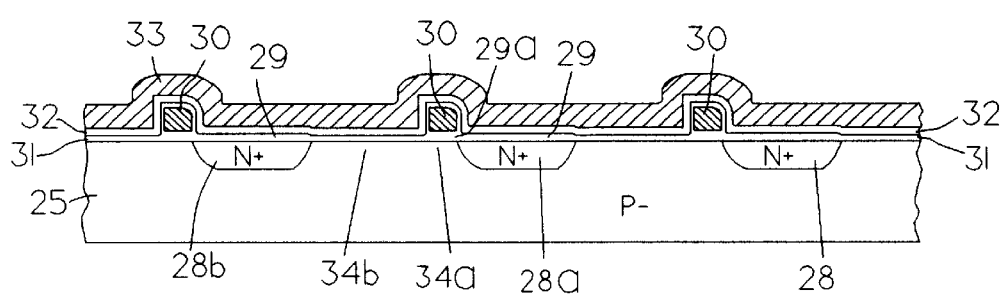
FIG. 2 is a cross section view of the memory cells of FIG. 1 along the channel regions, line 1—1' of FIG. 1.
Figure 23A:
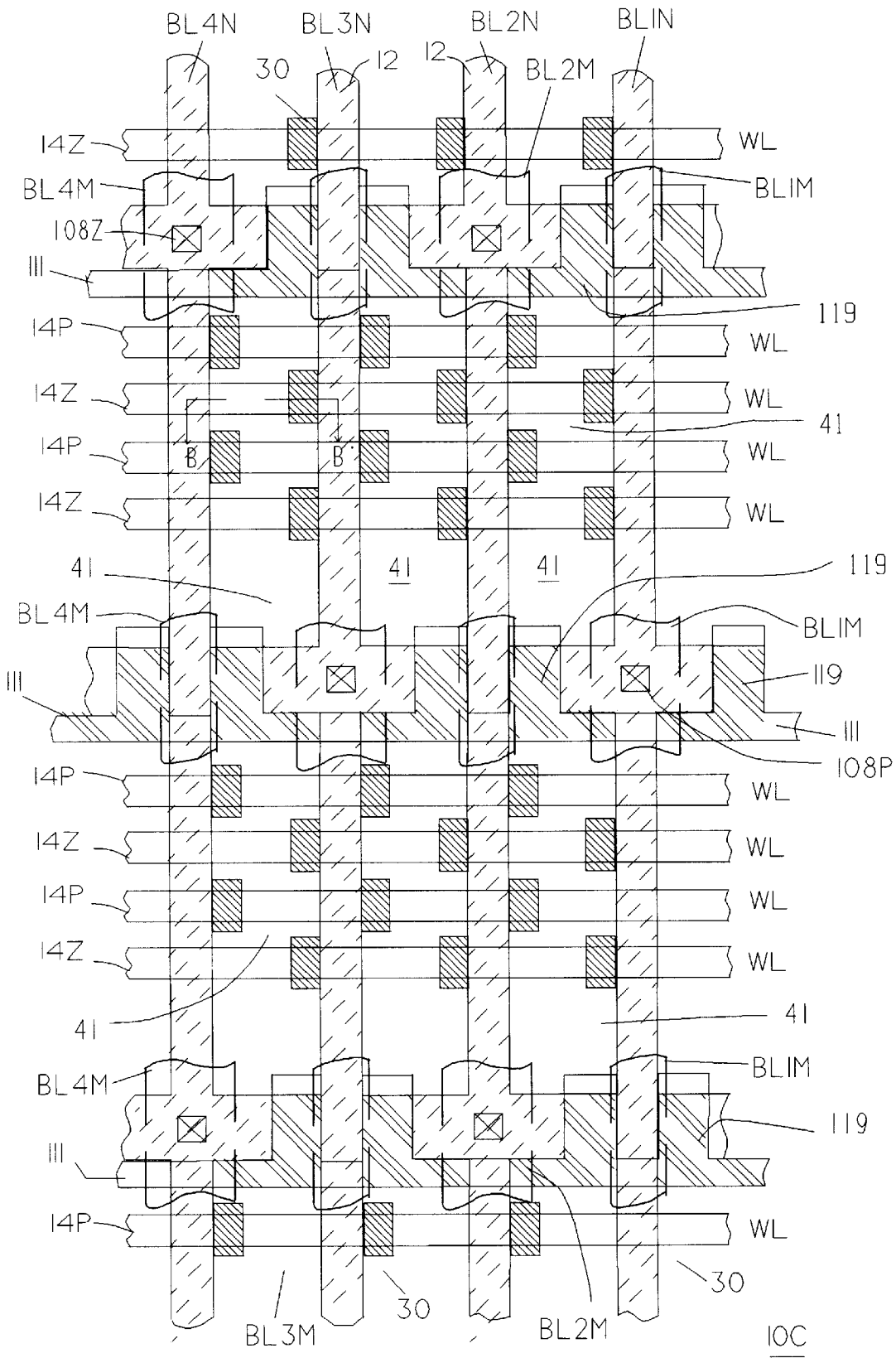
FIG. 23a is a plan view of a memory cell array according the seventh embodiment of the present invention in which the memory array includes memory cells that have only one read word line in a row and in which the end cap of the floating gate is short and is not disposed under other conductive layer that is adjacent to the word line. The shortest distance between adjacent bit-line diffusion regions is determined by a shield gate.
Figure 23B:
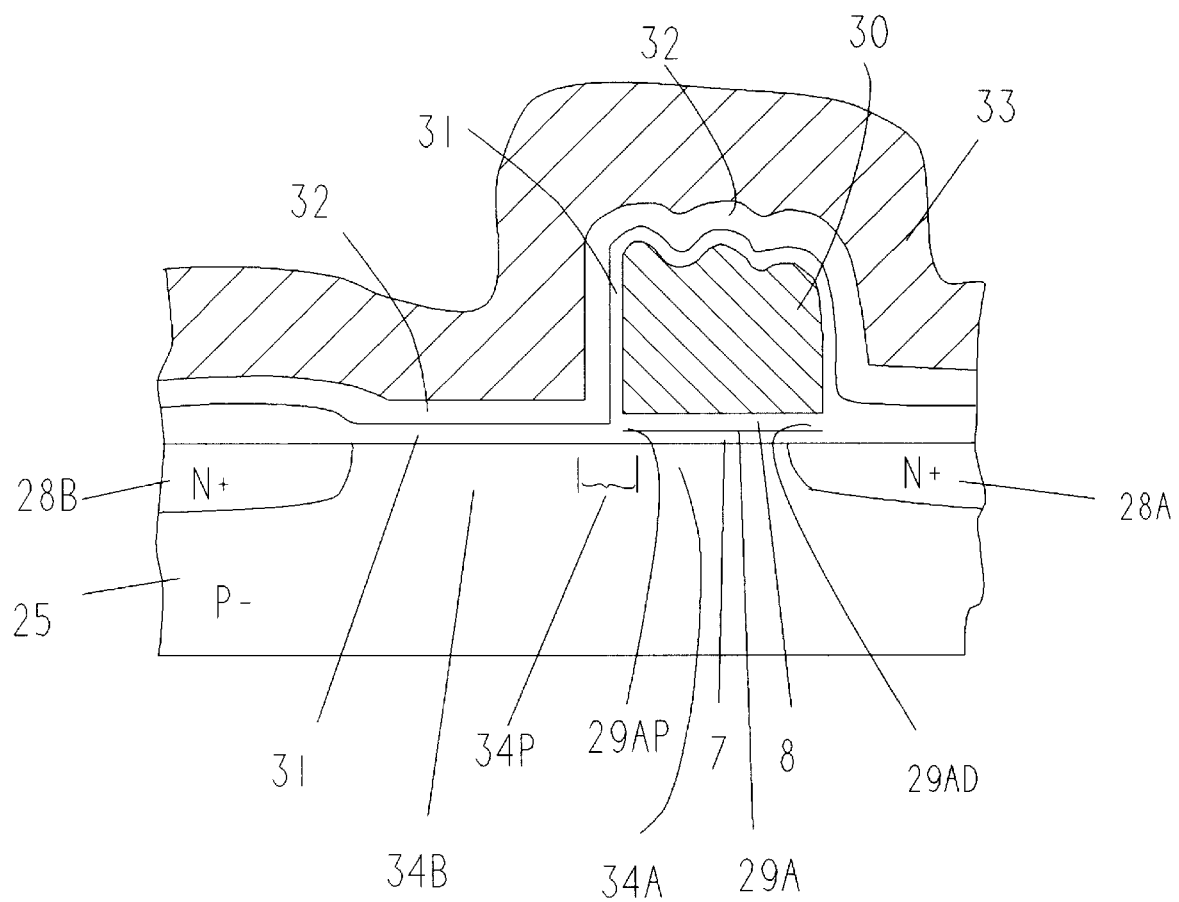
FIG. 23b is a cross section cut along line B—B' of the array of FIG. 23a illustrating a section of the memory cell.

FIG. 2 and FIG. 23B illustrates a cross-sectional view of a memory cell of the first embodiment taken along cut 1—1' of FIG. 1. The cell includes a p- substrate 25. Two n+ diffused regions 28a and 28b are spaced apart by a channel 34. An oxide layer 29 covers regions 28a and 28b. The drain area 34a of the channel is covered with an oxide layer 29a and a polycrystalline silicon layer 30. The source area 34b of the channel is covered by a thermal oxide layer 31. Thermal oxide layer 31 is covered by and disposed under a deposited TEOS oxide layer 32 which is thicker than thermal oxide 31. Polycrystalline silicon layer 33 is disposed over deposited oxide layer 32. Oxide layer 29 is greater in thickness over the n+ diffused regions 28a and 28b that are not overlapped by the floating gate 30 than the thickness of oxide layer 29a over the drain area 34a of the channel. Silicon dioxide layers 31 and 32 isolate the polycrystalline region 30 and the polycrystalline layer 33. Polycrystalline layer 33 that is disposed over the upper surface of oxide layer 32 over the source area 34b of the channel 34 and also disposed over the upper surface of oxide layer 32 over the polycrystalline region 30. The deposited TEOS-silicon dioxide layer 32 is directly disposed over and is in contact with thermal oxide layer 31. Thermal silicon dioxide layer 31 is disposed over and is in contact with the source area 34b, oxide layer 31 is also disposed over and is in contact with the polycrystalline floating gate layer 30. The channel region 34 of the cell is integrally formed between the n+ regions 28a and 28b. The n+ regions 28a and 28b form the drain and the source of the transistor respectively. A floating gate 30 is formed by the polycrystalline silicon region 30 over the drain area 34a of the channel. The control gate is formed by the polycrystalline silicon 33 over the source area of the channel 34b and over the floating gate 30.

Figure 3:
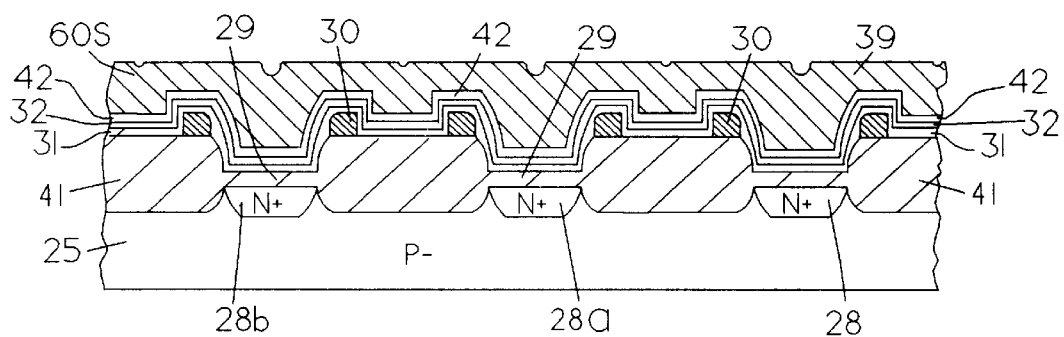
FIG. 3 is a cross section view of the memory cells of FIG. 1 along the isolation regions, line 2—2' of FIG. 1.

FIG. 3 illustrates a cross-sectional view of the array of memory cells along the program/erase word line, cut 2—2' of FIG. 1. Field oxide regions 41 form isolation regions to separate the bit-line diffusion 28a and 28b. Floating gates 30 are separated from each other and from program/erase word line 60s by interpoly oxide isolation layers 31, 32 and 42.

Referring to FIG. 4a it illustrates a cross sectional view of the wafer for a fabrication steps, which comes after the definition of the isolation regions. Field isolation regions are defined by a photolithography mask step. These defined region are then etched into the wafer and the field oxide 41 is then thermally grown over these regions in a manner well known in the art.

The gate oxide 29a of FIG. 4a is 250 angstroms thick and is formed of a first layer 7 that is 100 angstroms thermal oxide and a second layer 8 of a TEOS based LPCVD deposited oxide that is 150 angstroms thick that was densified by thermal annealing. One method of forming gate oxide 29a includes the steps of thermally growing layer 7 directly on the substrate 25 at 800 degrees centigrade to a thickness of 100 angstroms. Thereafter another layer of LPCVD silicon dioxide layer 8 that was previously reacted with TEOS (tetraethylorthosilane, also called tetraethylorthosilicate or tetraethyloxysilane) is deposited to a thickness of about 150 angstrom over thermal oxide 31 at a temperature of 650 degrees centigrade.

Thereafter the deposited TEOS oxide layer 8 is densified by continuously annealing the wafer for 15 minutes in a chamber utilizing 1% oxygen ambient diluted by argon at a temperature of 950 degrees centigrade in a manner that exposes TEOS oxide layer 8 to this mixture. It is important that the annealing temperature is about 950 degrees centigrade and not below 925 degrees centigrade in order to ensure the TEOS oxide layer 8 is sufficiently densified in order to prevent oxygen diffusion through it in a subsequent steps of oxidation and therefore degrade the quality and performance of the gate oxide 29a. One such performance degradation may occur after the formation of polysilicon floating control gate 30, when oxidation of polysilicon 30 is performed in order to isolate it from other electrodes. This is because when oxygen diffuses through oxide layer 8, it will oxidize the polysilicon 30 and form an encroachment (also called poly-beak) of oxide between the floating gate 30 and the substrate 25 which makes the thickness of the gate oxide 29a along the edges of the floating gate 30 thicker than thickness of the gate oxide 29a at a location that is away from the edges of the floating gate 30.

The use of this combination of thermal oxide layer 7 and deposited oxide layer 8 produces a gate oxide layer 29a that is continuous and has even thickness of 250 angstroms under all regions of the floating gate 30 that cover the channel area 34a. This has the advantage of overcoming a disadvantage of gate oxide of the prior-art that is comprised thermal oxide alone. This disadvantage is due to the thinning of a thermal gate oxide at the interface region 9 (See FIG. 12) of oxide 29a and the isolation region oxide 41. This thinning at the edge region 9 of the gate dielectric material near the isolation region 41 causes early failure of the memory cell as a result of electron trapping within the gate oxide 29a because electrons that are injected in an undesirable way into the floating gate 30 from the channel area 34, tend to do so primarily at this thinner gate oxide locations 9 under the floating gate 30. The use of the combination of thermal oxide layer 7 and TEOS oxide 8 as gate oxide therefore has the advantage of increasing the number of programming (writing) and reading cycles that are possible with the memory cell and therefore making a memory chip using this cell more compatible with more possible applications, for example, magnetic disk drive replacement memory card.

Thereafter a nitride film 35 is deposited to form a thickness of about 3500 angstroms and patterned by isotropic etching, for example by plasma, to form spaced-apart nitride lines in parallel to the bit-line axis. The result is illustrated as a top view in FIG. 4b.

As shown in FIG. 5, a polysilicon layer 30 is then formed. A preferred method of forming the polysilicon 30 is accomplished by depositing film of amorphous silicon to a thickness of 5000 angstroms on the oxide layer 29a and annealing the amorphous silicon film until it recrystallizes to become polycrystalline silicon 30. The amorphous silicon can be formed by placing the substrate in a chamber and passing silane through the chamber at a pressure of about 500 millitorr and heating the substrate to a temperature of about 560 degrees centigrade. The amorphous silicon layer 30 is then doped with phosphorous by passing $POCL_3$ through a chamber at 950 degree centigrade for about 15 minutes. The $POCL_3$ decomposes to form phosphorous which diffuses into the amorphous silicon layer. At the same time, the amorphous silicon layer is recrystallizes to be polycrystalline silicon 30 (also referred to as poly-1).

An anisotropic etching of poly-1 is performed next using reactive ion etching to a point where poly-1 covers only portions of the oxide 29a as shown in FIGS. 6a and 6b to form elongated polysilicon strips 30.

The bit line diffusion areas 28a and 28b are formed next as illustrated in FIG. 6a, when an n+ arsenic ions 1.0E16/cm2 are implanted at 60 KeV and annealed at 850 degrees centigrade for 15 minutes. This procedure self aligns the bit line diffusion areas 28a and 28b to a defining edge of polysilicon strips 30. During this annealing step of the bit line impurities to form bit line diffusions 28a and 28b, the ions are activated and form an overlap region under the polysilicon strips 30 in an area that will form the drain of the memory transistor. This overlap region is located directly under the region 29AD of the gate oxide 29a as shown in FIG. 23b.

Because the bit line ions were diffused from the bit line region 28 to the substrate area that is disposed directly under the polysilicon strips 30 after the gate oxide 29a was already formed, the thickness of the gate oxide 29a between the polysilicon 30 and the channel region 34 is the same as the thickness of the gate oxide 29AD between the polysilicon 30 and the under diffused portion of the associated bit line 28. That is to say the thickness is uniform and it is preferred that it stays uniform and not be changed due to the following processing steps that are required to complete the formation of the memory transistor and memory array. This is because the overlap region between the polysilicon strip 30 and under diffused portion of diffusion bit line 28 is used advantageously in operation of memory device in various embodiment, as will be detailed below.

Substantially the entire top surface of the polysilicon strips 30 is doped by the same level of impurities. It is important that the top surface topology of the floating gates 30 will be similar independently of their location relative to a bit line to which they are adjacent. This is because a subsequent processing step which forms asperities or otherwise textures the surface of floating gate 30 is dependent on the doping level of the polysilicon. Therefore a similar surface topology among the floating gates 30 of the memory array 10 will result in similar capacitive coupling between the floating gates 30 and their corresponding read word lines 33, thereby resulting in substantially equal and uniform read current value for the memory cells independently of their location within the memory array 10. This uniform capacitive coupling between the floating gates 30 and the word lines polysilicon 33 also contributes to uniformity in programming and erasure of the memory cells since these operations are strongly dependent on the value of this capacitance CP2P1 as is illustrated later below in Equation (1).

In contrast to this invention, prior art methods of self alignment between the bit line and the floating gate of a split gate EPROM such as disclosed in U.S. Pat. No. 4,639,893 assigned to Waferscale Integration Inc., a photoresist is used to cover only a portion of the floating gate while the bit line diffusion is implanted. Since the photoresist is defined by a separate mask than that of the floating gate a misalignment between these two masks typically causes a shift between the two masks that will cause one floating gate disposed for example under an even numbered word line 14Z of FIG. I to have a larger top surface portion covered by the photoresist mask than a covered portion of a floating gate that is disposed under an odd numbered word line 14P of FIG. 1. Where the direction of resist mask misalignment shifting reverses, the portion of a floating gate under word line 14P that is covered by the resist will be larger than the resist covered portion of the floating gate under word line 14Z. Upon texturing of the surface of the floating gates, the portion of a given floating gate that has received higher doping level will be textured to have different size of asperities that the portion that was protected by the photoresist. The portion of the floating gate that is covered by larger asperities will typically exhibit much more capacitance as measured between the floating gate and the overlying polysilicon plate 33. This increase of capacitance is compared with a capacitance that is measured between the portion of a hypothetical floating gate that has a smooth surface and an overlying polysilicon using the same interpolysilicon dielectric material. Therefore if the prior art is used the read current and programming characteristics of memory cells will vary according to their location within the array 10, these characteristic will vary between individual wafers and between wafer batches and will negatively affect production yields and therefore will increase manufacturing cost significantly.

Figure 7A:
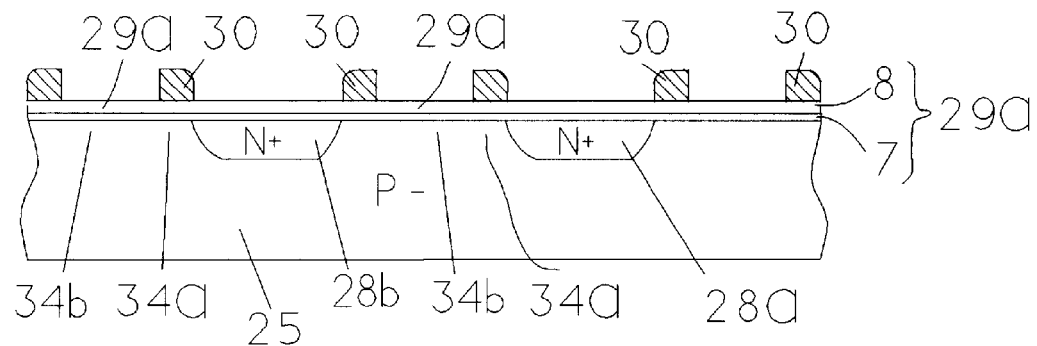
FIGS. 7a and 7b illustrate a cross section and top view, which result after implanting N+ to form the bit-line diffusion and after the removal of the nitride by chemical stripping.
Figure 7B:
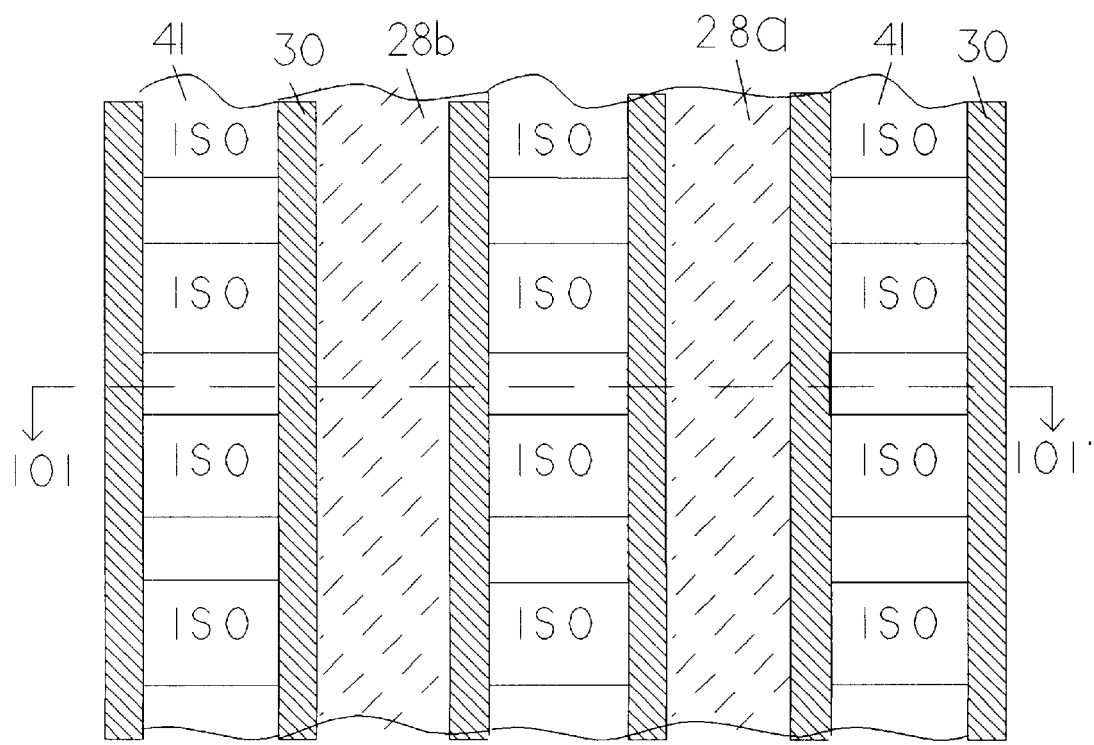

During the next processing step of the present invention the nitride film 35 is removed by chemical stripping. FIGS. 7a and 7b illustrate the result of the processing steps to this point in the process.

FIG. 7a is a section cut along line 101—101' of FIG. 7b. FIG. 7b shows the long lines or strips of polysilicon 30, which will eventually be cut to form the floating gate's electrical width by forming gaps in the elongated polysilicon strips 30. Each polysilicon strip 30 will be used to form at least two floating gates 30 for two separate memory cells. FIG. 7a shows the geometrical width of the polysilicon strings 30, which will form the floating gate's electrical length.

In one example the floating gate poly-1 30 covers less than a third of the channel of the memory cell, so that the source area 34b is as wide as two thirds of the channel. The height of the floating gate poly-1 30 at this step of processing is about 3500 Angstrom, which was the thickness of the nitride layer 35. The geometrical width of the polysilicon line 30, which parallels the electrical channel length of the floating gate is half a micrometer, which is its thickness during deposition.

Due to the fact that the floating gate's geometrical dimensions are controlled by a precise chemical process, the dimensions can be controlled within 5% accuracy. This accuracy can not be achieved by photolithography equipment at this time.

Figure 10A:
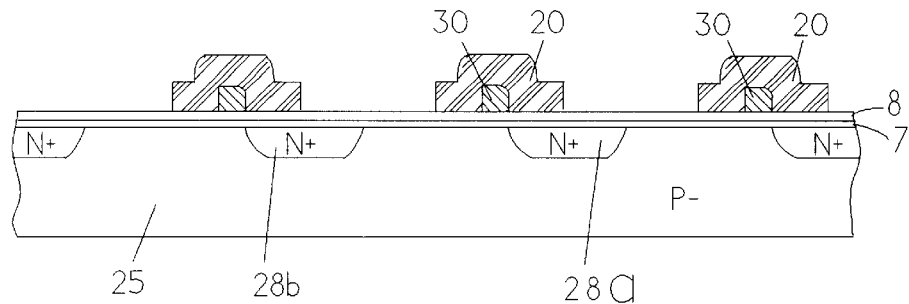
FIG. 10a illustrates a step in the formation of the floating gates.
Figure 10B:
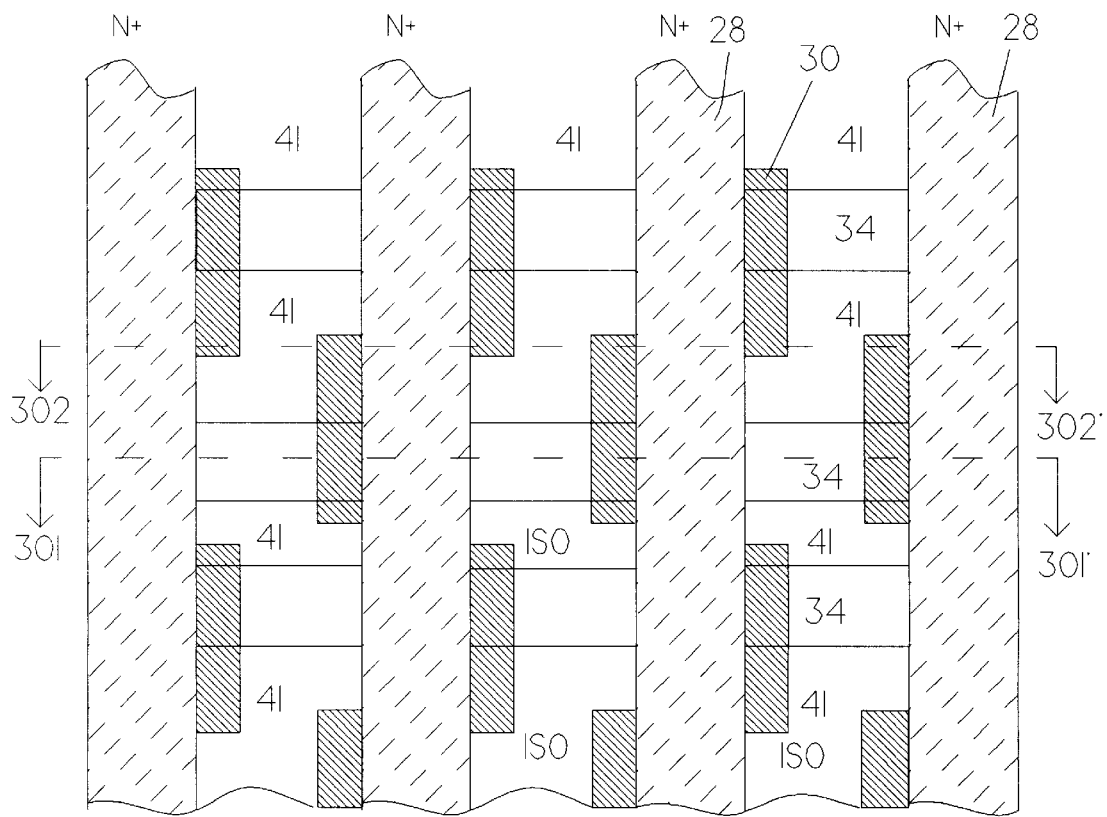
FIG. 10b is a top view of the array of FIG. 1 after the formation of the floating gates, but before the formation of the word line or the interpoly dielectric.

The next step in the process is etching of the polysilicon lines 30 to define the longer geometrical side of the floating gate, which parallels the bit-line axis, and also parallels the electrical width of the memory cell's channel. This is done by covering the polysilicon lines 30 with photoresist layer 20 over areas where it will function as a floating gate, as illustrated in FIG. 10a. The photoresist mask 20 is aligned to the middle of the isolation mask 41, which is between the polysilicon lines 30. After etching layer 30 to form the floating gates, the photoresist is removed. The result of this one photoresist masking step and etching is shown in FIG. 10b.

The anisotropic etching of the polysilicon 30 by plasma or preferably by RIE, provide another opportunity to reduce the memory cell size by narrowing the width of bit line diffusion 28, which is measured between polysilicon lines 30. This can be done due to the ability of the anisotropic etching by plasma or RIE to create a space for diffusion 28, that is narrower than 0.25 micrometers in today's technology, between the two polysilicon lines 30. This could not be achieved if today's photolithography equipment would be used, as described for example in prior art U.S. Pat. No. 4,639,893 assigned to Waferscale Integration Inc., which discloses a process to manufacture a split gate UVEPROM.

By having the capability to narrow the width of bit line 28, one can form the mask of nitride layer 35 (and layer 41), so as to bring the parallel nitride stripes 35 much closer to each other, thus reduce memory cell size. The practical limit of the reduction will be the ability to use resist mask 20 to define the geometrical length of floating gates 30 in one masking step. This is because resist mask 20, which is used to etch polysilicon line 30, will limit the spacing between poly lines 30 along the geometrical width to the photolithography specification.

However, to take maximum advantage of the present invention, further reduction of the cell and array size is achieved by substituting the above process step of one mask definition by photoresist 20 of floating gate 30 with a sequence of defining the geometrical length of polysilicon floating gates 30 using two photoresist masking steps as follows: After the chemical stripping of the nitride 35, and arriving at the result of FIG. 7a, a photoresist 27 is used to protect the polysilicon 30 areas, which will form the floating gates 30P under odd numbered read word lines 14P. The photoresist 27 does not cover the polysilicon line 30 disposed over source areas 34b of the even numbered word lines 14Z, so that this portion of layer 30 will be etched away. The photoresist 27 also totally covers the polysilicon 30 line which will be used to form the floating gates 30Z of the even numbered read word lines, in order to prevent etching. The result of etching to create the floating gate 30P under the odd numbered read word lines 14P is shown in FIG. 8b.

Figure 8A:
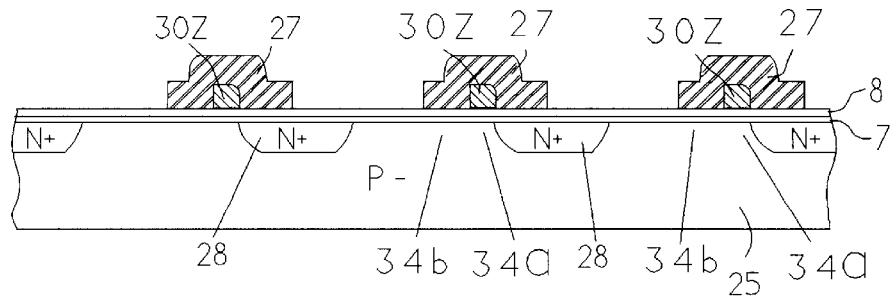
FIGS. 8a and 8b illustrate a cross section and top view respectively, which result after process steps involving the definition of floating gates along odd numbered word lines. The photoresist is not shown in FIG. 8b.
Figure 8B:
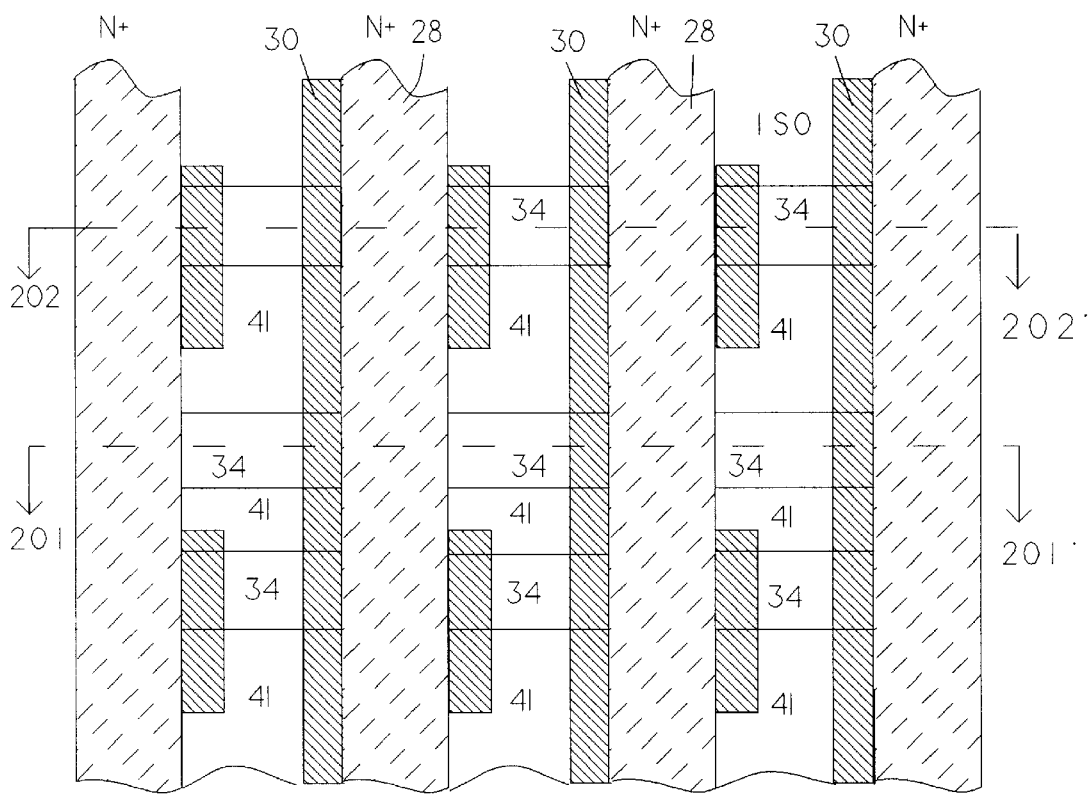

FIG. 8b is a top view of the memory array 10 after the definition of floating gates 30 of the odd numbered read word lines 14P. FIG. 8a is section cut along line 201—201' of FIG. 8b. Line 201—201' runs along the channels 34 and over polysilicon lines 30 of the even numbered read word lines 14Z.

Once the floating gates 30 of the odd numbered read word lines 14P are defined by patterning and the photoresist 27 is removed, the next processing step is to define the floating gates 30 under even numbered read word lines 14Z.

Figure 9:
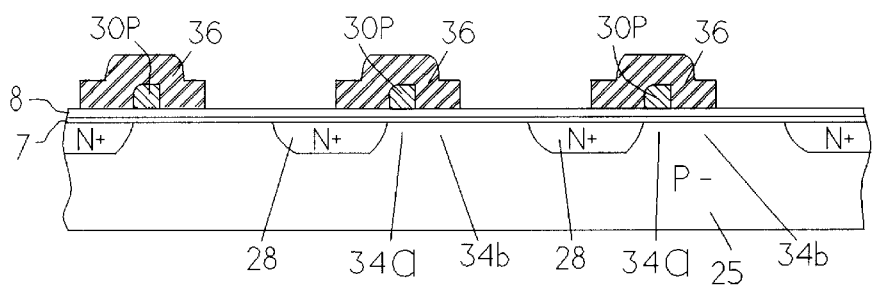
FIG. 9 illustrates a step in the formation of the floating gates along even numbered word-lines.

FIG. 9 is a section cut along line 202—202' of FIG. 8b. FIG. 9 shows the photoresist 36 that protects the floating gates 30P of the odd numbered word lines 14P, while the polysilicon 30 is etched from the source area 34b of the odd numbered read word lines 14P. The resist layer 36 also protect portion of polysilicon line 30 over the drain areas 34a of the channels 34 of the even numbered read word lines 14Z, and over portion of the portion of adjacent isolation field oxide 41. The mask of resist layer 36 is aligned to the middle of the isolation mask 41, as was the case for resist mask 27.

Using two separate photoresist masks 27 and 36, permits further narrowing of the distance between centers of adjacent nitride lines 35 (which is also true for the mask of region 41). This is accomplished by over exposing the positive photoresist material that defines the nitride lines 35 (and that of mask 41) of FIG. 4a and 4b, to a point where the nitride lines 35 are etched to produce final line-width narrower than the minimum specification of the photolithography equipment. When the final line width of nitride strips 35 and isolation layer 41 are planned in advance to take advantage of the overexposed masks, the photoresist masks of layers 35 and 41, will result in a significantly smaller size memory cell that will include the narrow width diffusion bit-line 28 created by the anisotropic etching procedure described above.

Because the mask pattern to form the nitride lines 35 is relatively simple pattern of strait lines it is suitable for definition by a phase-shifting mask that is used in the art to form sublithographic resist patterns on wafers. The technique of phase-shift mask lithography, is described for example in an article written by Burn J. Lin entitled "The Attenuated Phase-Shift Mask" was published in *Solid State Technology*, January 1992, pages 43–47. Using a phase-shifting mask technology to define the line width and line space of nitride lines 35 reduces the memory cell size significantly and contributes to the reduction in cost of manufacture of memory chips using the present invention.

FIG. 10b illustrates a top view of the processed wafer of the memory array 10 of FIG. 1 after the floating gates 30 were defined.

Figure 11A:
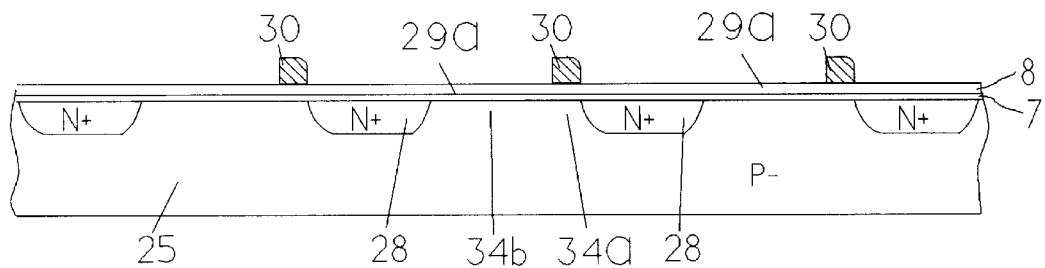
FIGS. 11a and 11b illustrate section cuts along lines 301—301' and 302—302' of FIG. 10 respectively.
Figure 11B:
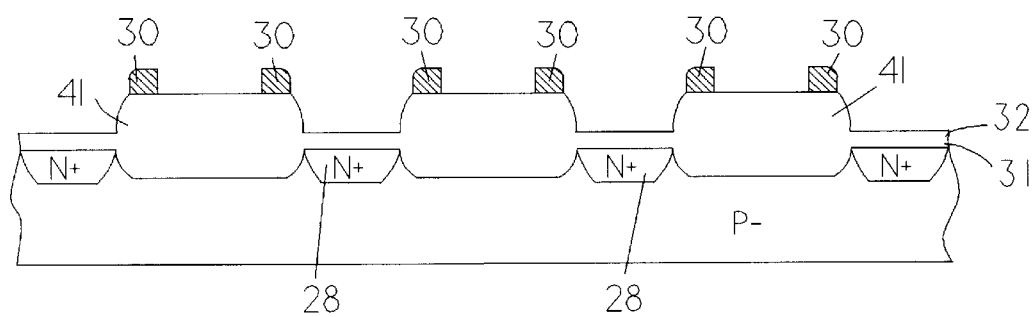

FIGS. 11a and 11b illustrate section cuts along lines 301—301' and 302—302' of FIG. 10 respectively. FIG. 11a shows the portion of floating gate 30 that is insulatively disposed over the channel region 34a. FIG. 11b shows the portion of the floating gate 30 that is insulatively disposed over the isolation field oxide 41 that is positioned between the channel regions 34 of the memory transistors.

In the next processing step the 250 angstroms thin oxide 29a is removed from all area of the wafer excluding drain area 34a of channel region 34 under floating gates 30, where it functions as gate oxide. Floating gate polysilicon 30 protects oxide 29a underneath it from the etchant that etches oxide much faster than polysilicon. This is done in preparation for growing the interpoly oxide dielectric between floating gate poly 30 and either of the word lines' polysilicon. This procedure keeps the oxide thickness over channel region 34b close to the oxide thickens over channel region 34a.

After the removal of the portion of oxide 29a, the floating gate 30's surface is oxidized in an atmosphere of oxygen and steam at 800 degrees centigrade such that mainly the top surface of polysilicon layer 30 at the interface with this thermal oxide (not shown) is textured with asperities. After a period of time of oxidation which gives a desired asperity size, the oxide is removed by etching with buffered hydrofluoric acid, and the surface of the floating gate 30 is covered with asperities, the source area 34b is not covered with oxide. Typically the longer the oxidation to form asperities is carried out, the larger will be the wave-like form or the undulations of the textured surface.

A new thermal oxide 31 is then grown over floating gate 30, source area 34b and the whole array, in a mixture of oxygen and steam at 800 degrees centigrade to a thickness of about 150 angstroms. This thermal oxidation also results in the formation of the thermal oxide portion of the bit line oxide 29 over diffusion regions 28 to a thickness of less than 300 angstroms.

Figure 2A:
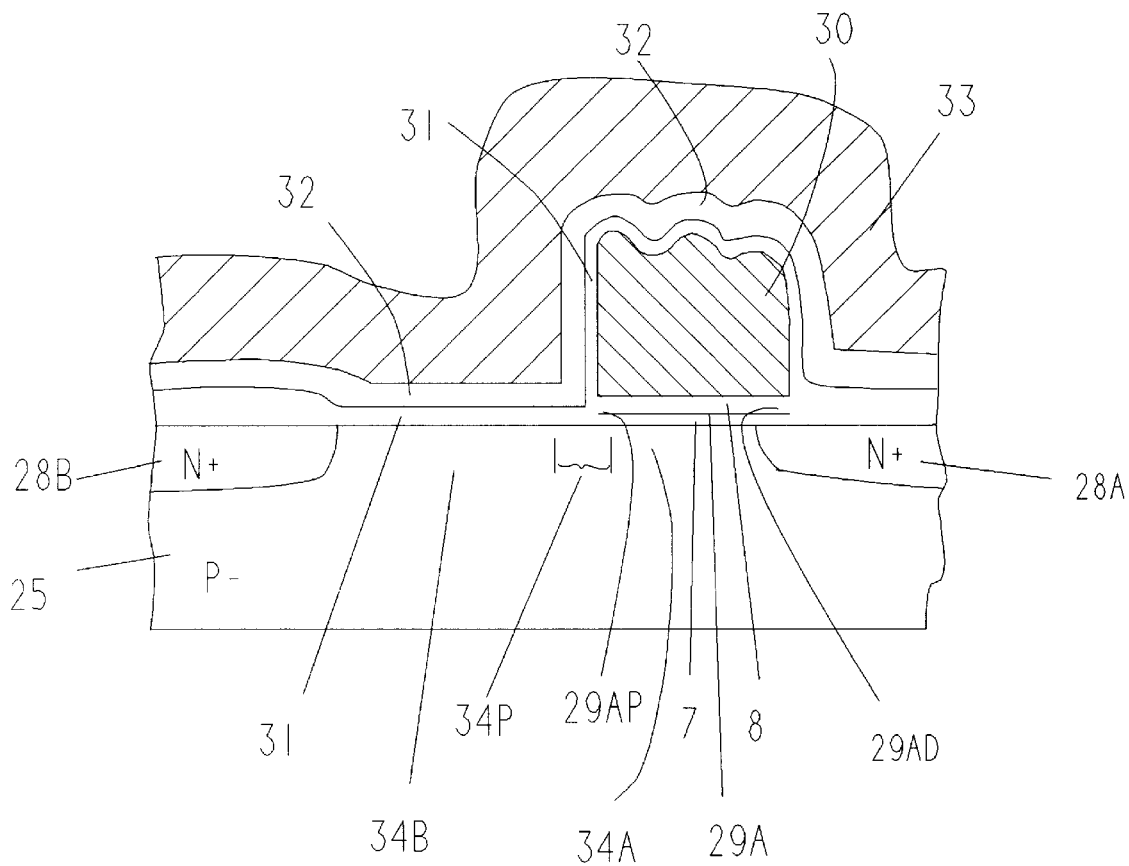
FIG. 2a is a not-to-scale magnified cross section view of a single memory cell of FIG. 1 along the channel region, portion of line 1—1' of FIG. 1.

The two thermally grown oxides, the one that formes the asperities and oxide layer 31 are grown over the channel area 34b to a combined total thickness that is not sufficient to cause encroachment (also called an oxide beak) under the edge of the floating gate 30 that is closer to the source region 28b. Referring to FIG. 2a, this edge of floating gate 30 is insulatively disposed over the channel zone 34p of FIG. 2a. As a result, after the oxide layer 31 is formed the thickness of the portion 29AP of the gate oxide 29a (see FIG. 2a) remains of the same thickness as that of the portion of gate oxide 29a that is disposed over the middle of the drain area 34a of the channel. The fact that thermal oxide 31 is grown only to a limited thickness ensures that the silicon that is used in the formation of the thermal oxide 31 comes from the channel area 34b and from the polycrystalline floating gate 30, and not from the drain area 34a of the channel. This ensures that the gate oxide portion 29AP is not contaminated with diffused silicon from the channel area 34a. If a very thick oxide, of for example a thousand angstroms, is grown and retained instead of layer 31, then large quantity of additional silicon material is needed to feed the reaction, and therefore this additional silicon will be supplied from the nearest location which is the drain area 34a. Contamination of the gate oxide region 29AP is not desired because this oxide is used in some operating modes of the memory cell to transfer electric charge from the channel 34 to the floating gate 30, as will be detailed below in reference to the third operating method of the seventh embodiment. Contamination of the region 29AP of the gate oxide 29A brings about a reduction in the number of programming (write) and read operations of the memory cell before catastrophic failure occurs in which electron trapping in the gate oxide prevents further programming of the memory cell.

At the next step of the process another layer of LPCVD silicon dioxide layer 32 that was formed from TEOS (tetraethylorthosilane, also called tetraethyloxysilane or tetraethylorthosilicate) is deposited to a thickness of about 300 angstrom over thermal oxide 31 at a temperature of 650 degrees centigrade, as is shown in FIG. 2.

Thereafter the deposited TEOS oxide layer 32 is densified by continuously annealing the wafer for 2 to 5 minutes in a chamber utilizing 1% oxygen ambient diluted by argon at a temperature of 950 degrees centigrade in a manner that exposes TEOS oxide layer 32 to this mixture. It is important that the annealing period of TEOS oxide 32 at this stage of the fabrication process will not be much longer than five minutes due to the fact that the exposure of the entire wafer to this annealing environment for longer time period will unnecessarily cause further annealing and lateral propagation of the diffusion regions 28 into the channel region 34, thereby causing the drain and source to be in contact with each other at a wider geometry of the floating gate 30 and preventing the formation of a channel region 34 that is necessary for the existence of a field-effect transistor. It is important that the annealing temperature is about 950 degrees centigrade and not below 925 degrees centigrade in order to ensure the TEOS oxide layer 32 is sufficiently densified in order to prevent oxygen diffusion through it in a subsequent step of oxidation and therefore degrade the quality and performance of this interpolysilicon oxide. One such performance degradation may occur after the formation of polysilicon control gate 33, when oxidation of polysilicon 33 is performed in order to isolate it from other electrodes. This is because when oxygen diffuses through oxide layer 32, it will oxidize the polysilicon 33 and form an encroachment (also called poly-beak) of oxide between the floating gate 30 and control gate 33 of FIG. 23b, which reduces the effective overlap area between this two gates for a given photolithographic line-width definition. This poly-beak can be seen for example in FIG. 15E and is marked with the numeral 47CA. Further methods to minimize the possibility of formation of the poly-beak 47CA will be later.

Figure 22:
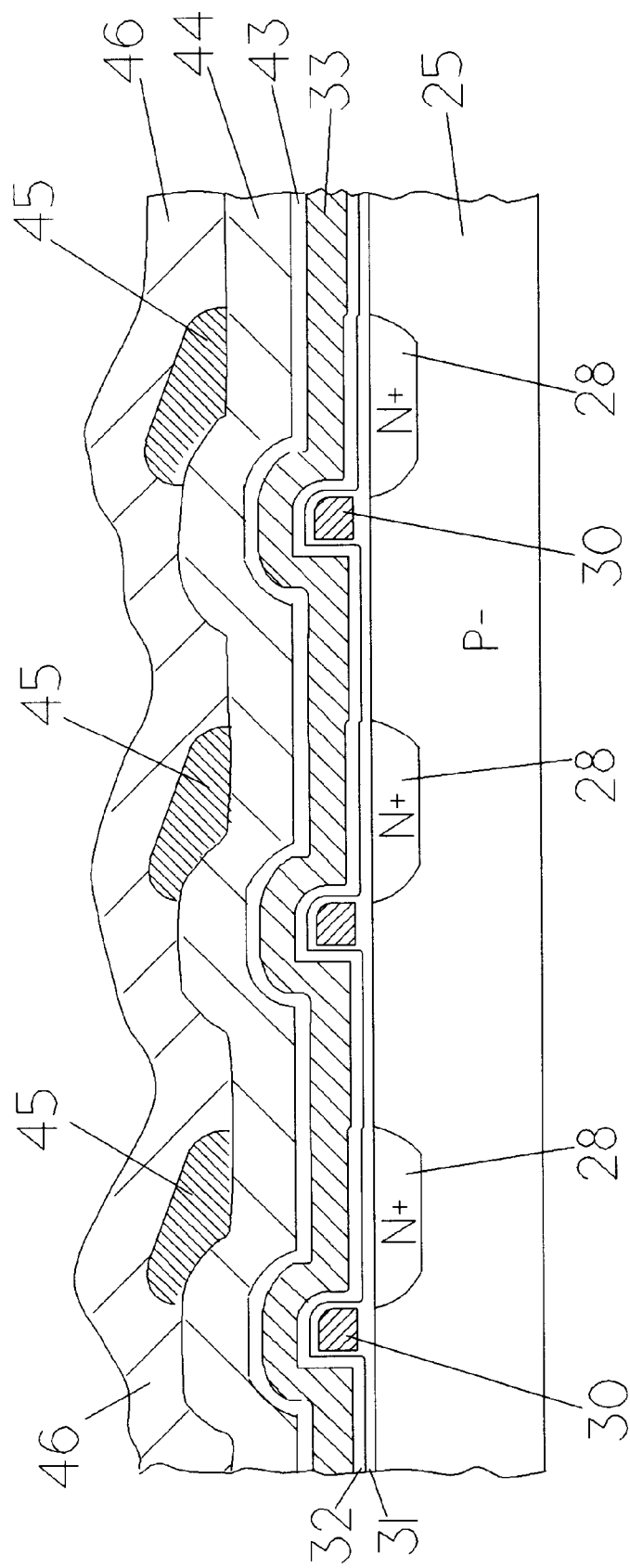
FIG. 22 illustrates a sectional view of the embodiment of FIG. 1 (from the same perspective of FIG. 2) after the addition of subsequent layers.

It is to be understood that further densification of the TEOS oxide layer 32 will occurs as a by-product of the subsequent processing steps, such as the deposition and formation of metal interconnect layer 45 (FIG. 22).

This combination of thermal oxide and deposited oxide dielectric was shown to increase the oxide breakdown voltage and reduce electron trapping in the oxide, which is advantageous in EEPROM memory chips because it allows for increased cycles of read and write operations by the use of electron tunneling through the TEOS oxide 32, of which the portion that is disposed between the floating gate 30 and the control gate 33. Although, a combination of thermal oxide and deposited oxide was chosen and is preferred in this embodiment, thermal oxide alone or deposited oxide alone will be sufficient to function as the interpoly dielectric (but will not produce the superior performance of this preferred embodiment).

After TEOS oxide layer 32 was deposited, its top surface topography over the region of the memory cell that overlaps the floating gate 30, will follow the shape of the textured top surface of the floating gate 30 and conform to it, however in a more moderate undulations due to the TEOS oxide formation process.

The thickness of the oxides on poly-1 layer 30 is 450 angstroms, so is the thickness of the oxides on top of source area 34b. The oxide on the bit-line regions 28 after the deposition of LPCVD TEOS oxide 32 of 300 angstroms is thicker, about 600 Angstroms. Due to the use of differential oxidation process in the formation of oxide layer 31 to a thickness of about 300 angstroms over the bit-line diffusion 28 (a.k.a "bit line oxide 31" or "field oxide 31"). The oxide thickness on bit-line diffusion regions 28 is maximized (without changing the thickness of the gate oxide 29a that is directly under floating gate 30 as is explained later) in order to reduce the capacitance between the bit-line diffusion 28 and the word lines 14 and the word lines 15. This is done in order to reduce the capacitive load on the memory cell, thus reduce the read-cycle time. This 600 angstroms bit-line oxide thickness is sufficient to prevent voltage breakdown between the bit-line diffusions 28 that is disposed directly under the bit-line oxide and the word lines 14 or the bit-lines 15 that are disposed directly over the bit line oxide, under all the operating voltages of the memory.

It is important to note that because of the fact that the thermal silicon dioxide 31 over the bit line regions 28 is grown to a thickness that is about one-fifth to one-tenth of the thickness that is used in prior-art floating gate memory arrays it does not require much silicon material for its formation and therefore does not cause an oxide encroachment into the overlap area 29AD between the polysilicon 30 and the under diffused portion (due to annealing) of bit line 28. This results in the advantageous uniformity of the thickness of the gate oxide 29a, so that the thickness of gate oxide 29a between polysilicon 30 and the channel region 34 is substantially of the same thickness as the thickness of gate oxide 29a between polysilicon 30 and the under-diffused portion under overlap area 29AD of the associated bit line diffusion region 28.

Because thermal silicon dioxide 31 does not require much silicon for its formation, the bit line diffusion region 28 can supply most of the silicon and the polysilicon floating gate supplies a smaller portion of the silicon. In this manner no silicon is required from the channel region 34 of the P– substrate, thereby eliminating silicon contamination of the gate oxide 29a. Prevention of gate oxide contamination is important in embodiments of the invention that utilize electric charge transport between the regions of the substrate 25 and the floating gate 30 of the completed memory device (in some embodiments, for example by Fowler-Nordhiem electron tunneling from diffusion 28), thereby increasing the number of programming and erase cycles of EEPROM or of Flash-EEPROM embodiments.

The performance advantages of the use of the sandwich comprising thermal oxide layer 31 and deposited oxide layer 32 over the source area of the channel 34b of the transistor will now be detailed.

One advantage is because the defect density exhibited by this sandwich is lower when compared with the defect density exhibited by thermal gate oxide alone over channel area 34b. This results in a higher manufacturing yield and reduced manufacturing cost in comparison to prior art split-gate EPROM or EEPROM transistors with only thermal oxide over the source area 34b.

Another advantage is improved threshold voltage control of the source area of the channel 34b. The threshold voltage of the source area 34b of the transistor as measured when the floating gate 30 is erased (so that the drain area 34a is almost depleted) is important in determining the value of the drain-to-source current conduction through the memory transistor during read operation. In one embodiment the nominal threshold voltage of the source area is chosen to be 0.8 volts by a boron channel implant. For transistors that use thermal oxide only between the control gate 33 and the channel area 34b it is common to see a deviation of the threshold value from the nominal value of 0.8 volts from one wafer manufacturing batch to another wafer manufacturing batch of the same memory chip product line. The threshold voltage value for one wafer batch can be 0.6 volts, but for transistors from another wafer batch the threshold voltage of the source area 34b can be 1.2 volts even though the same transistor geometries (channel length and width) and the same factory and machines are used in the manufacturing of the different wafer batches. These deviation of about 400 millivolts between manufacturing batches cannot be tolerated by sense amplifiers and other signal processing means that sense the logical state that is stored in the memory cell and may cause malfunction of the memory chip. Commonly, even if the chip is functional it is rejected because of degraded read access time performance induced by low read current that results from higher than nominal threshold voltage of source area 34b. This issue of threshold voltage control of the source area 34b of the channel 34 is particularly important when the physical split gate EEPROM cell is used to store more than one logical bit (that is to say, a one logical bit has the two logical states "0" and "1"). Details of writing, storing and reading more than one logical bit in one physical memory cell are disclosed in the above mentioned U.S. Pat. No. 5,278,785 issued Jan. 11, 1994 to the applicant of the instant application, which is expressly incorporated herein by reference. This type of storage method will be referred to below as Analog Storage or Vertical Electrostatic Recording (VER), or Vertical Electrostatic Storage (VES). The reason that the VER method is sensitive to the threshold voltage of the source area 34b is the fact that drain-source current due to threshold voltage variations of the memory transistor between chips are much more accentuated when the difference between the voltages on the bit line 28 (that represent the sensed logical states stored in the floating gate 30) is smaller.

One reason that the use of thermally grown oxide as the sole gate oxide layer over source area 34b of the prior art results in threshold voltage variations between wafers is the fact that under abnormal fabrication process conditions of small geometry (submicrometer) transistors the gate oxide suffers permanent damage. Abnormal fabrication conditions occur in all fabrication facilities and are the results of unpredictable factors such as equipment malfunctioning in the dry etching used in the formation of the polysilicon control gate 33.

This issue of large threshold voltage variation between transistors on different wafer batches is resolved by the use of the sandwich of thermal oxide layer 31 and deposited oxide layer 32, the sandwich serving as the gate oxide over the source area 34b of the invention. As a result the variation of threshold voltages of source area 34b between wafer batches is reduced to about 40 millivolts. This is a factor of ten smaller a deviation than the deviation exhibited by split-gate devices of the prior art using thermally grown oxide as the sole gate oxide over source area 34b. Although the results and discussion were oriented towards an NMOS transistor of FIG. 2 and of FIG. 23b, the benefits of the thermal oxide 31 and deposited oxide 32 sandwich are similar when used to fabricate an PMOS version of the memory transistor of the instant invention.

The following stages of the manufacturing process involve the formation of the polysilicon control gates, namely the read word line 14 and the program/erase word line 15 of FIG. 1. The process differs slightly for the various embodiments of the present invention.

Figure 12:
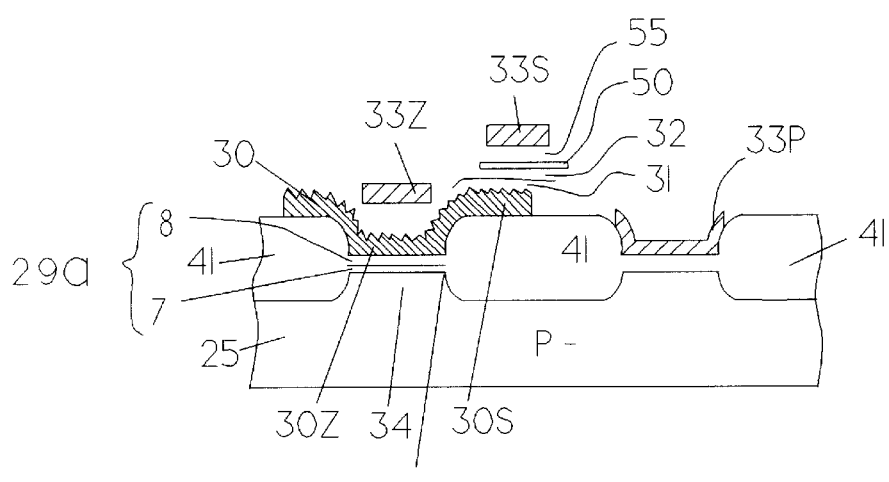
FIG. 12 illustrates a section cut along lines 3—3' of FIG. 1 as applicable to the first embodiment of the invention, which uses poly to poly electron tunneling to program.

FIG. 12 illustrates a section cut along line 3—3' of FIG. 1, as it relates to the first embodiment of the present invention. The structure includes the improvement mentioned above over the structure of U.S. Pat. No. 5,166,904 which is expressly incorporated herein by reference.

The first embodiment uses a second polysilicon layer 33 for all word lines 14 and all word lines 15. In FIG. 12 the read word line 14 of FIG. 1 is numbered 33z and the program/erase word line 15 of FIG. 1 is numbered 33s. A dedicated mask may be used to define the boundaries of a nitride layer 50 which is deposited prior to the deposition of polysilicon 33. This is done in order to increase the dielectric constant of the insulation between the steering region 30s of the floating gate 30 and the yet to be formed steering program/erase word line 33s, thus reduce the programming voltage of this embodiment as will be explained later in the section about the electrical operation of this embodiment. The nitride layer 50 also reduces the chance of electron tunneling from steering region 30s of the floating gate 30 to program/erase word line 33s and vice versa, since together with the underlying silicon dioxide, it provides a higher electron tunneling threshold than that of silicon dioxide dielectric alone. Therefore the above interpoly dielectric sandwich that includes the nitride 50 is formed to minimize and substantially prevent charge transfer between floating gate 30 and program/erase word line 33s of this embodiment. The nitride layer 50 may constitute $Si_3N_4$ (silicon-nitride) that is deposited by thermal reaction between $SiH_2Cl_2$ and $NH_3$ in a hot wall vertical LPCVD reactor. The nitride film may be deposited at a temperature of 600 degrees centigrade to a desired film thickness.

Thereafter thin silicon dioxide layer 55 of 100 Angstroms is grown to cover the nitride layer 50 and the entire array. This approach of isolating a floating gate from a control word line by using a sandwich of oxide-nitride-oxide dielectric is well known in the art, and is commonly used in many UVEPROM memory chips, where the control word line is a read/program word line. However all UVEPROM memory cells that were known before the filing of the above referenced U.S. Pat. No. 5,099,297, on Jul. 10, 1989, do not have a capacitor that has both its plates insulated from the read/program word line, rather in the structure of EPROM memory cells of previous art the read word line forms one plate of the capacitor. Both plates of the capacitor of prior art EPROM were smooth. The oxide-nitride-oxide (referred below as O—N—O) dielectric is also used to form capacitor for Dynamic Random Access Memory (DRAM) cells. However before the disclosure by the applicant of the present application in U.S. application Ser. No. 377,311, filed Jul. 10, 1989, now U.S. Pat. No. 5,099,297, of a memory cell structure that includes a capacitor whose two plates are electrically isolated from the read word-line of the memory array, the O—N—O dielectric in such memory cells was always formed between smooth surfaced capacitor plates, that is to say, great effort was made by those skilled in the art to prevent asperities, undulations or engraved surfaces from forming over the surface of either of the capacitor plates that contacts the O—N—O dielectric. However, U.S. Pat. No. 5,099,297, taught the converse.

Likewise, the present invention provides a capacitor structure that increases the capacitance of the capacitor that is incorporated in the memory cell per unit area of the underlying substrate when the unit area that is considered is the area that is disposed directly under the bottom plate of the capacitor. The increase in capacitance results from the fact that the upper surface of the bottom polysilicon plate 30 that comes in contact with the dielectric material of the capacitor is textures or engraved to form undulations or apserities and thereby increase the effective upper surface area of plate 30 area which directly increases the capacitance value of the capacitance. However in order to reduce charge transport between the plates of the capacitor the nitride insulator that is characterized by exhibiting a bulk-limited type of electron conduction, is used as part of the dielectric in order to reduce the possibility of charge transport between the plates. The nitride insulator 50 also has a dielectric constant that is higher than the dielectric constant of a silicon dioxide thereby farther increasing the capacitance of the capacitor and thereby farther reducing the possibility of charge transport between the plates under the voltage operating conditions across the capacitor plates and across the terminals of the associated memory cell.

This capacitor structure improves the operation of several type of electrically readable and electrically writable memory cells including Dynamic Random Access Memory (DRAM), Non-Volatile DRAM, and dynamic latch circuits that are used as logic circuits such as D-flipflops. The capacitor is also fit for use in other electronic circuits such as voltage multipliers and charge pumps that are used for voltage or current boosting or conversions. The capacitor is also fit for use in analog circuits such as switch-capacitor filter circuits, digital-to-analog (D/A) and analog-to-digital (A/D) circuits, and analog sample-and-hold circuits.

The nitride layer 50 is not necessary for proper operation of this embodiment, and the electron tunneling threshold between the steering section 30s of floating gate 30 and the steering program/erase word line 33s may be increased alternatively by increasing the thickness of interpolysilicon silicon dioxide layer 31, however this will require an increase in the operating voltages which is disadvantageous.

At this stage the second polysilicon layer 33, illustrated in FIG. 12, is deposited on oxide layer 55 by LPCVD at 650 degrees centigrade to a thickness of about 4000 Angstroms and then doped with phosphorous by passing POCL3 through a chamber at 950 degree centigrade for about 15 minutes.

A single masking step is used to define a photoresist layer used to cover polysilicon layer 33. Thereafter polysilicon 33 is etched to define the word lines 14z, 14p and 15 in a single step.

The bottom side of the polysilicon layer 33, also called poly-2, will take the shape of the mild undulations on the top surface of LPCVD TEOS-oxide layer 32, such that a convex asperity on top of poly-1 layer 30 will face a concave layer of polysilicon at the bottom side of poly-2 layer 33.

As is well known in the art the tunneling threshold voltage of electrons tunneling through oxide dielectric from convex polysilicon to concave polysilicon, also called forward tunneling threshold voltage VXF, is lower than the reverse tunneling threshold voltage VXR. The tunneling voltage of electrons tunneling through oxide dielectric from concave polysilicon to a convex polysilicon, also called reverse tunneling threshold voltage VXR is higher than the forward tunneling threshold voltage VXF.

This asymmetry of tunneling between two polysilicon layers is applied in the operation of some of the EEPROM memory cell embodiments of the invention.

In the first embodiment of the present invention, reverse tunneling from polysilicon 33z of read word line layer 14 to polysilicon region 30z of floating gate layer is used for programming the memory cell. Forward tunneling from region 30z of floating gate layer 30 to polysilicon layer 33z read word line is used for erasure of the memory cell.

Figure 13A:
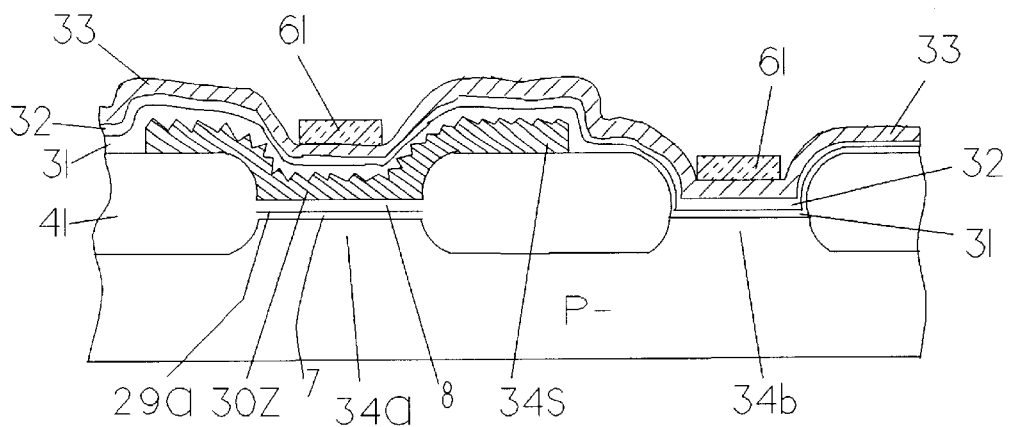
FIGS. 13a–c illustrate a section cut along lines 3—3' of FIG. 1 as applicable to the second embodiment of the invention, which uses poly to poly electron tunneling to program.

The second embodiment of the present invention will now be described with reference to FIGS. 13a–13c.

The electrical operation of the second embodiment is similar to that of the first embodiment and will be discussed later.

The fabrication process steps of the second embodiment follow that of the first embodiment up to the point of depositing the polysilicon layer 33. After depositing polysilicon layer 33 on oxide 32 as pertain to this second embodiment, a single photoresist mask 61, shown in FIG. 13a, is used to define the read word lines 14z and 14p, as seen in FIG. 1.

While photoresist 61 protects polysilicon 33 over the regions 34, the rest of polysilicon 33 is etched away. Also oxide layers 31 and 32 are etched away from all areas except from the interpoly area on top of the regions 30z of the floating gates 30.

Figure 13B:
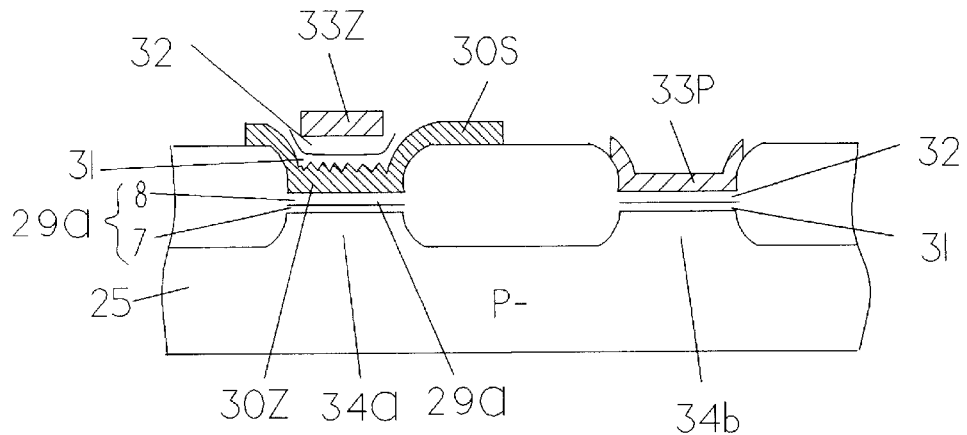

The result of the definition of the word lines 33z and 33p is shown in FIG. 13b. FIG. 13b also shows the result of using the word line 33z and 33p as shields providing umbrella to protect the asperities, bumps and rough edges over region 30z of the floating gate 30, while the asperities, bumps and rough edges are been destroyed over the steering region 30s of the floating gates 30.

Referring to FIG. 13b, after the steering region 30s was exposed it is implanted heavily by 1.0E18/cm2 phosphorous ions at 150 KeV for 30 minutes. This smoothing of the top of steering region 30s is done in order to increase electron tunneling threshold from region 30s to and from the yet to be formed steering program/erase word line 15 of FIG. 1, which will be denoted 60s in FIG. 13c.

Figure 13C:
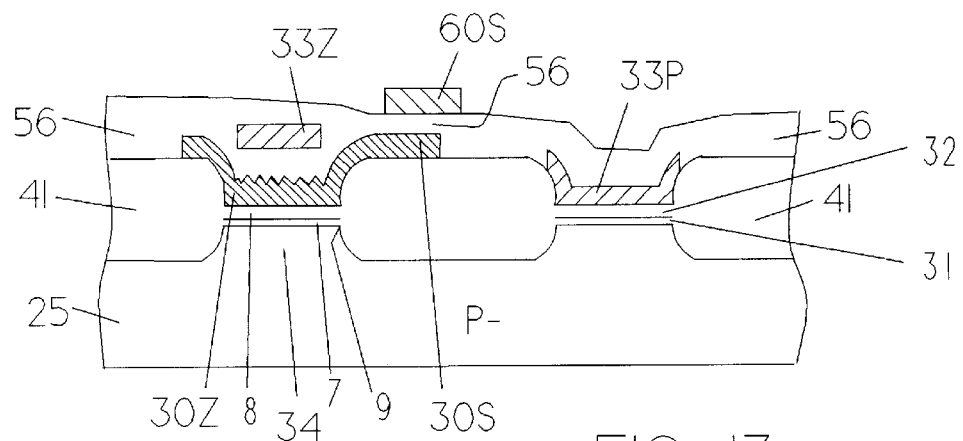

Referring now to FIG. 13c, thermal oxide layer 56 is grown over the entire memory array at 950 degrees centigrade to a thickness of about 450 Angstroms. Thereafter a third polysilicon layer 60s is deposited over oxide layer 56 by LPCVD at 650 degrees centigrade to a thickness of about 4000 Angstroms and then doped with phosphorous by passing POCL3 through the chamber at 950 degrees centigrade for about 15 minutes.

In the following step in the process a photoresist layer 63 (not shown) aligned to the second polysilicon layer 33, defines the steering program/erase word line 60s. Polysilicon 60s is etched away except from the area over the steering regions 30s of the floating gate polysilicon 30 where it serves as a word line 15 of FIG. 1.

The advantage of the second embodiment over the first embodiment is in the fact that the second embodiment enables the reduction of the space that is devoted to the program/erase word line 15 of FIG. 1 between adjacent read word lines 33z and 33p of FIG. 13c (14z and 14p of FIG. 1), thus reduce memory array size significantly. As can be seen in FIG. 12 of the first embodiment the space (pitch) between adjacent read word line 33z and 33p when separated by program/erase word line 33s (word line 15 in FIG. 1) is limited by the width of and spacing to program/erase word line 33s. This pitch is limited in fact by the photolithography printing capability of the equipment used in manufacturing. However the sequence of process steps to form word lines 14 and 15 can be adopted to the first embodiment, thereby further reducing the memory cell size of the first embodiment.

The second embodiment of FIG. 13c, significantly reduces the pitch of program/erase word line 15 of FIG. 1 (60s in FIG. 13c) due to the following reasons associated with the electrical performance requirements from the program/erase word line 15, which allow taking advantage of the processing steps described above and which lead to the results shown in FIG. 13c.

As will be explained with regard to the electrical operation of this embodiment of the invention, the steering program/erase word line 60s does not carry any steady-state current and the voltage change dV=7 volts it carries during the selection for programming is applied slowly dt=300 nS, so the current induced by i=C(dV/dt) is of relatively very low value in the range of 5 microamperes, if for example word lines 15's capacitance is about 0.15 pF for a word line 15 with 2048 steering regions 30s under it, which may represent a word line for a 4096 Kilo bits cells in an array arranged 2048 cells by 2048 cells.

This low current carrying word line 15 may be processed to be very narrow with little regard to the resultant high ohmic resistance, since the voltage drop across it is negligible. Also since the program/erase word line 15 of FIG. 1 (60s in FIG. 13c) does not act as a transistor's gate, no attention should be paid to such issues as the effect of processing on the channel length or width of a transistor.

The relative insensitivity of word line 15's electrical parameters to processing opens the opportunity to over-etch this third polysilicon 60s beyond the photolithography specifications of the particular manufacturing equipment, thus further reduce the pitch of program/erase word line 15.

The electrical operation of the first and second embodiments of the present invention will now be described.

It was disclosed in U.S. Pat. Nos. 4,845,538 and 5,040,036, that the cell may be programmed by holding the drain diffusion 28 at a high voltage Vpp while the control gate polysilicon 33 (read word line 14 of FIG. 1) is held at Vss ground potential. The source diffusion 28 may be held at Vss or at half Vpp, that is (½*Vpp). This biasing condition ensures that the source area of the channel 34b is not inverted and that there is no current between drain and source. At this voltage conditions the drain voltage is coupled to the floating gate through the capacitance of the overlap area between floating gate 30 and drain diffusion 28a. The floating gate voltage increases to such a level which is higher than the unprogrammed threshold voltage of the cell, thus inverting the drain area of the channel 34a. Once the drain area 34a is inverted it carries the high voltage Vpp of the drain diffusion 28a. The capacitive coupling between the channel's drain area 34a and the floating gate 30 is about 10 times that of the capacitive coupling between the drain 28a and the floating gate 30.

The polysilicon 33s of FIG. 12 for the first embodiment and polysilicon 60s of FIG. 13c for the second embodiment (corresponding to program/erase word line 15 of FIG. 1) assist in inverting the channel's drain area 34a by elevating the voltage of floating gate 30 during programming by coupling a high voltage Vpp to the steering region 30s of floating gate 30. By doing so the voltage of drain diffusion 28a does not need to be very high. A typical value of Vpp voltage for both the selected cells's drain diffusion 28a and for a selected cell's program/erase steering word line 15 is 14 volts. The capacitive coupling between the polysilicon program/erase word line 15 and the steering region 30s of the floating gate 30 is about 5 times that of the capacitive coupling between the drain diffusion 28a and region 30z of floating gate 30.

This sudden increase of Vpp coupling to the floating gate through the drain area 34a brings the floating gate to a voltage which causes reverse electron tunneling from the grounded control gate 33 to the floating gate 30, through the oxide layers 32 and 31. This transfer of electrons which are trapped in the floating gate programs the cell by changing its threshold.

The cell may be erased by holding the drain 28a, source 28b and the steering program/erase word line 15 (polysilicon 33s in FIG. 12 and polysilicon 60s in FIG. 13c) at Vss and taking the control gate 33 to high voltage Vpp. This causes forward electron tunneling from the floating gate 30's region 30z to the control gate polysilicon 33z (word line 14z or 14p in FIG. 1) through oxide layers 31 and 32, which brings the cell to its initial unprogrammed threshold voltage.

Figure 14:
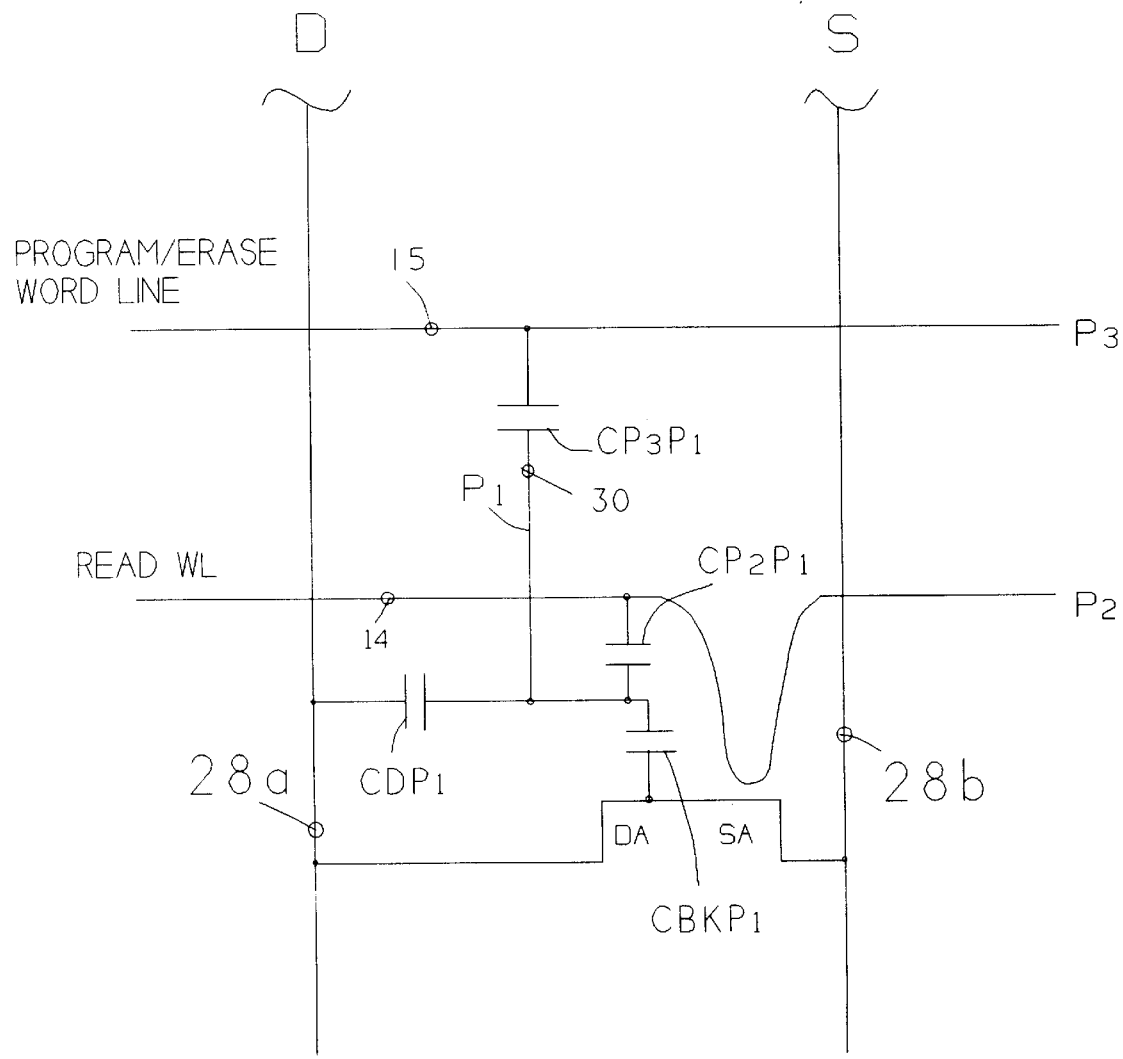
FIG. 14 illustrates an electrical model of the of the capacitive coupling of the capacitors in the memory cell to the floating gate and to the transistor as applicable to the third embodiment of the invention.

FIG. 14 is an electrical model illustrating the capacitive coupling of the floating gate 30 (also called P1) to the drain diffusion line 28a (capacitor CDP1) under one edge of region 30z, the capacitive coupling of capacitor CP2P1 of the floating gate 30 to the read word line 14 (also called P2) over region 30z, the capacitive coupling of capacitor CP3P1 of the floating gate 30 to the program/erase word line 15 (also called P3) over region 30s, and the capacitive coupling of capacitor CBKP1 of the floating gate 30 to the bulk semiconductor 34a under region 30z.

The following Equation (1) expresses the floating gate 30 voltage (VP1) in terms of the above-described capacitances, the charge (QP1) of the floating gate 30, and the voltage levels on the read word line 14 (VP2), the program/erase word line 15 (VP3), the drain diffusion 28a (VD), and region 34a of the substrate 34a (VBK).

$$VP1 = \frac{(-QP1) + [VP2CP2P1 + VP3CP3P1 + VDCDP1 + VBKCBKP1]}{CP2P1 + CP3P1 + CDP1 + CBKP1} \quad \text{Eq. 1}$$

The program and erase will now be described for the first and second embodiments using the dielectrics and oxide thicknesses of the second embodiment that were described in reference to FIG. 13c. The equivalent oxide thicknesses are listed here as follows:

TP2P1=450 Angstroms

TP3P1=450 Angstroms

TDP1 =250 Angstroms

TBKP1=250 Angstroms

For this embodiment the forward tunneling threshold voltage level VFX is about 7 volts, the reverse tunneling threshold level VRX is about 11 volts, and the threshold voltage VT that is required in order to invert the channel 34 of the transistor is 0.8 volts.

Table one lists the voltages on the drain 28a, source 28b, the read word line 14 and the program/erase word line 15 for programming a selected cell to store the first binary state (floating gate charged) and the same voltage levels for all unselected cells not be programmed by electron tunneling, or have a parasitic drain source $I_{DS}$ current that might cause hot electrons programming from a silicon substrate.

TABLE 1

|  | VD | VS | VP2 | VP3 | $I_{DS}$ |
|---|---|---|---|---|---|
| Selected Even Numbered Row | 14 | 7 | 0 | 14 | 0 |
| Unselected On Same Row | 7 | 7 | 0 | 14 | 0 |
| Unselected On Same Column Odd Numbered Row | 7 | 14 | 7 | 3 | 0 |
| Unselected On Same Column Even Numbered Row | 14 | 7 | 7 | 3 | 0 |

The programming of the selected cell will now be described with reference to Table (1) and FIG. 14. The drain voltage, VD, is coupled to the floating gate 30 by capacitor CDP1 and capacitor CP3P1. Once the voltage on the floating gate 30 rises to about 1 volt which is higher than the VT of cell, the drain area DA (34a) of the channel is inverted and acts as an additional capacitor plate to couple the drain voltage VD to P1. This capacitor is actually CBKP1 in FIG. 14. The source area SA (34b) of the channel is not depleted due to the fact that read word line 14 is held at 0 volts. The coupling via CBKP1 brings the potential of P1 to above 1 volt and is sufficient to deplete and invert the drain area DA (34a) of the channel of 34.

Accordingly, the voltage levels VD and VB and VP3 in equation (1) are equal to 14 volts. Substitution of these values into equation 1 with QP1=0 (floating gate not charged) and VP2=0 (word line at ground) indicates that the magnitude of VP1 is greater than 11 volts VRX. Because P2 is grounded, this voltage on P1 is applied across the electrodes or the capacitor plates of capacitor CP2P1 and exceeds the reverse threshold voltage of the oxide layer, so electrons tunnel from P2 to P1.

For unselected cells in the same row, VD is 7 volts, VP3 is 14 volts, so VP1 is about 5 volts (which is the voltage difference between P1 and P2). This voltage difference is insufficient to cause reverse tunnelling. For unselected cells in the same column, the potential of the read work lines 14 is at 7 volts, thus the potential difference between the floating gates 30 to the control gates 14 is about 3 volts, which is below the reverse tunneling threshold. Thus these cells will not program undesirable due to tunnelling of electrons. In addition VAS of the cell is 0 volts, because VP2 is 0 volts and SA (34b) is not depleted, so that no $I_{DS}$ exists. Thus accidental hot electron programming will not occur. Accordingly, the present system provides for programming a single cell. Very little, current is drawn because the floating gate 30 is charged by the tunnelling mechanism.

Table (2) lists the voltages on the drain 28a, source 28b, the read word line 14 and the program/erase word line 15 for erasing (discharging) a selected cell to erase the first binary state (floating gate charged) and the value of these voltage levels for all unselected cells. It is critical that unselected cells along unselected word lines not be erased.

TABLE 2

|  | VD | VS | VP2 | VP3 |
|---|---|---|---|---|
| Selected Even Numbered Row | 0 | 0 | 12 | 3 |
| Unselected On Same Row | 0 | 0 | 12 | 3 |
| Unselected On Same Column | 0 | 0 | 0 | 3 |

TABLE 2-continued

|  | VD | VS | VP2 | VP3 |
|---|---|---|---|---|
| Odd Numbered Row Unselected On Same Column Even Numbered Row | 0 | 0 | 0 | 3 |

For the selected cell to be erased, VD is at ground and VP2 is 12 volts. In this case, equation 1 indicates that the potential difference across CP2P1 is greater than the forward tunnelling voltage so electrons tunnel from the floating gate to the word line to erase (discharge) the floating gate 30. All unselected cells in the same row are also erased. Thus prior to the beginning of the erase procedure the data of the unselected cells along the selected row is read into a register and the data is reprogrammed back into the unselected cells after the selected cell is erased, thereby the data in the unselected cells is refreshed. This operation is similar to the refresh operation in a DRAM chip in which the registers also serve as the local sense amplifiers.

Voltage VP2 of unselected rows is 0 volts. In this case equation 1 indicates that the potential difference CP2P1 is not sufficient to cause forward tunnelling across the oxide layer. Accordingly, a single cell in column may be erased.

The read operation of the cell is performed by raising the selected read word line 14 to 5 volts and holding all unselected word lines at 0 volts. The drain bit line 28a of the selected cell is held at 2.5 volts and the source bit-line 28b is held at about 0 volts. A decoder for the column bit-lines at one edge of the array selects the source bit-line 28b to the ground 0 voltage, and at the same time the decoder selects the drain bit line 28a to connect to an input of a sense amplifier. The sense amplifier detects the binary state of the memory cell. If the cell was programmed it will have a high threshold, thus the drain bit line voltage will remain at about 2.5 volts. If however the cell was not programmed the threshold will be about 0.8 volts, which will cause the bit line to be discharged toward the ground voltage (0 volts) of the source bit line. The sense amplifier detects these voltage levels, which represent two opposite logic level.

The third, the fourth and the sixth embodiments of the invention will now be described in reference to FIG. 1 and FIGS. 15a and 15b. Thereafter the fifth embodiment will be described.

Detailed description of one method for the electrical operation of the individual memory cell used in these third, fourth and sixth embodiments is disclosed in U.S. Pat. No. 4,763,299 issued to Emanuel Hazani the same applicant of the instant application, which patent is expressly incorporated herein by reference.

The cell programs when a high voltage VPP of 12 volts is applied to the read word line 14 of FIG. 1 (also marked polysilicon 33z of FIG. 15b), a high voltage of about 8 volts is applied to the drain diffusion 28a, 0 volt is applied to the source diffusion 28b and voltage between 0 volt and 10 volts may be applied to the program/erase word line 60. These voltages are capacitively coupled to the floating gate 30 and its voltage increases to about 6 volts, which attract the hot electrons from the substrate induced by the high drain to source voltage of 8 volts.

Details about the asymmetry associated with the cell's programming operation and the reason that adjacent cells on the same row do not program, are detailed in the '299 patent.

During read operation of the selected cell the drain voltage is held relatively low at about 1 volt in order to prevent the bad effect called "soft write", which is an undesired acceleration of hot electrons that by accumulating with time on the floating gate 30 may change the cell's threshold voltage and so change a predetermined logical state of the cell. The source voltage is held at about 0 volts and the read word line 14 is held at 5 volts. The program/ erase word line 15 is held at about 3 volts in order to prevent a potential difference of more than 3.2 electron-volts (3.2 eV is the typical band-gap energy of the polysilicon to silicon dioxide interface) to the floating gate 30, thus cause charge loss to this word line, which is lightly coupled to the floating gate 30 at about 10 percent capacitive ratio. In contrast, the read word line 14 is heavily coupled to the floating gate at about 85 percent capacitive ratio, thus will always pull the floating gate 30 closer to its voltage, which guarantees less than 3.2 eV potential difference across the oxide dielectric.

In order to provide conditions for increased hot electrons production in the channel, which will ease the programming operation of the third and fourth embodiments, a processing step of forming the n+ bit lines 28 is modified. The goal is to form a more abrupt and more deep n+ diffusion junction for the drain. This is accomplished by implanting a heavier arsenic ions dose of 6E16/cm2, at a higher energy of 80 KeV and annealing for a longer period of 15 minutes.

Figure 15A:
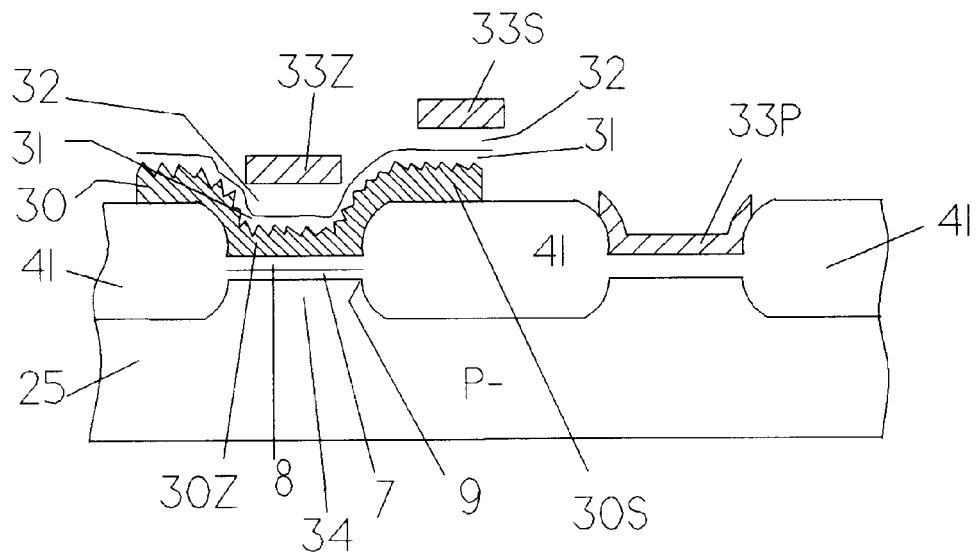
FIGS. 15a–15b illustrates section cut along lines 3—3' of FIG. 1 as applicable to the fourth embodiment of the invention, which uses hot electrons to program.

FIG. 15a is a section cut along line 3—3' of FIG. 1 as it relates to the third embodiment of the present invention. The process for forming the structure of the third embodiment follows the steps as were described above in reference to the second embodiment up to and including the step of deposition and etching of polysilicon layer 33 to define the polysilicon word lines 33z and 33p above the area 30z of floating gate 30.

Figure 15B:
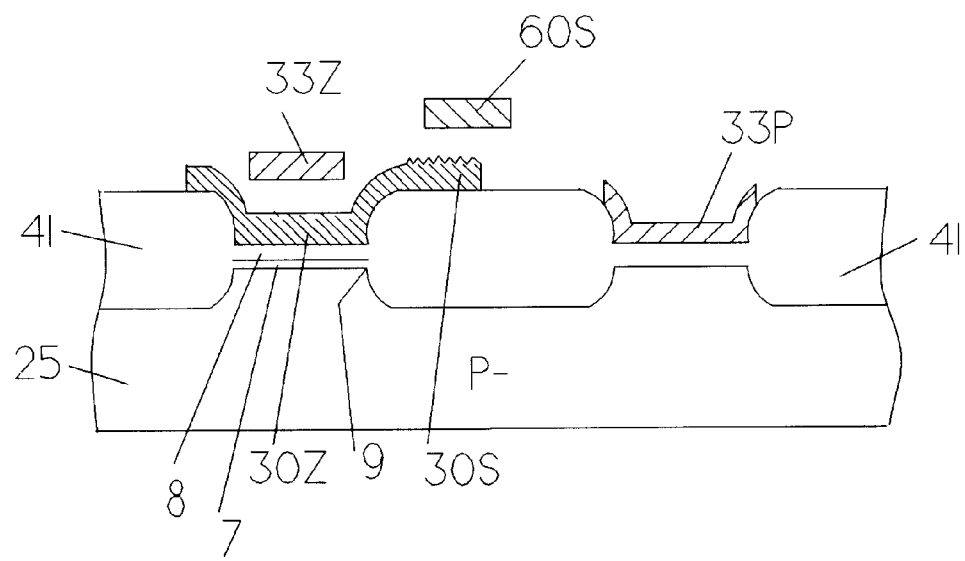

FIG. 15b is a section cut along line 3—3' of FIG. 1 as it relates to the fourth embodiment of the present invention. FIG. 15b is also similar to FIG. 13c of the second embodiment, except the asperities, bumps and rough edges are retained only on region 30s of the floating gate 30.

The process modifications to fabricate this fourth embodiment include the change in n+ diffusion implant process step similar to the third embodiment. Also after oxidizing the floating gate polysilicon 30, the program/erase word line 15 (marked as polysilicon 60s of FIG. 15b) is deposited first in order to protect as an umbrella to shield the region 30s of floating gate polysilicon 30 while a future heavy implant destroys the asperities, bumps and rough edges over the region 30z of floating gate 30.

After deposition of polysilicon 60s of the fourth embodiment, oxide layers 31 and 32 are etched away from areas not covered by polysilicon 60s. A heavy implant similar to the one used for the second embodiment of FIG. 13c destroys the asperities, bumps and rough edges over region 30z of polysilicon floating gate 30. Thereafter oxide layers 31 and 32 are regrown and polysilicon layer 33z of FIG. 15b is deposited to form the read word line 14 of FIG. 1.

The sixth embodiment of the present will now be described with reference to FIG. 1 and FIGS. 15c to 15i. Thereafter the fifth embodiment will be described.

Figure 15C:
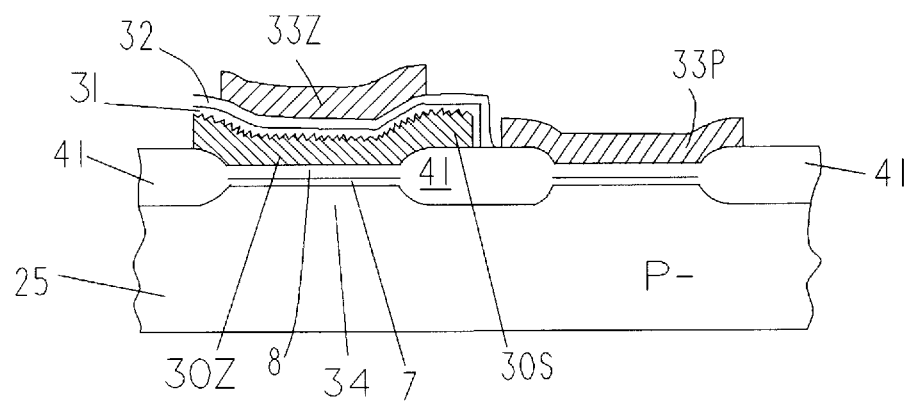
FIGS. 15c–15k illustrates section cut along lines 3—3' of FIG. 1 as applicable to the sixth embodiment of the invention, which uses hot electrons to program.
Figure 15D:
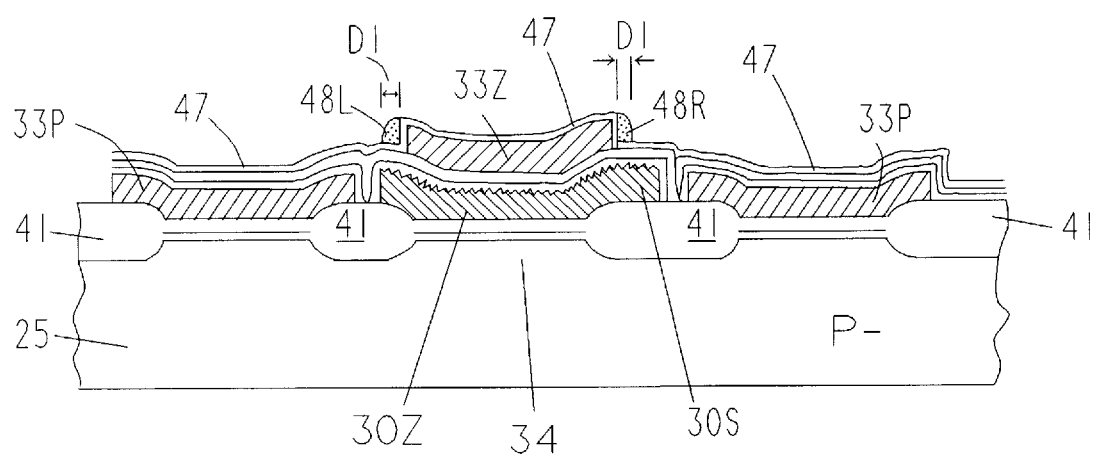
Figure 15E:
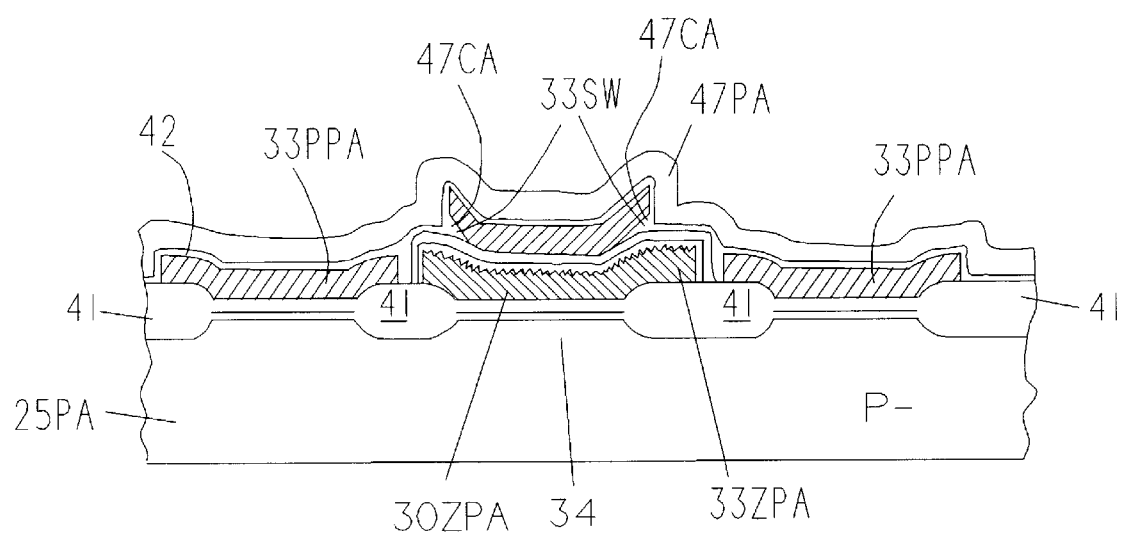
Figure 15F:
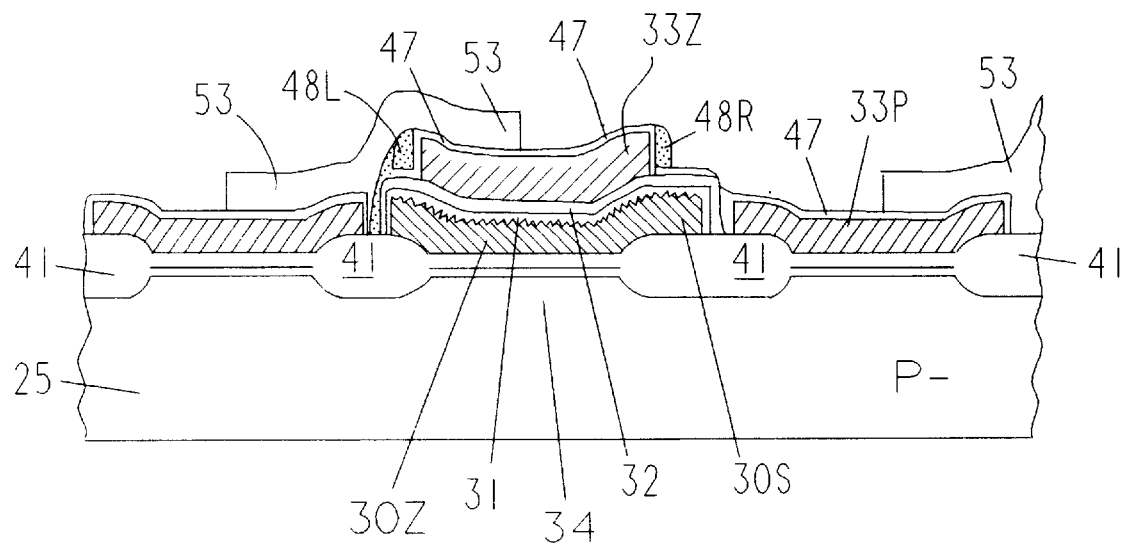
Figure 15G:
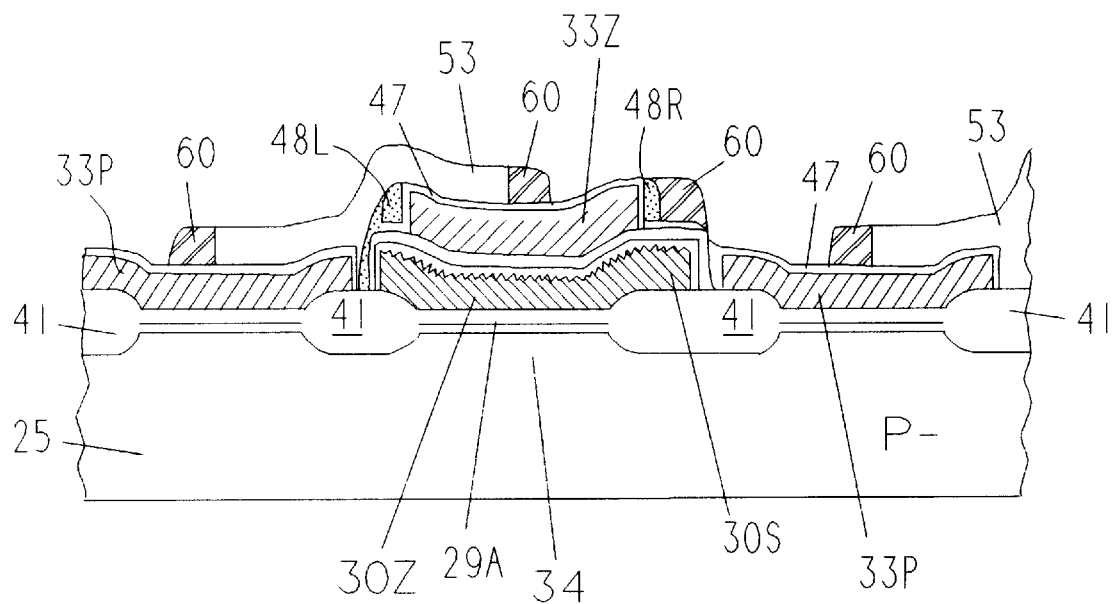
Figure 15H:
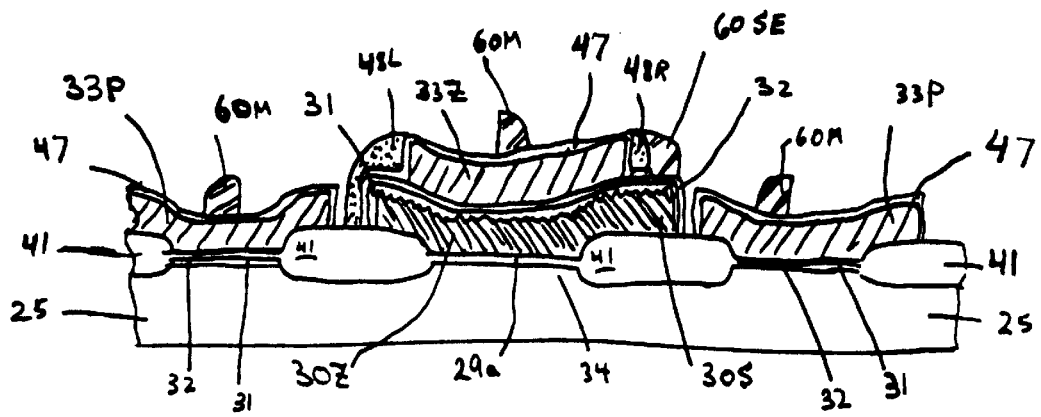

The following processing steps form the erase line 15 of FIG. 1, which is called polysilicon 60se in, FIG. 15h of this sixth embodiment, so that the polysilicon 60se is self-aligned to an edge of a spacer 48R that is formed of deposited insulating layer constituting plasma enhance chemical vapor deposition (PECVD) of fluorinated silicon dioxide such as silicon dioxide that is formed from tetra-ethyloxysilane (TEOS) in the presence of $NF_3$, $CF_4$ or $C_2F_6$ that is subsequently densified. This type of fluorinated silicon dioxide has a dielectric constant of 3.2 to 3.4 which is lower than the dielectric constant of about 4 of thermally grown silicon dioxide. The spacer oxide 48R is self aligned to the already defined read word line 14 of FIG. 1, which is denoted with the numeral 33z in FIG. 15c. The self-alignment between polysilicon 60se and one side of PECVD TEOS oxide spacer 48R and the self alignment between another side of the TEOS oxide 48R to polysilicon 33z is achieved by the use of spacers 48R that are formed along the length of line 14z of FIG. 1, that is to say, alongside polysilicon 33z of FIG. 15h. The formation of the thermal oxide 47, the deposited oxide 48R and the polysilicon 60se is accomplished in a manner that does not increase and does not substantially change the thickness of the adjacent interpoly dielectric comprising the sandwich of layers 31 and layer 32, which sandwich is already present between polysilicon word line 33z and the floating gate polysilicon 30. The floating gate 30 has a programming section 30z and an erase section 30s. The erase word line 60se of FIG. 15h (ref. line 15 in FIG. 1) is a continuous conductive layer that connects plurality of pairs of memory cells along an axis that is parallel to the horizontal axis of the read word line 14 of FIG. 1. The erase line 60se is also insulatively disposed directly over the bit line diffusion 28 as shown in FIG. 3.

It is advantageous to achieve self-alignment between the erase gate 60se (line 15 of FIG. 1) and the spacer 48R, and between spacer 48R and the control gate 33z (word line 14 of FIG. 1) because it eliminates the need for the use of an additional photolithography mask. The use of an additional photolithography mask is estimated to reduce the production yield of good chips by about two percent. Another advantageous reason to achieve self-alignment between the erase gate 60se (line 15 of FIG. 1) and the spacer 48R, and between spacer 48R and the control gate 33z (word line 14 of FIG. 1) is the reduction in the wafer area that is taken by the space between the two polysilicon lines 60se and 33z partially filled with oxide 48R of FIG. 15j), thereby reducing memory cell size and increasing memory array bit density per unit area of the memory chip and therefore reducing production cost of the memory chip.

Other advantages will be explained in reference to FIG. 15i which shows a magnified area of the self alignment region using only thermal oxide spacer 47 and FIG. 15k which shows a magnified area of the self alignment region using thinner thermal oxide 47 and thicker deposited and densified TEOS oxide 48R as spacer. One advantage of the process and structure of self-alignment between the erase gate 60se (connected to line 15 of FIG. 1) and the spacer 48R, and between spacer 48R and the control gate 33z (connected to word line 14 of FIG. 1) is the reduction in the capacitive coupling between erase gate 60se and control gate 33z along the length of the word lines 14 and line 15. This reduction of the parasitic coupling capacitance in the structure of FIG. 15h (and FIG. 15k) of the instant application, as compared with the capacitance that results from a structure that has a direct self-alignment between erase gate 60se and control gate 33z (shown in FIG. 15i), in which only a thermally grown oxide (thermal silicon dioxide) is used as the spacer between erase gate 60se and control gate 33z. The capacitance between the polysilicon 60se and polysilicon 33z includes the plate of etched polysilicon 33z of control word line 14 which has a rough surface or not smooth surface due to the etching process which leave undesired spots of polymer (or other contaminants that are associated with the etchant of the polysilicon) in contact with the polysilicon 33z. Another reason the none-smooth surface occurs is the oxidation of the surface of the polysilicon that emphasize the polycrystalline silicon grain boundary during the formation of the thicker thermal oxide spacer used in the process of direct alignment of the polysilicon 60se to polysilicon 33z of FIG. 15i. Because both sides of the thermal oxide spacer of FIG. 15i are conformal and follow the surface of the control polysilicon 33z, when the erase polysilicon is deposited to be in contact with the thermal oxide spacer its surface will also be conformal to the none smooth surface of the existing polysilicon 33z. This conformality between the surfaces of the word line polysilicon 33z and word line polysilicon 60se that are in contact with the thermal oxide spacer contributes to increase overlap area of the capacitor (thereby increasing the capacitance) per unit length of the word lines 14 because each conductive word line is a plate of the capacitor. The process and structure of the instant application as shown in FIG. 15k includes a densified deposited silicon dioxide 48R which has only one side in contact with thin thermal oxide 47 and therefore conformal to the surface of polysilicon control line 33z. The side of the spacer deposited oxide 48R that is not in contact with thermal oxide 47 is not conformal to the topography of the surface of polysilcon control line 33z because densification by annealing of this TEOS oxide 48R makes the surface of spacer 48R that is not in contact with thermal oxide 47 much smoother than the surface of polysilicon 33z. Upon deposition of erase line 60se to be in contact with the smooth side of PECVD TEOS oxide 48R, the surface of polysilicon 60se that faces polysilicon line 33z is also smoother than the surface of polysilcon 33z. Because polysilicon 60se is a plate with smaller surface area of the capacitor between word line 14 and word line 15, the capacitance per unit length of the structure of FIG. 15K is smaller than the capacitance of the structure of FIG. 15i when the structures of FIG. 15i and 15k are assumed to have the same thickness as measures along an axis normal to the surface of the wafer and when the distance from the center of word line 14 to the center of word line 15 is the same if measured along an axis that is parallel to both the surface of the wafer and also parallel to the bit line axis.

The process of this sixth embodiment for forming the erase line 60se to be self-aligned to the control gate 33z will now be described in reference to FIGS. 15c to 15h. FIG. 15c shows the memory structure after the formation of interpoly dielectric of oxides 31 and 32 to have a desired thickness and after the formation and definition of the read control lines 33z and 33p, which correspond to control lines 14z and 14p of FIG. 1 respectively. The structure at this point in the fabrication process is fabricated by use of the process that is used to fabricate the first embodiment of the invention and as was describe above.

The next processing step is to thermally grow a layer of thin silicon dioxide 47 over the entire structure to a thickness of 150 Å at a temperature of 850 degrees centigrade, as shown in FIG. 15d, this is a thickness that is chosen to ensure that the thermal oxidation does not consume much silicon from the control gate 33z and therefore the thermal oxide does not encroach under the polysilicon control gate 33z and does not thickens the dielectric layer between the polysilicon 33z and the polysilicon floating gate 30. Thereafter a TEOS based fluorinated silicon dioxide layer 48 is deposited by an PECVD process over the entire structure at a temperature of about 600 degrees centigrade to a desired thickness of about 1200 Å. The PECVD TEOS oxide layer 48 is densified by annealing for 5 minutes which makes its surface that is not in contact with the wafer more smooth. Thereafter an anisotropic etching is performed by plasma or by RIE to remove most of TEOS oxide 48 from all areas of the wafer except from the side walls of the control lines 33z and 33p so as to form spacers 48R and 48L along the entire length of each of read word lines 14z and 14p (FIG. 1) of the memory array. The etchant that is used etches oxide much faster than polysilicon at about 20 to 1 ratio. The width D1 of the retained spacer 48R after the anisotropic etching is completed is about 1200 Å and when added to the 150 Å layer of oxide layer 47 it provides an increased immunity to voltage breakdown between the control line 33z and the yet to be formed polysilicon erase line 60se (see FIG. 15h) during any mode of operation of the memory chip and memory cell. A prior art dielectric layer of thermal oxide layer only that has the same thickness of about 1350 Å has a lower breakdown voltage. The spacer 48R and oxide layer 47 are thick enough to prevent any electric charge transport between polysilicon 33z and the yet to be formed polysilicon 60se of FIG. 15h during any mode of operation of the memory device and memory cell. This sandwich of thermal oxide and deposited oxide also reduces manufacturing defects because the defect that are formed in the thermal oxide do not always overlap the defects or impurities that may exist in the deposited oxide at the same location.

In contrast to the above described process, FIG. 15e illustrates the disadvantageous effect of the prior art process and structure in which thermally growing a silicon dioxide layer 47PA to a thickness of few thousands angstroms over the polysilicon word line 33zPA that insulatively overlaps a floating gate 30zPA of the memory structure. The thick thermal oxide 47PA consumes large amount of silicon from the polysilicon word line 33zPA during the oxidation process, and therefore encroaches into the space 47CA that exists between the control gate polysilicon 33zPA and the floating gate polysilicon 30zPA and thickens the dielectric layer between these two polysilicon layers. In addition the oxidation process also consumes the side walls 33SW of polysilicon gate 33zPA in such a way that it narrows the width of the control gate 33zPA.

The reason that the narrowing of word line 33zPA in the bottom portion only, while keeping its top portion as wide as was originally patterned, is not desirable is because it reduces the overlap area between the word line 33zPA and the floating gate 30zPA and therefore reduces the value of the capacitance CP2P1 of Eq. 1, thereby requiring higher programming voltage to be applied to the word line 33zPA of the structure to achieve a given level of programming when some methods of programming operations are used with the structure. One such method is for example the use of hot electrons injection from the substrate 25PA to the floating gate 30zPA. Increase in programming voltage is not desired because the higher programming voltage reduces the reliability of the transistors that interface with the memory array.

Another reason that the narrowing of the bottom portion of word line 33zPA of the prior art structure is not desired is because it increases the sheet resistance of the word line 33zPA (line 14 of FIG. 1) and thereby slows down the read access time of the memory chip.

The reason that the thickening of the interpolysilicon dielectric layer in the area 47CA is not desired is because it reduces the value of the capacitance CP2P1 of Eq. 1, thereby requiring higher programming voltage to be applied to the word line 33zPA of the structure to achieve a given level of programming when some methods of programming operations are used with the structure. One such method is for example the use of hot electrons injection from the substrate 25PA to the floating gate 30zPA. Increase in programming voltage is not desired because the higher programming voltage reduces the reliability of the transistors that interface with the memory array.

Returning to the process of the sixth embodiment of the invention, the next processing step is illustrated in FIG. 15f a special layer of silicon nitride 53 is deposited using LPCVD method over the entire structure to a thickness of about 3000 angstroms and thereafter layer 53 is etched using a masking layer to form the structure of nitride strips 53 of FIG. 15f. The nitride strips 53 actually continue along the entire length of the word lines 14 of the memory array of FIG. 1. The nitride strips 53 are formed to cover two adjacent word lines 33z and 33p from about the middle of word line 33z to the middle of word line 33p. Nitride layer 53 also covers the spacer 48L which is located long the edge of the floating gate 30 that is opposite the erase section 30s. In this manner the portion of word line 33z that is not covered by nitride 53 is close to the erase section 30s of the floating gate 30 that is disposed underneath word line 33z in the same memory cell. Also not covered by nitride 53 are oxide spacer 48R and erase section 30s of floating gate 30.

In the next step of the process a polysilicon layer 60 is deposited at 650 degrees centigrate by using LPCVD method to a thickness of about 3000 angstroms over the entire structure of FIG. 15f and than etched anisotropically by plasma or by use of RIE to form polysilicon spacers 60 as shown in FIG. 15g. The nitride strips 53 are than removed from the wafer by wet chemical stripping as is known in the art resulting in the structure of FIG. 15h in which narrow and long polysilicon strips 60m and 60se are formed on the wafer.

Referring now to FIG. 15h, each of the polysilicon strips 60m and 60se is continuous and each stretches along the entire length of word lines 14z and 14p of FIG. 1. Each of the strips 60se forms an erase word line 15 of FIG. 1 and supplies the erase voltage to the memory cell so that electrons are emitted from the floating gate region 30s to the erase gate 60se which carries the electrons to the power supply or to a voltage multiplier or to a charge pump.

In this embodiment t the polysilicon strips 60se and the polysilicon strips 60m are retained on the wafer and the resulting array structure is covered with a deposited oxide and interconnecting metal lines, such as bit lines and shunting metal word lines and on top of the metal lines another layer of silicon dioxide is formed and finally a BPSG passivation layer seals the chip. The strips 60se serve as erase lines 15 of FIG. 1 and strips 60m are not connected to any voltage source.

Figure 15J:
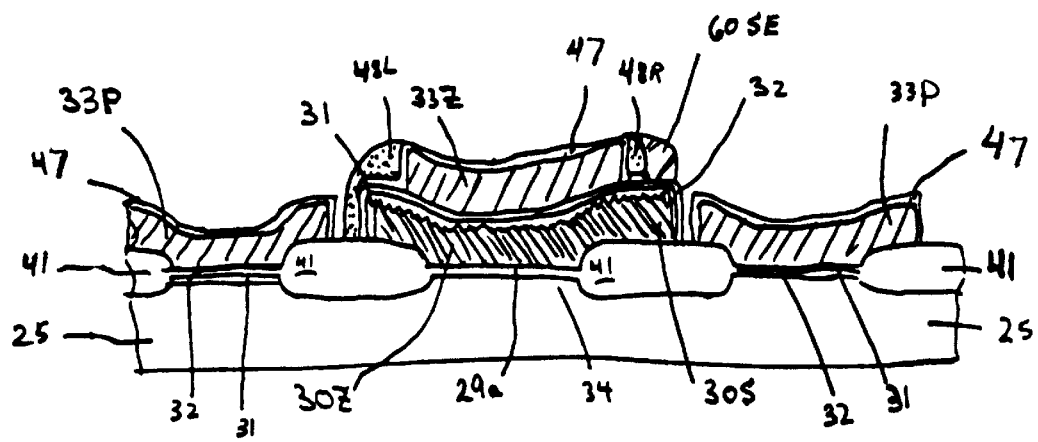
Figure 15:
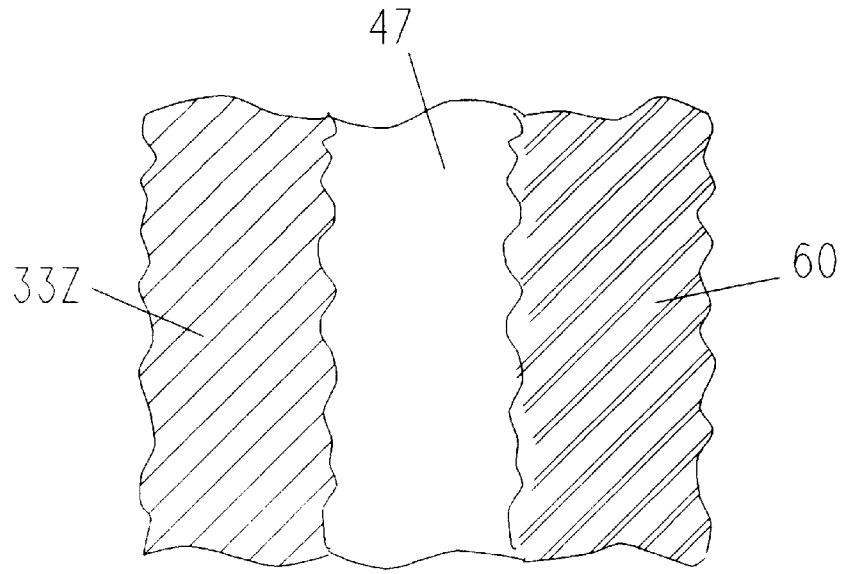
Figure 15:
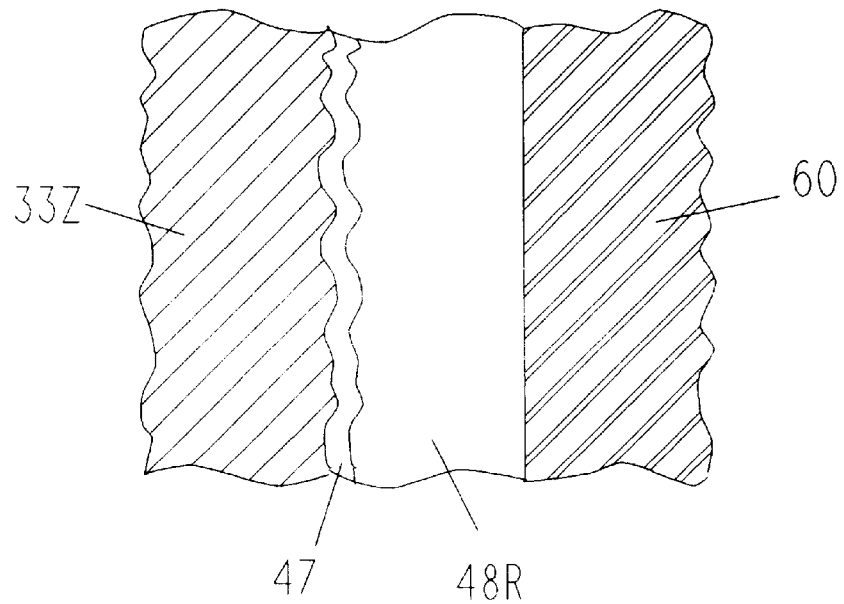

Alternatively, the polysilicon strips 60m are etched away by using an etchant that etches polysilicon much faster than silicon dioxide (ratio of about 40 to 1) while each of the polysilicon strips 60se is protected by a photoresist strip (these are not shown in the figures) that covers it. The second version of the sixth embodiment results in a more planner wafer surface which makes it easier to etch the subsequently deposited metal layers. Also the removal of strips 60m makes the formation of low-resistance silicides in contact with the word lines 33z and 33p much easier thereby reducing the ohmic resistance of the word lines 14 of FIG. 1 and shortening the read access time of the memory chip. The resulting structure after the removal of polysilicon strips 60m is shown in FIG. 15j.

It should be understood that the sixth embodiment accomplishes a self alignment between the erase gate 60se and the surface of the spacer 48R or 48L formed from TEOS oxide 48 that is smoother than the surface of the polysilicon read control gate 33z. The sixth embodiment also accomplishes a self-alignment between the erase gate 60se and the erase section 30s of the floating gate 30. These self alignments are achieved while retaining the thickness of the previously existing dielectric layer between polysilicon 33z (also called poly-2) and polysilicon 30 (also called poly-1) unchanged. The dielectric layer between poly-1 and poly-2 comprises thermal oxide layer 31 and deposited oxide layer 32. However this dielectric under poly-1 may also be formed of a sandwitch of oxide-nitride-oxide.

The fifth embodiment of the invention will now be described in reference to FIGS. 16a to 21. In this embodiment the floating gate 30 covers the whole channel area 34, such that no split-gate device is created. The processing steps that are required to fabricate this embodiment are similar up to and including the implant of the n+ diffusion 28 and the chemical stripping of the nitride 35, which result in FIG. 7a.

Figure 16A:
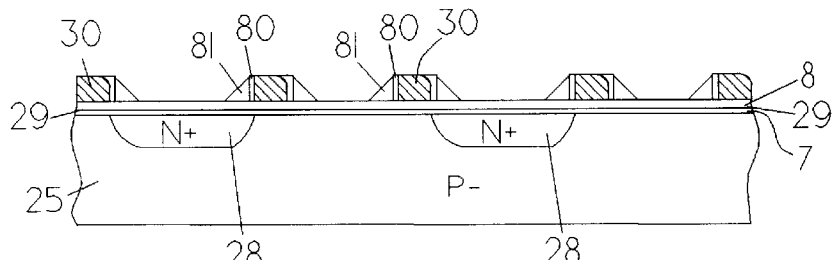
FIGS. 16a–c illustrate a cross section and top view, which result after a stage in the processing of the fifth embodiment of the invention, which does not have a split gate structure. This stage of processing come after the stage of FIGS. 7a and 7b of the first embodiment, but relates to the fifth embodiment.

Referring now to FIG. 16a, an oxide spacer is created in both sides of the polysilicon 30. The oxide spacer is created by thermally growing oxide layer 80 at 850 degrees centigrade to a thickness of 150 Angstroms and performing anisotropic etching so that oxide layer is retained only on the sidewalls of polysilicon 30. Thereafter a layer of TEOS based LPCVD oxide layer 81 is deposited to a thickness of 0.2 micrometers and an anisotropic etching is performed to complete the oxide spacer as shown in FIG. 16a.

In order to create the asymmetry in hot electrons programming of this embodiment, an n− implant into the substrate of arsenic with a dose of about 3E13cm-2 is performed at about 40 KeV.

Figure 16B:
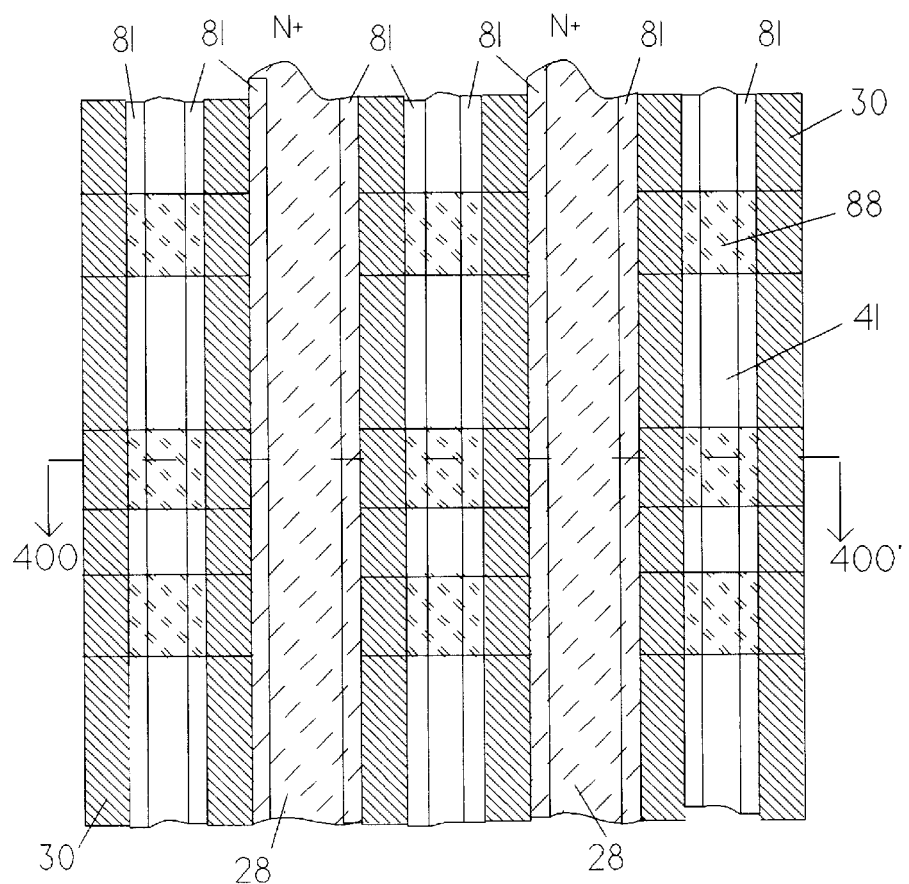
Figure 16C:
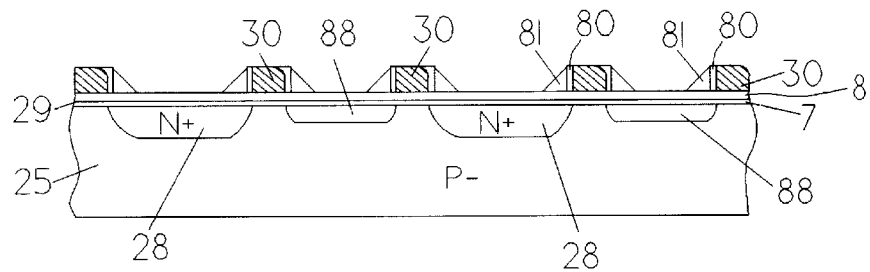

FIG. 16b is a top view of the memory array at this stage of the fabrication process. FIG. 16c is a cross section cut along line 400—400' of FIG. 16b in which N− layer 88 is shown. The n− layer 88 will serve as part of the source diffusion for the memory cell as will be shown in reference to FIG. 17.

After etching of polysilicon 30 in similar steps that were described in references to FIGS. 8a, 8b and FIG. 9, another n+ arsenic implant is performed to form layer 89, which connects n+ diffusion layer 28 to n− layer 88 and forms the source of the memory cell transistor.

Figure 17:
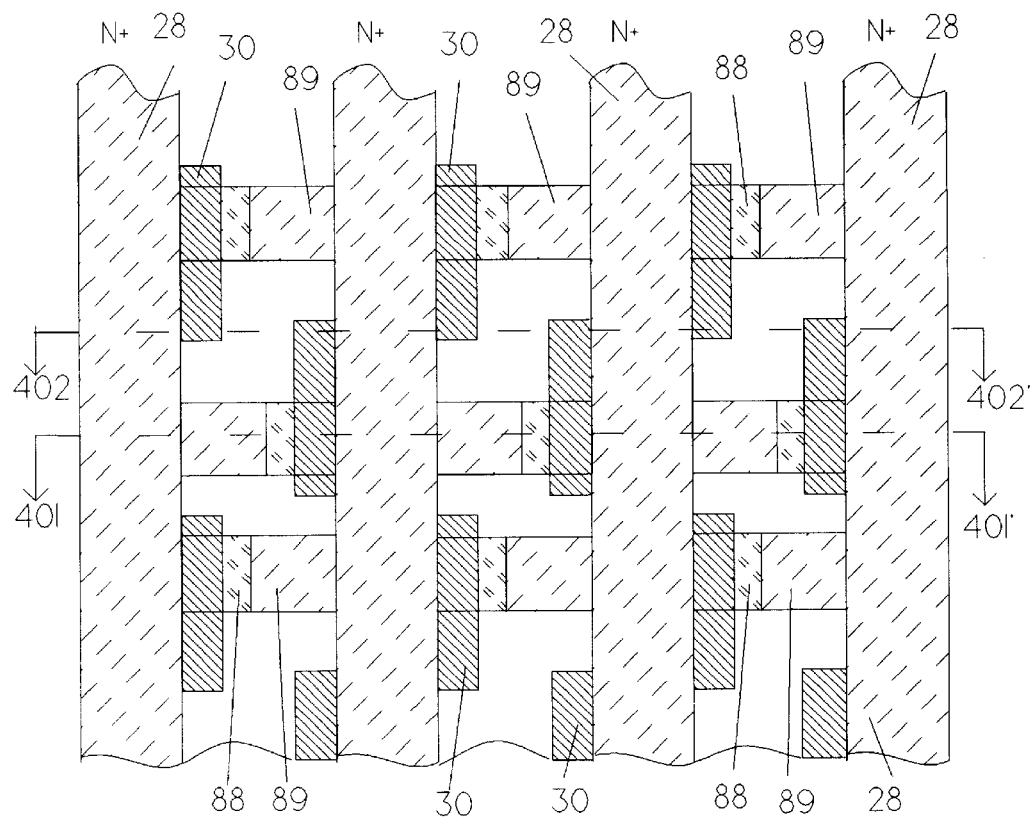
FIG. 17 illustrates the implant of the N+ into the substrate for the second time in order to connect the existing N+ bit-line implant and the N– asymmetry implant of the fifth embodiment.

FIG. 17 illustrates a top view of the array at this stage of the fabrication process.

Figure 18A:
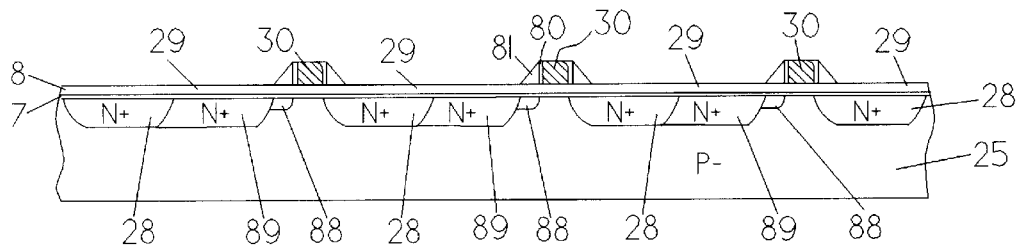
FIGS. 18a and 18b are section-cuts along lines 401—401' and 402—402' respectively of FIG. 17 respectively.
Figure 18B:
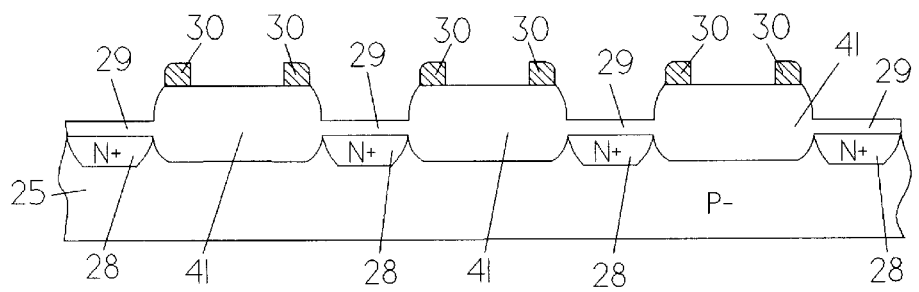

FIGS. 18a and 18b are cross sectional cuts along lines 401—401' and 402—402' of FIG. 17 respectively illustrating a profile of the various layers.

The process steps that follow, such as the oxidation of the floating gate polysilicon 30, the formation of the interpolysilicon dielectric and the formation of the word lines are similar to those that were used in the previous embodiments, so that several other non-split gate versions (embodiments) may be created, which are analogous to the previously-described embodiments.

Figure 19:
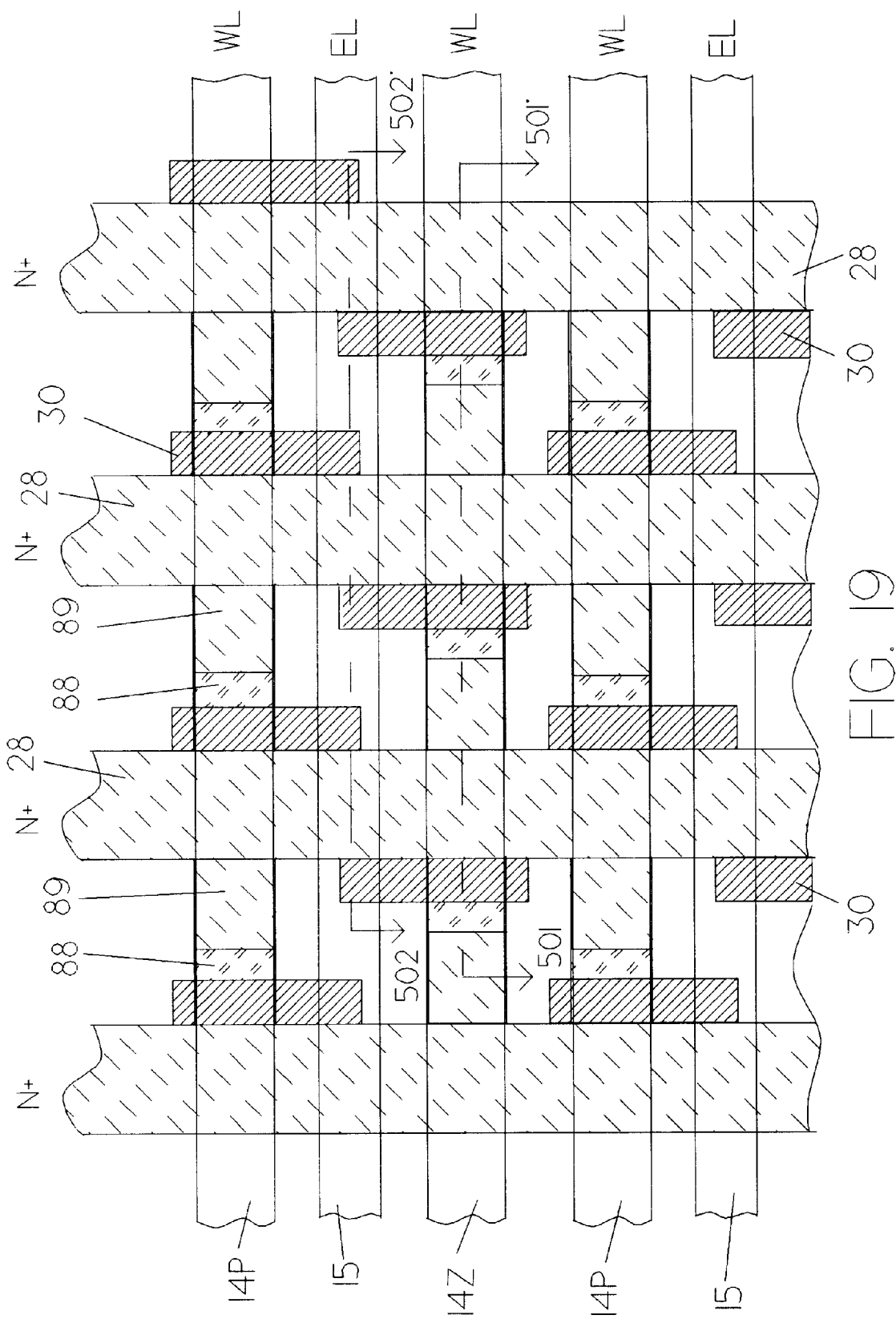
FIG. 19 is a plan view of a portion of a memory chip containing an array of the fifth embodiment of the present invention.

FIG. 19 is a top view of the array of this fifth embodiment after the formation of the word lines.

Figure 20:
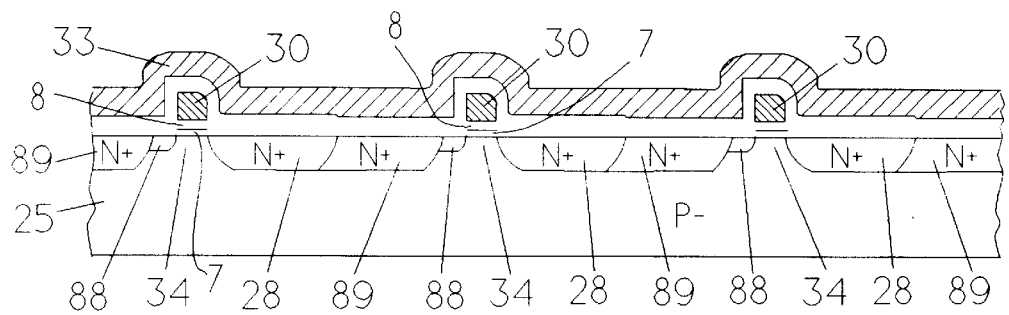
FIG. 20 is a cross section view of the memory cells of FIG. 19 along the channel regions, line 501—501' of FIG. 19.

FIG. 20 is a cross sectional cut along line 501—501' of FIG. 19 illustrating a cut along the read word line 14z.

Figure 21:
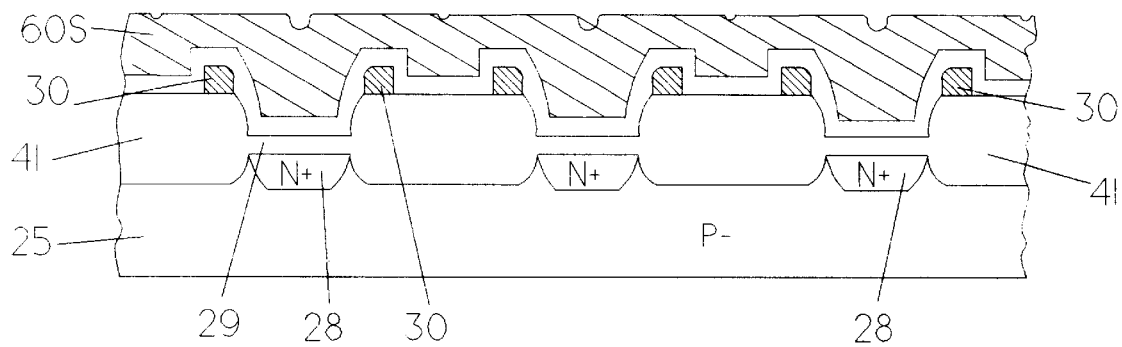
FIG. 21 is a cross section view of the memory cells of FIG. 19 along the isolation regions, line 502—502' of FIG. 19.

FIG. 21 is a cross sectional cut along line 502—502' of FIG. 19 illustrating a cut along the program/erase word line 15.

The electrical operation of two versions of this fifth embodiment will now be described.

The first version of the fifth embodiment is analogous in its operation to the operation of the first and second embodiments for which section cuts are shown in FIG. 12 and FIG. 13c respectively. Programming operation is accomplished by electron tunneling from the read word line 14 to the floating gate 30, and erase is performed by electron tunneling from the floating gate 30 to the read word line 14.

Since in the fifth embodiment the floating gate covers all the channel 34, the drain voltage is held at 0 volts to prevent parasitic hot electrons programming from the substrate, when the program/erase word line 15 is taken to a high voltage that couples to the floating gate 30 and increases its potential. Erasure is performed as with the first embodiment by taking the read word line 14 to a high voltage and holding all other terminals of the cell at 0 volts.

Alternative method of operating the fifth embodiment is analogous in its operation to the operation of the third and fourth embodiments for which section cuts are shown in FIG. 15a and FIG. 15b respectively. The programming and erasure is performed with hot electrons and tunneling respectively, as was described in reference to the third and fourth embodiments. When programming a cell in an array, a source voltage biasing is required at about 1 volt. This is done in order to minimize a parasitic drain to source current that is introduced by unselected cells along the same bit-line, but under different word lines. This phenomenon is called "drain turn-on" and is introduced by coupling of the drain 28's voltage to the floating gate 30 to a point where the channel 34 is depleted and current starts to flow between drain and source. This phenomenon is well known in the art, and does not exist in the split gate embodiments, such as the third and fourth since the floating gate 30 inverts only the drain area 34a, where the source area 34b is "off" because it is covered by the read word line polysilicon 33, which is held at 0 volts for the unselected cells.

FIG. 22 illustrates a sectional view similar to that shown in FIG. 2 after the addition of subsequent layers. An LPCVD TEOS based pad oxide layer 43 is deposited and is covered with a layer 44 of phosphorous-doped field oxide. Metal layers 45, for example of aluminum are then formed and patterned to form the column bit-lines. Each metal bit-line connects to a separate n+ bit-line 28 every several word-lines, through a contact opening in the field oxide. This is done in order to shunt the n+ higher resistance in order to minimize an undesired voltage drop between a selected cell and ground or the path between the selected memory cell and the sense-amplifier.

The metal lines of layer 45 are then covered with protective oxide coating 46 formed of 4% phosphorous-doped silicon dioxide.

The seventh embodiment of the present invention will be described in reference to FIG. 23A. When the fabrication process disclosed herein is used to fabricate the device of FIG. 2 as a single control gate EPROM (also refered to below as SCG-EPROM) or embodiments of EEPROM where an erase operation can be performed by the read word-line 14 (control gate 33). As disclosed in the above referenced U.S. Pat. No. 5,099,297, the memory cell becomes even smaller since the program/erase word line 15 of FIG. 1 or 60S of FIG. 13c is not used and therefore it is not deposited and it is not formed. Of course the region 30S in FIG. 13c of the floating gate 30 is not formed so that the end-cap of the floating gate 30 over field oxide 41 is of smallest size. This is done in order to allow the placement of the read word lines 14 closer to each other, a fact that reduces the memory cell size as compared to the a memory cell of the embodiments that incorporate the program/erase line 15. A drawing showing a top view of such an array was illustrated in FIG. 3 of the above referenced U.S. patent application Ser. No. 07/713,995 filed Jun. 12, 1991, now U.S. Pat. No. 5,278,785. A similar figure with different number of memory cell columns is shown in FIG. 23A of the instant application. FIG. 23A is also presented here to show the structure of a gate 119 that is formed between adjacent diffusion bit-lines 12 in order to reduce the geometrical pitch that is occupied by an individual column and therefore reduce the physical area of the memory array matrix 10 (numeral 10C in FIG. 23A). The space between the diffusion bit-lines 12 near the contacts 108 is narrower when this shield insulating gate (SIG) 119 is used as opposed to forming local oxide isolation (LOCOS). This is because in some operating methods a high voltage of more than 5 volts is applied between the adjacent bit lines 12 during the programming of a selected memory cell, and a transistor 119 that has its polysilicon gate at 0 volts (by connecting control line 111 to 0 volts or ground rail of the memory chip) can be formed to be narrower and is more reliable than an isolation region of the same dimension. A detailed explanation and drawings of section cut of the structure that involve the bit-line contact 108 and transistors 119 is disclosed in U.S. patent application Ser. No. 07/713,995, filed Jun. 12, 1991, now U.S. Pat. No. 5,278,785, that is expressly incorporated herein by reference.

The contact 108 can be formed to be self-aligned to the polysilicon of SIG 119 and of the line 11 by one of many fabrication methods that are known in the art, thereby further reducing the physical size of the memory array. One such method is described in "An Alignment-Tolerant Contact Process Using Landing Pads", *Technical Developments*, Vol. 12, pp 17–18, April 1991, Motorola Inc., which is expressly incorporated herein by reference.

A first method of operating the seventh embodiment of FIG. 23A as an SCG-EPROM cell is to program a cell, which is represented individually in FIG. 23B as a cross section along line B—B' of FIG. 23A. When the control gate 33 (see also cross section in FIG. 2) is at high voltage Vpp of 12 volts, the voltage of the drain 28a is at high voltage at VD of 9 volts, the voltage of the source 28b is at VSS or ground voltage of 0 volts and the substrate is biased at VSS voltage of 0 volts. This voltage bias condition causes current flow between drain and source diffusions, which in turn causes hot electron injection from the substrate into the floating gate 30 through oxide layer 29a. This increase in number of electrons trapped in the floating gate 30 increases the threshold voltage of the cell significantly to about 6 volts, thus it is programmed and so during read operations of a programmed cell no current flows between the drain and source of a programmed cell. Table (3) described the bias voltages that are applied to the array during programming of the SCG-EPROM when using the first SCG-EPROM programming method.

TABLE 3

|  | VD | VS | VP2 |
| --- | --- | --- | --- |
| Selected Even Numbered Row | 8 | 0 | 12 |
| Unselected On Same Row | 2 | 7 | 12 |
| Unselected On Same Column Odd Numbered Row | 0 | 8 | 0 |
| Unselected On Same Column Even Numbered Row | 8 | 0 | 0 |

The read operation of this first method is performed by biasing the source 28b at about 2 volts and connecting the source 28b to a sense amplifier and at the same time connecting the drain 28a to a Vss voltage of 0 volts and the read word line 14 to 5 volts, that is the Vcc power rail of the chip. In memory chips that employ this and the other embodiments that are disclosed in this application, but that have only one power supply rail of 3 volts the read word line 14 is biased at 3 volts during read operation. This voltage biasing condition of the memory cell prevents parasitic programming of the cell by a phenomenon known as soft-write. The circuits, the logic and architecture that is required to perform the decoding and routing of the source 28b and the drain 28a and their associated bit lines are disclosed by the applicant of the present application in the above referenced and co-pending U.S. patent application Ser. No. 07/713,995 filed Jun. 12, 1991, now U.S. Pat. No. 5,278,785, incorporated herein by reference.

In a second method of operating the seventh embodiment as an SCG-EPROM cell in which a split gate memory cell structure is used, which is represented in a cross section individually in FIG. 23B, is programmed when the control gate 33 (also shown in FIG. 2) is at a voltage $Vp2_2$ that is slightly above the threshold voltage of 0.8 volts of the source area 34b defined here as Vts=0.8 volts, the control gates of the unselected memory cells along the selected column are biased at 0 volts. That slight amount of voltage defined here as a1 is in the amount of about 0.2 volts and it is added to the threshold voltage Vts to bring the voltage $Vp2_2$ of the control gate 33 (also word line 14 of FIG. 23A) to be equal to $Vp2_2 = Vts + a1$.

In the explanation that follows a reference is made to channel zone 34p. The zone 34p includes portion of the drain area 34a and portion of the source area 34b under the edge of the floating gate 30 near the middle of the channel 34, that is to say near the source 28b side of the floating gate 30. The zone 34p is spaced apart from the drain region 28a and from the source 28b along the surface of the substrate 25 and extends from a first isolation region 41 on one side of the channel 34 to the second isolation region 41 on the other side of the channel 34.

In this second method of the seventh embodiment the voltage of the drain 28a is biased at a high voltage Vpp of 12 volts, the voltage of the source 28b is at Vss or ground voltage of 0 volts and the substrate 25 is biased at Vss voltage of 0 volts. This voltage bias conditions cause current flow between drain and source diffusions, which in turn causes hot electron injection from channel 34 into the floating gate 30 through oxide layer 29a. Because the source area 34b is only weakly-inverted the voltage of the floating gate 30 is much higher than the voltage at the surface of the channel 34 at the zone 34p where hot electrons are generated. This increases the hot electron injection efficiency so that large number of hot electrons travel from the channel zone 34p to the floating gate 30, mostly through the gate oxide region 29AP, in a very short time and with a low source-drain current requirement. These increase in number of electrons trapped in the floating gate 30 increases the threshold voltage of the cell significantly, thus it is programmed within less than 1 microsecond and so during read operations no current flows between the drain and source of a programmed cell that stores the non-conducting state of only one binary bit.

The threshold voltage Vts of the source area 34b of this second method is defined with source-drain current value of 1 microamper and so during programming a memory cell conducts source-drain current that is about 1 microampare. This allows simultaneous programming of thousands of memory cells along a given word-line 14z or 14p of FIG. 23A within the short time of 1 microsecond. One may use a voltage multiplier on the same silicon chip in order to provide the high voltage supply to the drain 28a during programming, which eliminates an external voltage multiplier chip or a more complex power supply outside the memory chip. Table (4) described the bias voltages that are applied to the array during programming of the SCG-EPROM when using this second SCG-EPROM programming method.

TABLE 4

|  | VD | VS | VP2$_2$ |
|---|---|---|---|
| Selected Even Numbered Row | 12 | 0 | 0.8 + 0.2 |
| Unselected On Same Row | 0 | 0 | 0.8 + 0.2 |
| Unselected On Same Column Odd Numbered Row | 0 | 12 | 0 |
| Unselected On Same Column Even Numbered Row | 12 | 0 | 0 |

The read operation of this second SCG-EPROM operation method is performed by biasing the source 28$b$ at about 2 volts and also connecting the source 28$b$ to a sense amplifier and at the same time connecting the drain 28$a$ to a Vss voltage of 0 volts and the read word line 14 of the selected cell to 5 volts, and all unselected word lines 14 are biased at 0 volts. This voltage biasing condition of the memory cell prevents parasitic programming of the cell by a phenomenon known as soft-write. The circuits, the logic and architecture that is required to perform the decoding and routing of the source 28$b$ and the drain 28$a$ and their associated bit lines are disclosed by the applicant of the instant application in the above referenced U.S. Pat. No. 5,278,758.

With a third method of operating the seventh embodiment of FIG. 23A in which a split gate memory cell structure (FIG. 23B) is used, the SCG-EPROM cell will program when the control gate 33 is at a voltage Vp2$_3$ which is slightly under the threshold voltage of 0.8 volts of the source area 34$b$ defined here as Vts, the control gates 33 of the unselected memory cells along the selected bit line are biased at 0 volts. That small amount of voltage defined here as σ2 is in the range of about 0.1 volts to 0.2 volts and it is subtracted from the source area threshold voltage defined here as Vts to bring the voltage Vp2$_3$ of the control gate 33 to be equal to Vp2$_3$=Vts−σ2, which is a sub-threshold voltage of the source area 34$b$ of the channel.

The programming mode of the third method takes place in three stages or time periods Δt1, Δt2 and Δt3. During the first time period Δt1 which lasts about 50 nanoseconds, the voltage of the drain 28$a$ is biased initially at a Vcc voltage of 5 volts, the voltage of the source 28$b$ is biased initially at Vcc of 5 volts, the voltage of the control gate 33 is biased at Vcc voltage of 5 volts and the substrate 25 is biased at Vss voltage of 0 volts. During the first time period Δt1 no current flows between the drain and the source, that is to say Ids=0 microamperes. During the second time period Δt2 the potential of the drain 28$a$ is increased to 12 volts which increases the voltage of the floating gate 30 because of the physical overlap that exist in the region of the gate oxide 29AD, due to the under-diffusion area of drain 28$a$ under floating gate 30, and which is directly in contact with a portion of the gate oxide 29AD. This under-diffusion overlap creates the capacitance CDP1 of FIG. 14, which causes the drain area 34$a$ to strongly couple the voltage of the drain 28$a$ to the floating gate 30 while the source area 34$b$ is still not inverted because the voltage of the control gate 33 is biased under the threshold voltage 0.8 volts of the source area 34$b$. This mode of voltage biasing of the split-gate memory cell was disclosed in the above referenced U.S. Pat. Nos. 4,845,538 and 5,047,814 issued to the same applicant of this application. However due to the small potential difference between the voltage of the floating gate 30 and the voltage of the control gate 33 of this third method of operation of the seventh embodiment, there is no reverse electron tunneling from the control gate 33 to the floating gate 30. During this second period Δt2 there is no source to drain current, so that Ids is still 0 microamperes. The period Δt2 typically lasts about 50 nanoseconds in which the drain area of the channel 34$a$ inverts.

During the third period Δt3 which lasts about 1 microsecond, the voltage of the source 28$b$ is reduced by (Vts−σ2) volts so that the source area of the channel 34$b$ is very weakly-inverted and able to conduct sub-threshold current. The value of threshold voltage Vts of the source area 34$b$ increases under these voltage bias conditions due to the back bias effect and so the actual source area threshold voltage is named here Vtsp and is of a magnitude of about 1.4 volts. Therefore the value of (Vtsp−σ2) also increases proportionally to be about (1.4−0.2)=1.2 volts so that the source voltage is biased at about 3.8 volts. A circuit to accomplish this voltage supply to the source 28$b$ may include an NMOSFET transistor in the periphery circuits accessing the bit-lines 12. This NMOSFET transistor has its drain and gate connected to the Vcc voltage of 5 volts and its source connected to the memory cell source 28$b$. The NMOSFET has initial threshold voltage Vtn0 of 0.7 volts as measures when the voltage between its source and the substrate 25 is 0 volts. When the NMOSFET is biased to have a voltage difference between its source and the substrate 25 as indicated above, the threshold Vtn will increase to about 1.2 volts which is the desired voltage drop from 5 volts to achieve 3.8 volts which is the desired voltage for connection to the source 28$b$ of the memory cell. The voltage of the drain 28$a$ remains at 12 volts. This voltage bias condition causes sub-threshold current flow between drain and source diffusions when the source area 34$b$ is weakly-inverted and the drain area 34$a$ is strongly inverted. The electrons start to travel from the source 28$b$ toward the drain 28$a$ and reach the channel area that is disposed under the space (or gap) that exist between the floating gate 30 and the control gate 33 and, that is to say, the space that is filled with the wall of oxide layers 31 and 32. The electrons pass under this space between the drain area 34$a$ of the channel and the source area 34$b$ of the channel, and the electrons encounter a big potential difference that is approximately equal to the drain voltage and therefore the electrons accelerate toward the drain 28$a$ and the electrons become heated. Some of the heated electrons will be injected from the substrate through the gate oxide 29$a$ into the floating gate 30. Because the source area 34$b$ is very weakly-inverted the voltage of the floating gate 30 is much higher than the voltage at the surface of the channel 34 at the zone 34$p$ where hot electrons are generated. This increases the hot electron injection efficiency so that a large number of hot electrons travel from the channel area 34$b$ to the floating gate 30 in a very short time mostly through the region 29AP of the gate oxide 29A, and with a low source-drain current requirement. These increase in number of electrons trapped in the floating gate increases the threshold voltage of the cell significantly, thus it is programmed within less than 1 microsecond and so during read operations no current flows between the drain and source of a cell that is programmed to contain one binary logical bit.

The threshold voltage Vts of the source area 34$b$ of this third method is defined with source-drain current value of 1 microamper and so during programming a memory cell conducts source-drain current that is significantly below the 1 microampare. This allows simultaneous programming of thousands of memory cells along a given word-line 15 using a voltage multiplier on the same silicon die in order to provide the high voltage supply to the drain 28a during programming, which eliminates a dedicated extra pad on the chip to interface with adjacent components within a system that incorporates a memory chip that incorporates the present invention. Table (5) described the bias voltages that are applied to the array during the period ∆t3 of programming of the SCG-EPROM when using the third SCG-EPROM programming method.

TABLE 5

|  | VD | VS | $VP2_3$ |
|---|---|---|---|
| Selected Even Numbered Row | 12 | 3.8 | 5 |
| Unselected On Same Row | 5 | 5 | 5 |
| Unselected On Same Column Odd Numbered Row | 3.8 | 12 | 3.8 |
| Unselected On Same Column Even Numbered Row | 12 | 3.8 | 3.8 |

The read operation of the third SCG-EPROM method is performed by biasing the source 28b at about 2 volts and connecting the source 28b to a sense amplifier and at the same time connecting the drain 28a to a Vss voltage of 0 volts and the read word line 14 to 5 volts. In memory devices that have only one power supply of 3 volts the read word line 14 is biased at 3 volts during read operation. This voltage biasing condition of the memory cell prevents parasitic programming of the cell by a phenomenon known as soft-write. The circuits, the logic and architecture that are required to perform the decoding and routing of the source 28b and the drain 28a and their associated bit are disclosed by the applicant of the present application in the above referenced U.S. Pat. No. 5,278,785.

With a fourth method of operating the seventh embodiment of FIG. 23A in which a split gate memory cell structure (FIG. 23B and FIG. 2) is used, the SCG-EPROM cell will program when the selected control gate 33 is at a voltage $Vp2_4$ which is slightly over the threshold voltage of 0.8 volts of the source area 34b defined here as Vts, the unselected control gates along the selected bit-line are biased at 0 volts. That small amount of voltage defined here as σ3 is in the range of about 0.1 volts to 0.2 volts and it is subtracted from the source area threshold voltage defined here as Vts to bring the voltage $Vp2_4$ of the control gate 33 to be equal to $Vp2_4$=Vts+σ3.

The programming mode of the fourth method takes place in three stages or time periods ∆t1, ∆t2 and ∆t3. During the first time period ∆t1 which lasts about 50 nanoseconds, the voltage of the drain 28a is biased initially at a Vcc voltage of 5 volts, the voltage of the source 28b is biased initially at Vcc of 5 volts, the voltage of the control gate 33 is biased at Vcc voltage of 5 volts and the substrate 25 is biased at Vss voltage of 0 volts. During the first time period ∆t1 no current flows between the drain and the source, that is to say Ids=0 microamperes. During the second time period ∆t2 the potential of the drain 28a is increased to 12 volts which increases the voltage of the floating gate 30 because of the physical overlap (expressed as capacitance CDP1 in FIG. 14) that exist at the region 29AD of gate oxide 29A, due to the under-diffusion area of drain 28a under floating gate 30 which causes the drain area 34a to strongly couple the voltage of the drain 28a to the floating gate 30 while the source area 34b is still not inverted because the voltage of the control gate 33 is biased under the threshold voltage 0.8 volts of the source area 34b. This mode of voltage biasing was disclosed in the above referenced U.S. Pat. Nos. 4,845,538 and 5,047,814 issued to the same applicant of this application. However due to the small potential difference between the voltage of the floating gate 30 and the voltage of the control gate 33 when applying this fourth method, there is no reverse electron tunneling from the gate 33 to the floating gate 30. During the second period ∆t2 there is no source drain current, so that Ids is still 0 microamperes. The period ∆t2 typically lasts about 50 nanoseconds.

During the third period ∆t3 which lasts about one microsecond, the voltage of the source 28b is reduced by (Vts+σ3) volts so that the source area of the channel 34b is weakly-inverted and able to conduct sub-threshold current The value of threshold voltage Vts under these bias conditions increases due to the back bias effect and so the actual source area threshold voltage is named here Vtsp and is of a magnitude of about 1.4 volts. Therefore the value of (Vtsp+σ3) also increases proportionally to be about (1.4+0.2)=1.6 volts so that the source voltage is biased at about 3.4 volts. A circuit to accomplish this voltage supply to the source 28b may include an NMOSFET transistor in the periphery circuits accessing the bit-lines 12. This NMOSFET transistor has its drain and gate connected to the Vcc voltage of 5 volts and its source connected to the memory cell source 28b. The NMOSFET has initial threshold voltage Vtn0 of 0.9 volts as measures when the voltage between its source and the substrate 25 is 0 volts. When the NMOSFET is biased to have a voltage difference between its source and the substrate 25 as indicated above, the threshold Vtn will increase to about 1.6 volts which is the desired voltage drop from 5 volts to achieve 3.4 volts for connection to the source 28b of the memory cell. The voltage of the drain 28a remains at 12 volts. This voltage bias conditions cause current flow between drain 28a and source 28b diffusions when the source area 34b is slightly inverted and the drain area 34a is strongly inverted. The electrons start to travel from the source 28b toward the drain 28a and reach the channel area that is disposed under the space (or gap) that exist between the floating gate 30 and the control gate 33 and, that is to say, the space that is filled with the wall of oxide layers 31 and 32. The electrons pass under this space between the drain area 34a of the channel and the source area 34b of the channel, and the electrons encounter a big potential difference that is approximately equal to the drain voltage and therefore the electrons accelerate toward the drain 28a and the electrons become heated. Some of the heated electrons will be injected from the substrate through the gate oxide 29a into the floating gate 30. Because the source area 34b is very weakly-inverted the voltage of the floating gate 30 is much higher than the voltage at the surface of the channel at the point where hot electrons are generated. This increases the hot electron injection efficiency so that a large number of hot electrons travel from the channel 34 to the floating gate 30 in a very short time and with a low source-drain current requirement. These increase in number of electrons trapped in the floating gate increases the threshold voltage of the cell significantly, thus it is programmed within less than 1 microsecond and so during read operations no current flows between the drain and source of a programmed cell.

The threshold voltage Vts of the source area 34b of this fourth method is defined with source-drain current value of 1 microamper and so during programming a memory cell conducts source-drain current that is significantly below the 1 microampare. This allows simultaneous programming of thousands of memory cells along a given word-line 15 using a voltage multiplier on the same silicon die in order to provide the high voltage supply to the drain 28a during programming, which eliminates a dedicated extra pad within the chip to interface with adjacent components within a system that incorporates a memory chip that incorporates the present invention. Table (6) described the bias voltages that are applied to the array during the period Δt3 of programming of the SCG-EPROM when using the third SGC-EPROM programming method.

TABLE 6

|  | VD | VS | VP2$_4$ |
| --- | --- | --- | --- |
| Selected Even Numbered Row | 12 | 3.4 | 5 |
| Unselected On Same Row | 5 | 5 | 5 |
| Unselected On Same Column Odd Numbered Row | 3.4 | 12 | 3.4 |
| Unselected On Same Column Even Numbered Row | 12 | 3.4 | 3.4 |

The read operation of the fourth SGC-EPROM method is performed by biasing the source 28b at about 2 volts and connecting the source 28b to a sense amplifier and at the same time connecting the drain 28a to a Vss voltage of 0 volts and the read word line 14 to 5 volts. The circuits, the logic and architecture that are required to perform the decoding and routing of the source 28b and the drain 28a and their associated bit lines are disclosed by the applicant of the present application in the above referenced U.S. Pat. No. 5,278,785.

Each of the above four methods of operating the seventh embodiment with the device of FIG. 23B (also shown in FIG. 2) as an SGC-EPROM can be employed also in combination with Fowler-Nordheim electron tunneling to convert the device into an EEPROM which does not include the control line 15 (indicated also as 60S of FIG. 13c) or the region 30S of the floating gate 30 in order to reduce the memory cell size as mentioned above. This memory cell can be referred to below as single control gate EEPROM or SCG-EEPROM. As indicated in reference to FIG. 13c the top surface of the floating gate 30 in the region 30Z is textured with asperities. During erasure of the memory cell the control gate 33 (read word-line 14 of FIG. 23) is taken to 14 volts while the drain 28a, the source 28b and the substrate 25 are biased at 0 volts. This voltage bias conditions will force electrons to tunnel from the floating gate 30 to the control gate 33 through interpoly oxide layers 31 and 32 so that the threshold voltage of the memory cell returns from the programmed value of about 6 volts to the initial value of 0.8 volts. The erasure period typically takes between 2 and 3 milliseconds.

Figure 24:
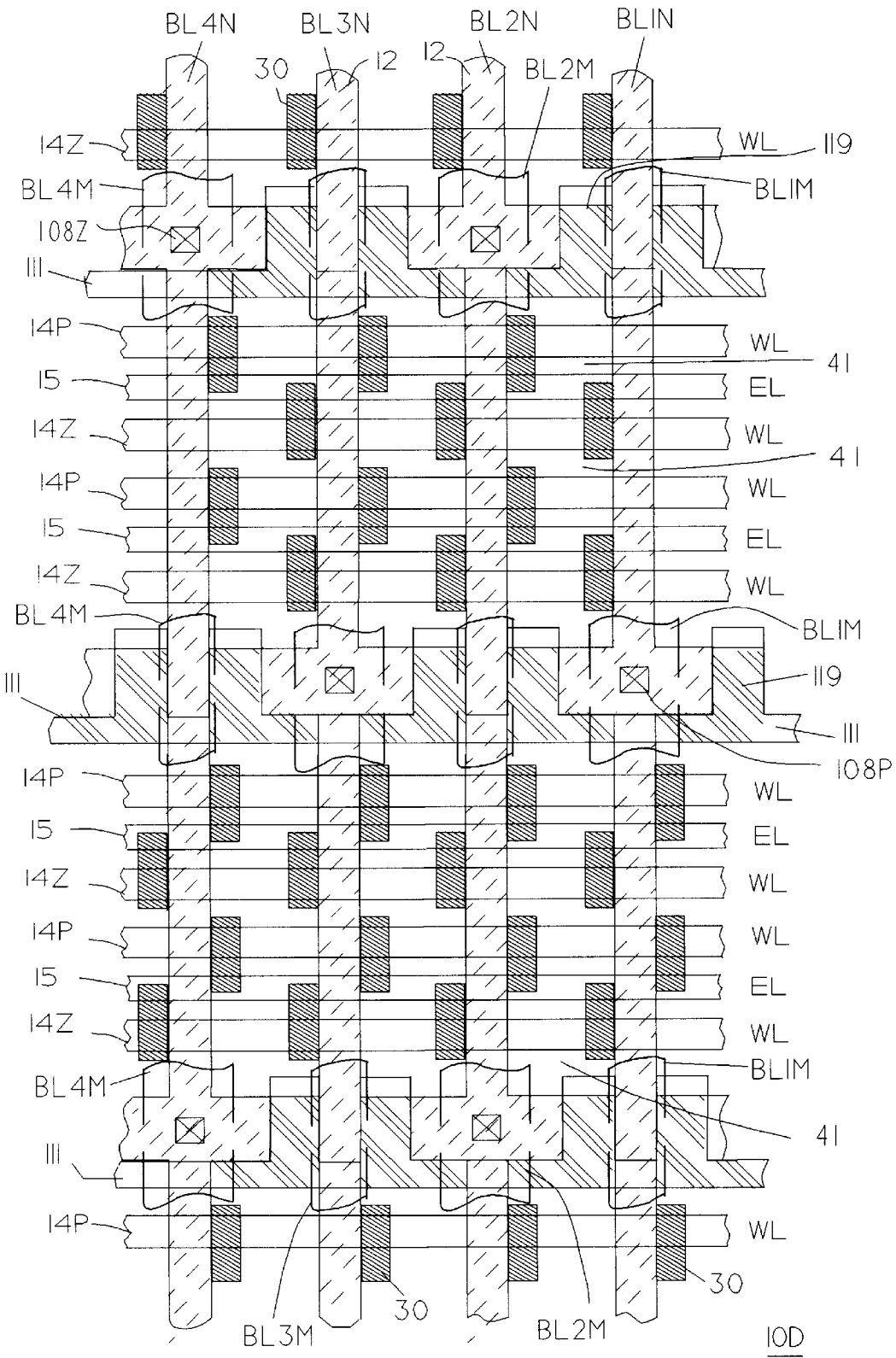
FIG. 24 is a plan view of a memory cell array according to another embodiment of the present invention in which the memory array includes memory cells in which the end cap of the floating gate extends over the isolation region disposed under a conductive layer that is adjacent the read word line of the row. The shortest distance between adjacent bit-line diffusion regions is determine by a shield gate.

Referring now to FIG. 24 of the instant application which is similar to FIG. 8 of the above referenced U.S. Pat. No. 5,278,785, and is shown here again to illustrate the reduced dimension of the spacing between bit-line diffusions 12 of FIG. 1 of the EEPROM of the present application that incorporates the control program/erase line 15. This reduction in space between bit lines 12 is shown in array matrix 10D of FIG. 24 as accomplished by the associated transistor 119. In FIG. 24 the contacts 108 between the low resistance metals BLiM and the diffusion bit-lines 12 are positioned so as to form one horizontal row of contacts 108z that are associated with even numbered bit lines 12 and to form another horizontal row of contacts 108p that are associated with odd numbered bit-lines 12. The contact 108 along a given bit line 12 are connected by a continuous diffusion line 12 (also marked with the numeral BL1N, BL2N etc.) that is integrally formed within the substrate 25 and optionally by a lower resistance metal line (numbered BL1M, BL2M etc.) that is insulatively disposed over the word lines 14 and 15.

The array of FIG. 23A and of FIG. 24 are suitable for operation as an array of an associative memory chip. In an associative memory chip only one bit line is selected by the column decoder to be sensed by the sense amplifier. If bit line BL2N is to be selected than ground potential of 0 volts is applied to the adjacent bit lines BL1N and BL3N simultaneously. At the same time, all the read word lines 14P and 14Z are selected simultaneously in order to cause the sense amplifier at the end of the array to detect if there was at least one memory cell whose transistor in not programmed and therefore it will conduct channel current which will pull the voltage of bit line BL2N to a lower voltage such as ground of 0 volts. The programming and erasure of the memory cells is performed as described above.

The array of FIG. 23A can be modified for operation as a mask programmable read only memory (ROM) by avoiding the formation of the floating gates in the data storage memory cells and substituting the channel implant to an implant level that can represent a logical "0" or to an implant level that represents a logical "1". A dedicated photolithography mask is typically used for simultaneous programming the predetermined implant level in the different memory cells in the semiconductor fabrication factory. For the manufacturing of a mask-ROM only the read operation described above is applicable.

The eighth embodiment of the present invention will now be described in reference to FIG. 25, which is a top view of a portion of a memory array matrix 10E. The fabrication process steps that are used to form the memory cells of array 10E of this eighth embodiment are the same process steps that were used to form the elongated first polysilicon strips 30 of the fifth embodiment, with the restriction on the definition of isolation regions 41 which are formed only in portions of the isolation regions 41 of FIG. 16b that are to be disposed under the polysilicon strips 30. Other process steps associated with the formation of the word-line 15 are not implemented so that word-lines 15 of FIG. 19 are not formed and so the steering regions 30S of the floating gates 30 are not needed and the geometrical length of the floating gate 30, as measured along the bit-line axis, is shorter to allow more physical memory cells per unit area of the memory chip. A memory cell of this eighth embodiment retains the feature of asymmetry in programming and physical construction of its drain and source and of the fact that the cell has stronger drain to source current than source to drain current.

Figure 25:
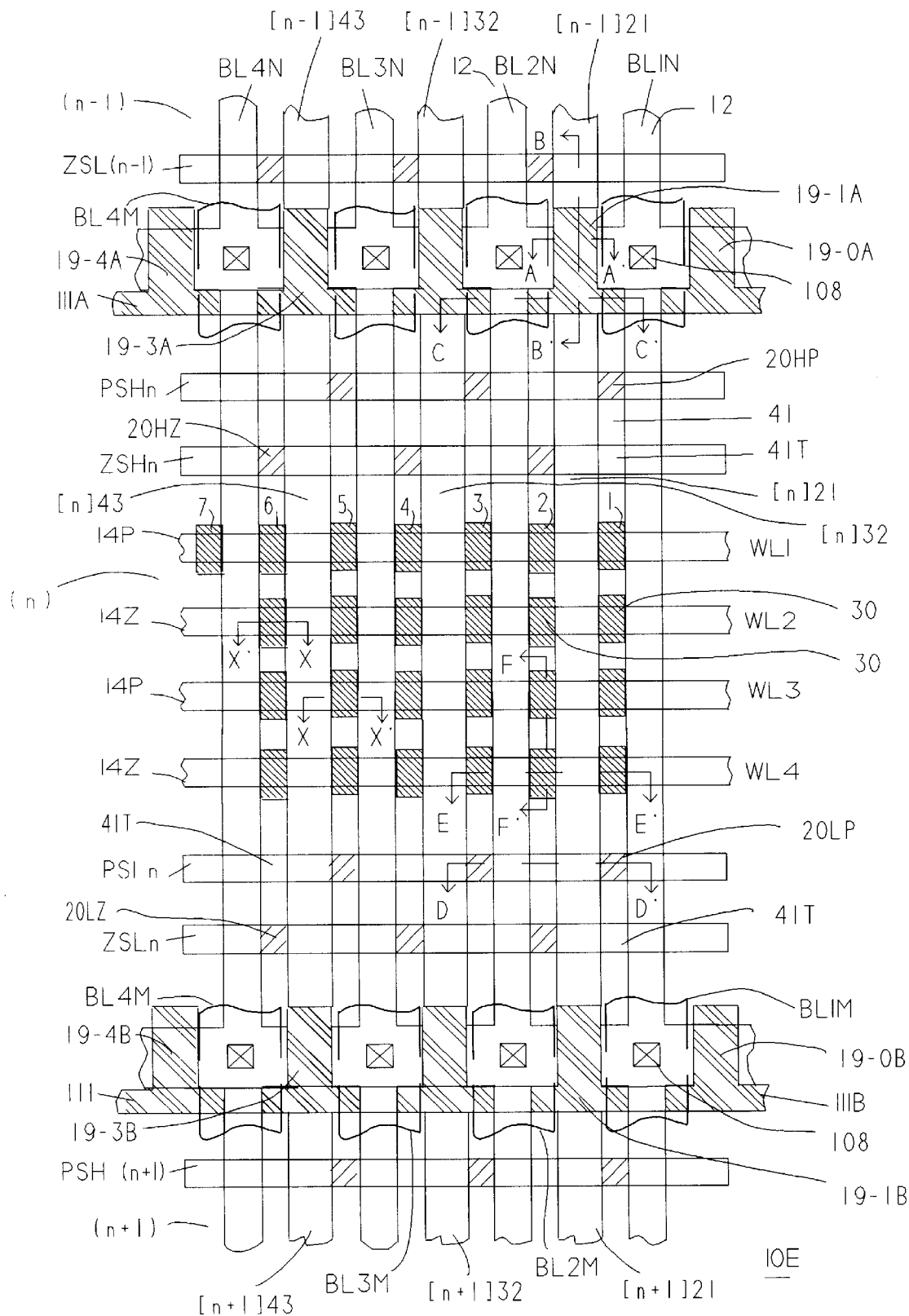
FIG. 25 is a plan view illustrating eighth embodiment of the present invention illustrating a memory array 10E which includes embedded bit-line diffusions that are associated with corresponding memory cell array segments.
Figure 26:
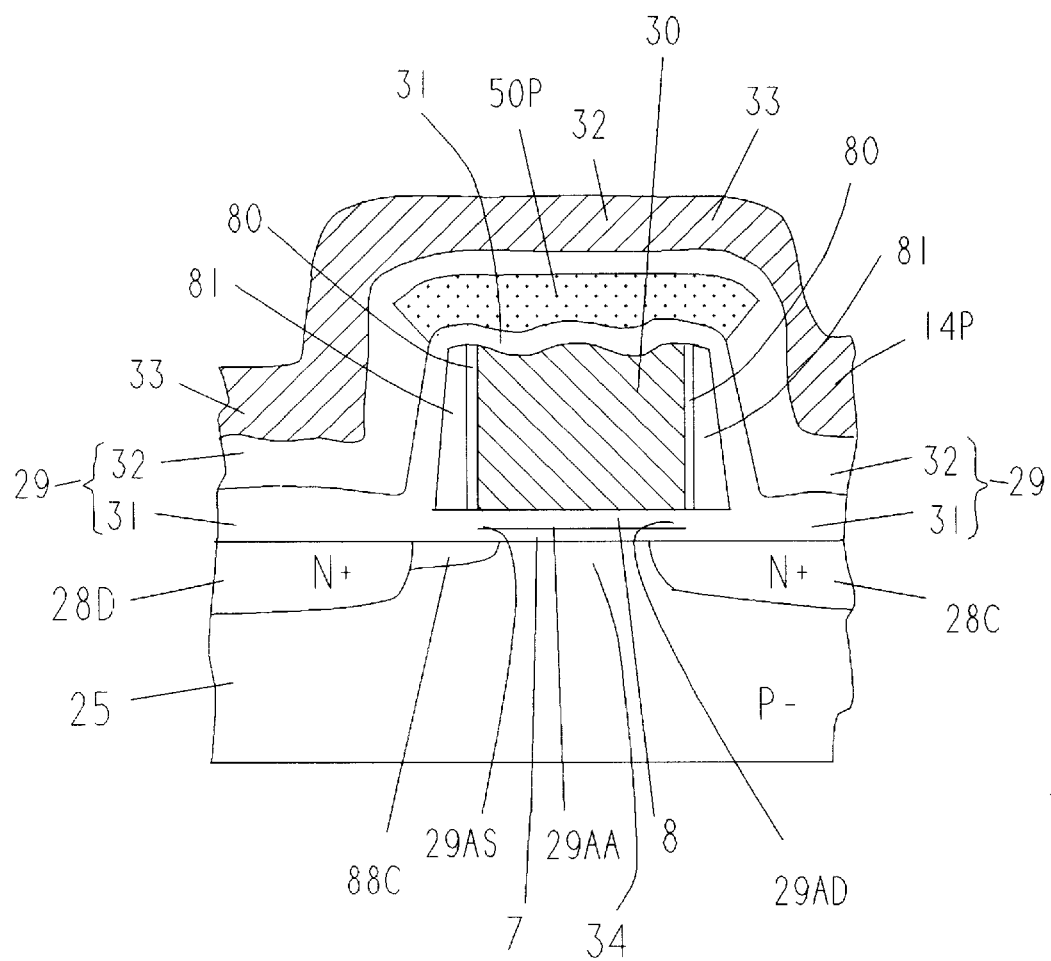
FIG. 26 is a magnified cross-section of the cell shown in FIG. 25, which is a section cut along line X—X' therein.
Figure 27:
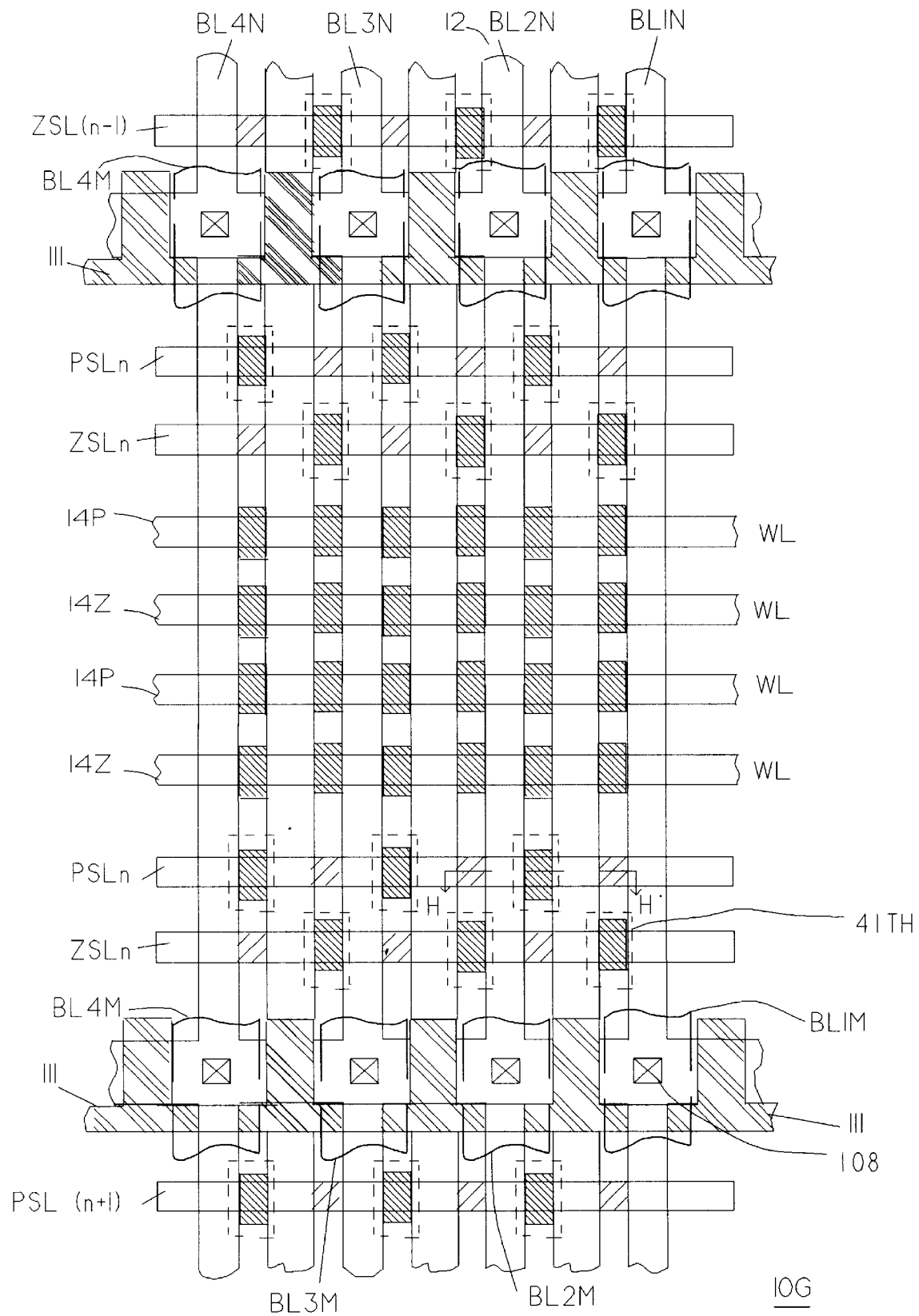
FIG. 27 is a plan view illustrating another version of the eighth embodiment of the present invention illustrating a memory array 10G in which isolation between bit-line diffusion is formed by programmable memory transistors that include floating gates.

The individual memory cell of the eighth embodiment is shown in FIG. 26, which is a section cut along line X—X' of FIG. 25. Here the transistor is formed on P− type substrate. N+ impurities such As are implanted to form drain 28c and portion of source 28d. Source 28d has another portion 88c that is shallow N− type As implant junction. The floating gate 30 has a textured top surface for increased capacitance are for improved coupling to the control gate 33. The gate oxide 29AA has a thickness of 100 angstroms of which thermal oxide layer 7 is 40 angstrom thick and PECVD TEOS oxide 8 has a thickness of 60 angstroms. The floating gate 30 is covered with 150 angstroms thermal silicon dioxide 31, a 200 angstroms of silicon-nitride 50P covering oxide 31 and a 100 angstroms oxide 32 disposed over nitride 50p in the area that overlays channel 34, which is thicker over the diffusion area of drains 28c and the source 28d, than over nitride 50p. The spacers portion 80 are of thermal oxide, and the spacer 81 are TEOS oxide. The overlap area of floating gate 30 and the drain diffusion in marked 29AD, and the overlap area of the floating gate 30 over the source portion 88c, and the overlap area of the floating gate 30 over the channel 34 are such that the thickness of the gate oxide 29AA is the same. The transistor has a control gate polysilicon 33 that is disposed over oxide 33 to overlap the floating gate 30.

Additionally, instead of forming the separated source diffusion regions 89 of FIG. 17, continuous diffusion source regions are formed, for example [n]21, to be in parallel to the regions 28 of FIG. 26, which is also marked as numeral 12 or BL1N, BL2N, BL3N or BL4N in FIG. 25 (these bit-lines will be referred to collectively as a group as BLiN in the explanation below). The continuous source diffusion bit-line regions of this eighth embodiment (FIG. 25) that are formed instead of regions 89 and are indicated as [n]21 or [n]32 or [n]43 (these bit-lines will be referred to collectively as a group as [n]jk in the explanation below). Once the bit-line regions BLiN and bit-line regions [n]jk are formed, the elongated continuous polysilicon strips 30 are etched to form the isolated floating gates 30 of FIG. 25, so that an additional floating gate 30 is formed in essentially the same wafer surface area of the memory cell of FIG. 17 of the fifth embodiment. The additional floating gate 30 is defined as a part of another memory cell so that the array of this eighth embodiment contains about two memory cells in the same substrate area that contained only one memory cell of the fifth embodiment. Of course each of the memory cells of all the embodiments disclosed in this application can be used to store one digital binary bit or plurality of digital bits or analog charges as was disclosed for example in the above referenced U.S. Pat. No. 5,278,785.

In FIG. 25 there are several other features that contribute to the increase in the packing density of the number of memory cells per unit area of a memory chip that uses the array architecture of array 10E, which result in reduced manufacturing cost of the memory chip. These features include the shield insulating transistor 19 whose polysilicon gate biased at 0 volts through polysilicon control line 111 so that no current is flowing in the channel of a given NMOSFET transistor 19 during the operation of the memory array 10E.

The way transistors 19 are incorporated into the array 10E of FIG. 25 can be described in reference to transistor 19-1A. Transistor 19-1A has a first source and a first drain formed between every other diffusion bit-line 12 along a horizontal direction that is marked A—A' in FIG. 25, the given transistor 19-1A also has a second source and a second drain formed along a vertical direction that is marked B—B' in FIG. 25. Transistor 19-1A has its first source connected to diffusion bit-line BL2N and its first drain connected to BL1N, also transistor 19-1A has its second source connected to embedded-bit-line diffusion [n−1]21 and its second drain connected to embedded-bit-line diffusion [n]21. In the same manner transistor 19-3A has its first source connected to diffusion bit-line BL3N and its first drain connected to BL4N, also transistor 19-3A has its second source connected to embedded-bit-line diffusion [n−1]43 and its second drain connected to embedded-bit-line diffusion [n]43. Transistor 19-1B has its first source connected to diffusion bit-line BL2N and its first drain connected to BL1N, also transistor 19-1B has its second source connected to embedded-bit-line diffusion [n]21 and its second drain connected to embedded-bit-line diffusion [n+1]21. In the same manner transistor 19-3B has its first source connected to diffusion bit-line BL3N and its first drain connected to BL4N, also transistor 19-3B has its second source connected to embedded-bit-line diffusion [n]43 and its second drain connected to embedded-bit-line diffusion [n+1]43. In this way the physical distance between BL1N and BL2N is reduced as compared to prior art memory arrays in which the transistor 19 is not incorporated and embedded-bit-lines [n−1]21 and [n]21 are connected by a continuous diffusion line which must be isolated form BL1N and BL2N by an oxide isolation region or by two separate transistors as disclosed in the above referenced U.S. Pat. No. 5,278,785. Metal to N+ diffusion contacts 108 are self-aligned to the polysilicon of gate 19 and control line 111, which further reduces the size of the memory array.

The array 10E of FIG. 25 also includes select lines ZSL(n) and PSL(n) that enable selective electrical access from the continuous diffusion bit lines BLiN to the embedded-bit-lines [n]21, [n]32 or [n]43, so that a selected memory cell (numbered 1 to 6) that includes a floating gate 30 can be programmed and the data can be read out to a sense amplifier. The number designation (n) is the number of the segment of the array that includes at least one row of memory cells with its associated word line 14. Each array segment includes plurality of embedded-bit-lines which are positioned between the continuous bit lines BLiN and carry the respective numeral [n]. The number of word lines 14 within a segment (n) can be odd or even. The adjacent array segments which are continuous with and are in contact with array segment (n) are numbered (n−1) on the upper side of the segment (n), and are numbered (n+1) on the lower side of the segment (n). The upper and lower sides are direction used herein to simplify the explanation and will mean the top of the page and the bottom of the page of FIG. 25 respectively as viewed from the reader's point of observation. In other words if an xy coordinate system is placed on the sheet of paper that includes FIG. 25 so that the origin x=0, y=0, is placed within the segment (n) and so that the x axis is parallel to a word line 14 and the positive direction extends to the right side of the page, than the positive y direction will be the upper side and the negative y direction will be the lower side of the array 10E of FIG. 25.

The segment (n) has a first select line PSH(n) connected to the gate of the NMOSFET transistors 20Hp along the upper side of the segment and a second select line PSL(n) connected to the gate of NMOSFET transistors 20Lp along the lower side of the segment. The threshold voltage of transistors 20Lp is 0.7 volts. The segment (n) also has a first select line ZSH(n) connected to the gate of NMOSFET transistors 20Hz along the upper side of the segment and a second select line ZSL(n) connected to the gate of NMOSFET transistors 20Lz along the lower side of the segment. Isolation regions 41T are formed of 7000 angstroms thick silicon oxide so that during the program, erase or read operations of the memory chip there is no current conduction between the diffusion bit lines in the area of the substrate that is disposed under this region 41T. The never conducting region 41T may also be a part of a MOS transistor with a very high threshold voltage of 14 volts. This threshold voltage is achieved by implanting high dose of boron implant into the channel of transistor 41TH (shown in FIG. 27) before the deposition of polysilicon 33 that forms segment select lines PSL, ZSL, PSH and ZSH. The upper memory array segment (n−1) includes a coresponding select lines PSH(n−1), PSL(n−1), ZSH(n−1), and ZSL(n−1). The lower memory array segment (n+1) includes a corresponding select lines PSH(n+1), PSL(n+1), ZSH(n+1), and ZSL (n+1).

Each segment (n) typically include more than 64 rows of memory cells and any number of columns of the same memory cells. This large number of rows causes increase in the total sheet resistance from one end to the other end of the embedded-bit-line [n]21 diffusion. Therefore the use of two selected lines that are activated simultaneously to select a given segment, for example PSH(n) and PSL(n) for segment (n) are connected to opposite ends of the embedded-bit-line [n], enables electrical connection from a BLiN on both sides of the embedded-bit-line [n] which reduces the maximum sheet resistance in series with a selected memory cell along the embedded-bit-line [n] by a factor of four in comparison to an array segment (n) that includes a select line PSL(n) only on its upper side or only on its lower side.

In FIG. 25 a group of memory cells whose drain is connected to a continuous bit line diffusion BLiN form a page PGBLiN. For example, the column of memory cells that includes memory cell 2 may number 4096 cells and the column of memory cells that includes memory cell 3 may also number 4096 cells, so that together the two columns form a page PGBL2N of 8192 memory cells. The column of memory cells that includes memory cell 4 may number 4096 cells and the column of memory cells and the column of memory cells that includes memory cell 5 may also number 4096 cells, so that together the two columns form a page PGBL3N of 8192 memory cells. Two pages PGBLiN form a memory block BKBLpq. For example page PGBL2N and page PGBL3N form block BKBL23 that include 16384 memory cells. The array 10E of FIG. 25 includes at least two blocks BKBLpq.

Figure 28A:
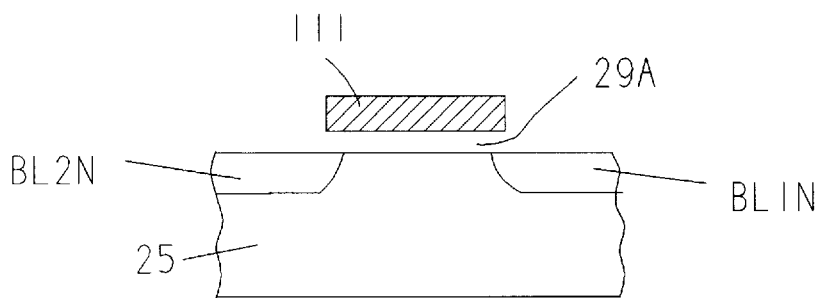
FIG. 28A is a section cut along line A—A' of FIG. 25.
Figure 28B:
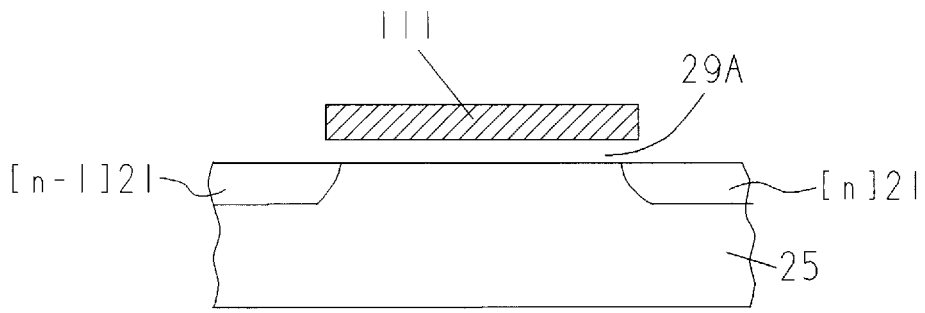
FIG. 28B is a section cut along line B—B' of FIG. 25.
Figure 28C:
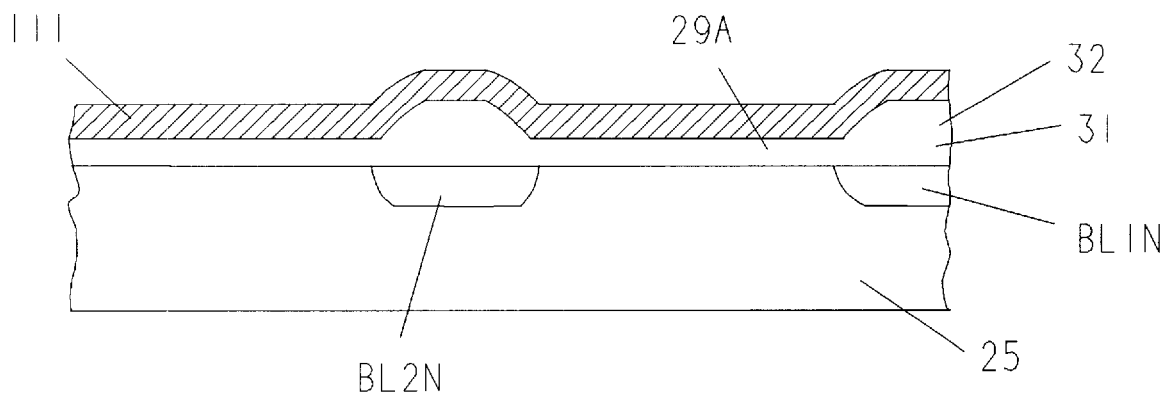
FIG. 28C is a section cut along line C—C' of FIG. 25.
Figure 28D:
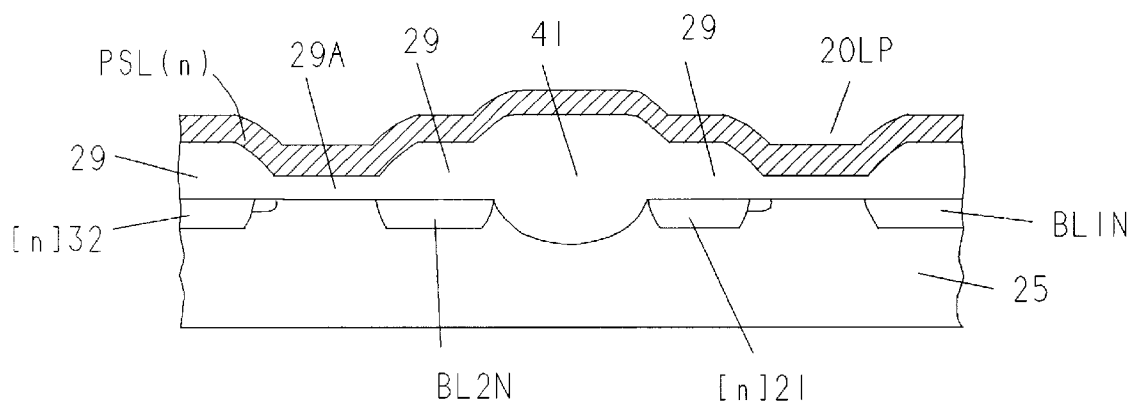
FIG. 28D is a section cut along line D—D' of FIG. 25.
Figure 29A:
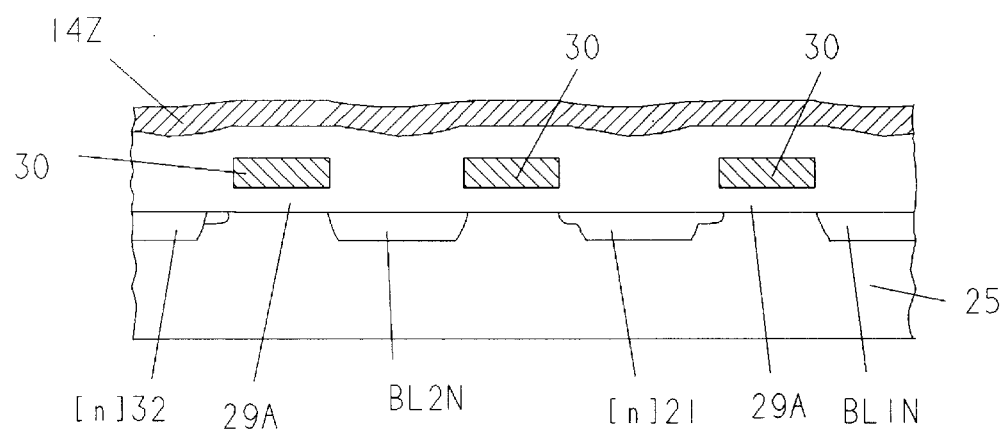
FIGS. 29A and 29B are cross sections along lines E and F of FIG. 25 (which omit the details of the gate oxide layers, the floating gate to drain overlap or the sandwich of thermal oxide layer and deposited oxide layer over the bit line diffusions regions).
Figure 29B:
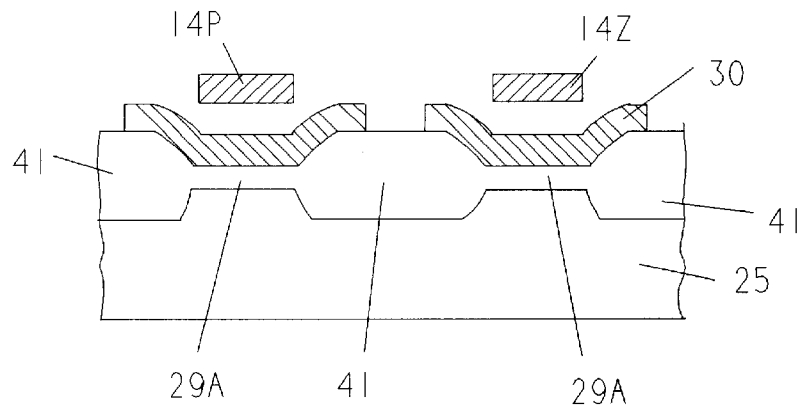

FIG. 28A is a section cut along line A—A' of FIG. 25. FIG. 28B is a section cut along line B—B' of FIG. 25. FIG. 28C is a section cut along line C—C' of FIG. 25. FIG. 28D is a section cut along line D—D' of FIG. 25. The thickness of gate oxide 29A of the isolation transistor 19-iA of this eighth embodiment under polysilicon 111 is 100 angstroms. FIGS. 29A and 29B are simplified cross sections along lines E and F of FIG. 25, which do not show the details of the gate oxide layers, the floating gate to drain overlap or the sandwich of thermal oxide layer and deposited oxide layer over the bit line diffusions regions. These details are shown in FIG. 26.

The operation of the array 10E of FIG. 25 will now be described in reference to Table (7).

TABLE 7

|  | BL2N | BL3N | WL1 | PSHn and PSLn | ZSHn and ZSLn |
|---|---|---|---|---|---|
| Read Cell 4 | GND | 2v | Vcc | Vcc | GND |
| Read Cell 3 | 2v | GND | Vcc | GND | Vcc |
| Program Cell 4 | GND | 7v | Vpp | Vpp | GND |
| Program Cell 3 | 7v | GND | Vpp | GND | Vpp |
| Erase Page PGBL2N | Vpp | GND | GND | GND | GND |
| Erase Page PGBL3N | GND | Vpp | GND | GND | GND |
| Erase Block BKBL23 | Vpp | Vpp | GND | GND | GND |
| Flash Erase Of All The Memory | Vpp | Vpp | GND | GND | GND |

In Table (7), the notation GND is ground voltage of 0 volts, Vcc is 3 volts, Vpp is 12 volts, 2v is 2 volts, 7v is 7 volts which may be generated by an on chip voltage reference circuit, as is known by those skilled in the art. It is to be understood that the memory operation described in a given line of Table (7) is performed during a time period that does not coincide with the time period in which another memory operation that is described in another line is performed.

The erase operation of a cell of array 10E of FIG. 25 brings the threshold voltage to be about 0.8 volts.

To read a selected memory cell, for example cell 4 along word line WL1 of segment (n), the select lines PSHn and PSLn are biased at Vcc voltage of 3 volts, select lines ZSHn and ZSLn are biased at Vss or GND voltage of 0 volts and the selected read word line WL1 is biased at 3 volts. This voltage biasing can be accomplished by the use of row address decoders that have their outputs connected to the word lines and to the select lines. The bit-line BL3N is biased at 2 volts and bit-line BL2N is biased at 0 volts. This can be accomplished by the use of a column decoder and column pull-up transistor. All other word lines of the array 10E are biased at 0 volts by the row decoder circuits. The bit-line BL3N is decoded by a column decoder and is coupled to the input of a sense amplifier that senses the state of the memory cell 4 of this example. If cell 4 is programmed to have a non-conductive MOSFET channel, then the sense amplifier will sense the 2 volts corresponding to a first logical state. However if memory cell 4 is erased or is programmed to conduct current representing a second logical state, current will flow from BL3N through the channel of transistor 4 to bit line [n]32, through transistors 20Hp and 20Lp to bit-line BL2N and to VSS, thereby pulling the voltage of bit-line BL3N below 2 volts. When the voltage of BL3N is reduced to about 1 volt the sense amplifier senses a second logical state stored in the memory cell 4.

To read memory cell 3 also along word line WL1 of segment (n), the select lines PSHn and PSLn are biased at GND voltage of 0 volts, select lines ZSHn and ZSLn are biased at Vcc voltage of 3 volts and the read word line WL1 is biased at Vcc voltage of 3 volts. This voltage biasing can be accomplished by the use of row address decoders that have their outputs connected to the word lines and to the select lines. The bit-line BL2N is biased at 2 volts and bit-line BL3N is biased at 0 volts. This can be accomplished by the use of a column decoder and column pull-up transistor. All other word lines of the array 10E are biased at 0 volts by the row decoder circuits. The bit-line BL2N is decoded by a column decoder and is coupled to the input of a sense amplifier that senses the state of the memory cell 3 of this example. If cell 3 is programmed to have a non-conductive MOSFET channel, then the sense amplifier will sense the 2 volts corresponding to a first logical state. However if memory cell 3 is erased or is programmed to conduct current representing a second logical state, current will flow from BL2N through the channel of transistor 3 to bit line [n]32, through transistors 20Hz and 20Lz to bit-line BL3N and to VSS, thereby pulling the voltage of bit-line BL2N below 2 volts. When the voltage of BL2N is reduced to about 1 volt the sense amplifier senses a second logical state stored in the memory cell 3.

The programming operation of a memory cell of the array 10E of FIG. 25 will now be described. Before actual physical programming of the a memory cell occurs the memory cells are erased to have a threshold voltage of 0.8 volts using the erase mode procedure that is detailed below after the explanation of the programming operation. To program a selected memory cell, for example cell 4 along word line WL1 of segment (n), the selected word line WL1 and the select lines PSHn and PSLn are biased at Vpp voltage of 12 volts, select lines ZSHn and ZSLn are biased at Vss or GND voltage of 0 volts. This voltage biasing can be accomplished by the use of row address decoders that have their outputs connected to the word lines and to the select lines. The bit-line BL3N is biased at 7 volts and bit-line BL2N is biased at 0 volts. This can be accomplished by the use of a column decoder and column pull-up transistor. All other word lines of the array 10E are biased at 0 volts by the row decoder circuits.

Viewing FIG. 25 and FIG. 26, Memory cell 4 programs from a state of a conductive channel to a state of a non-conductive MOSFET channel within 10 microseconds of the application of this bias of voltages. The voltage bias conditions create a strong current of electrons in the channel of which some hot electrons accelerate upward from the channel 34 of the substrate 25 and towards the floating gate 30 due to a strong electric field in the direction of the control gate 33 which is connected to the word line 14p. The hot electrons that reach the conductive floating gate 30 remain trapped within it until an erase operation remove them. When sufficient number of hot electrons transfer to the floating gate 30 from the channel 34 of the transistor due to programming, the threshold voltage of the transistor increases to about 6 volts from the original threshold voltage of 0.8 volts. Because the 6 volts threshold voltage of a programmed memory transistor is higher than the 3 volts that are applied to the word line 14p during read mode operation, the channel of the programmed memory transistor 4 will not conduct current.

During programming of cell 4 it is important that neighboring memory cell transistors 3 and 5 (FIG. 25) that are connected to the same word line WL1 are not programmed accidentally. Accidental programming of cell 3 is avoided because select transistor 20Hp whose only control gate is connected to select line PSHn, shorts bit line [n]32 to bit-line BL2N so that the drain voltage of memory transistor 3 is almost of the same value of its source voltage and consequently almost no current flows through the channel of transistor 3 and so no hot electron programming occurs. Accidental programming of cell 5 is avoided because another select transistor 20Hp whose only control gate is connected to select line PSHn, shorts bit line [n]43 to bit-line BL3N so that the drain voltage of memory transistor 5 is almost of the same value of its source voltage and consequently almost no current flows through the channel of transistor 5 and so no hot electron programming occurs.

Accidental programming of cell 6 is avoided because of the asymmetry in the drain and source of all of the memory transistors. Memory transistor 6 has its drain connected to bit line [n]43 and its source connected to bit-line BL4N and so when 7 volts are applied to bit line BL3N, the voltage of bit line [n]43 rises only to 5 volts if memory transistor 6 is not programmed yet and so it conducts current from its source at bit line [n]43 to its drain at bit line BL4N. The bit line BL4M is pulled to 5 volts because the source of memory transistor 6 is pulled only to 5 volts due to the strong back bias effect which increases the threshold voltage of this NMOS memory FET transistor when its source to substrate voltage increases. The 5 volts of BL4M or BL4N is not sufficient to cause parasitic programming of memory cell 7 whose drain is connected to bit line BL4N and whose source is at floating at a voltage that is higher than 0 volts. The memory transistor of this eighth embodiment does not program when its source voltage is higher than its drain voltage because the shallower source diffusion region 88c (FIG. 26) does not create favorable depletion region in the channel 34 for generating hot electrons for programming under the bias voltages that are as described in reference to the transistor of memory cell (also referred to below as "memory transistor") 6.

Viewing FIG. 25, the parasitic programming of memory cell 7 can be further avoided by the use of circuits that are connected to the metal bit lines at the edge of the array. One such circuit will now be detailed. Memory transistor 6 has its drain connected to bit line [n]43 and its source connected to bit-line BL4N and so when 7 volts are applied to bit line BL3N, the voltage of bit line [n]43 rises only to 3.5 volts if memory transistor 6 is not programmed yet and so it conducts current from its source at bit line [n]43 to its drain at bit line BL4N. The bit line BL4M is clamped at 3.5 volts because of a pull-down PMOSFET that is configured during programming to be connected as a diode between BL4M and GND voltage of 0 volts. During programming operation this pull-down PMOSFET has its gate connected to 0 volts of the Vss rail of the chip, its source is connected to BL4M and its drain is connected to Vss rail voltage of 0 volts. This pull-down PMOSFET transistor has a long electrical channel length and a minimum channel width so when the voltage of the bit line BL4M is increased the current of this pull-down transistor increases significantly and so the voltage on [n]43 of about 7 volts is divided between transistor 6 and the pull-down PMOSFET. This voltage division ensures the BL4M is clamped at about 3.5 volts. During read operations the source and drain of this pull-down transistor are connected to the 2 volts reference voltage of the column pull-up NMOSFET transistor and therefore the pull-down PMOSFET does not conduct any current. The 3.5 volts of BL4M or BL4N is not sufficient to cause parasitic programming of memory cell 7 whose drain is connected to bit line BL4N.

The erase operation of already programmed memory cells of the array 10E of FIG. 25 will now be described in reference to Table (7). To erase a selected page of memory cells, for example page PGBL2N, the select lines PSHn and PSLn are biased at GND voltage of 0 volts, select lines ZSHn and ZSLn are biased at Vss or GND voltage of 0 volts. The word lines of all the array segments are biased at 0 volts. This voltage biasing can be accomplished by the use of row address decoders that have their outputs connected to the word lines and to the select lines. The bit-line BL3N is biased at 0 volts and bit-line BL2N is biased at Vpp voltage of 12 volts. This can be accomplished by the use of a column decoder and column pull-up transistor. Under these voltage bias conditions the programmed floating gate 30 that overlap the diffusion of bit line BL2N will emit electrons to the drain diffusion 28 through the overlap area 29AD of the 100 angstroms thick gate oxide 29A shown in FIG. 26, thereby lowering the threshold voltage from 6 volts to a voltage that is below 0.8 volts. During the erasure of a selected page of this eighth embodiment the memory cells that are within adjacent pages are not erased, therefore when erasing page PGBL2N that includes cells 2 and 3 of bit line BL2N, bit lines BL1N, BL3N and BL4N are biased at 0 volts and memory cells 1, 4, 5, 6 and 7 are not erased. When erasing page PGBL3N that includes cells 4 and 5 of bit line BL3N, bit lines BL1N, BL2N and BL4N are biased at 0 volts and memory cells 1, 2, 3, 6 and 7 are not erased.

In order to erase a selected block of memory cells the two bit lines of the selected block are biased at Vpp of 12 volts, the bit lines of the non-selected blocks are biased at 0 volts. The word lines and segment select lines are biased at 0 volts as in the case of page erase. For example, in order to erase block BKBL23, bit lines BL2N and BL3N are biased at Vpp voltage of 12 volts and the other continuous bit lines are biased at 0 volts. It is to be noted that several adjacent and not adjacent blocks may be erased at the same time without erasing the entire memory array. It is also possible to erase the entire memory array simultaneously. When all the blocks of the memory array are erased simultaneously the mode of operation is called Flash erase.

The array of FIG. 25 can be modified for operation as a mask programmable read only memory (ROM) by avoiding the formation of the floating gates in the data storage memory cells and substituting the channel implant to an implant level that can represent a logical "0" or to an implant level that represents a logical "1". A dedicated photolithography mask is typically used for simultaneous programming the predetermined implant level in the different memory cells in the semiconductor fabrication factory. For the manufacturing of a mask-ROM only the read operation described above is applicable.

The ninth embodiment of the present invention will now be described in reference to FIG. 30, which is a top view of a portion of a memory array matrix 10H, FIGS. 31a–g which are cross section cut along lines of FIG. 30 and in reference to FIG. 32 which is an electrical schematic of the array of FIG. 30. The fabrication process steps that are used to form the memory cells of array 10H of this ninth embodiment are the same process steps that were used to form the elongated first polysilicon strips 30 of the fifth embodiment, with one restriction. Only portion on the definition of isolation regions 41 which are formed only in portions of the isolation regions 41 of FIG. 16b that are to be disposed under the polysilicon strips 30. Other process steps associated with the formation of the word-line 15 are not implemented so that word-lines 15 of FIG. 19 are not formed and so the steering regions 30S of the floating gates 30 are not needed and the geometrical length of the floating gate 30, as measured along the bit-line axis, is shorter to allow a more physical memory cells per unit area of the memory chip. A memory cell of this ninth embodiment retains the feature of asymmetry in programming and physical construction of its drain and source and of the fact that the cell has stronger drain to source current than source to drain current.

Figure 30:
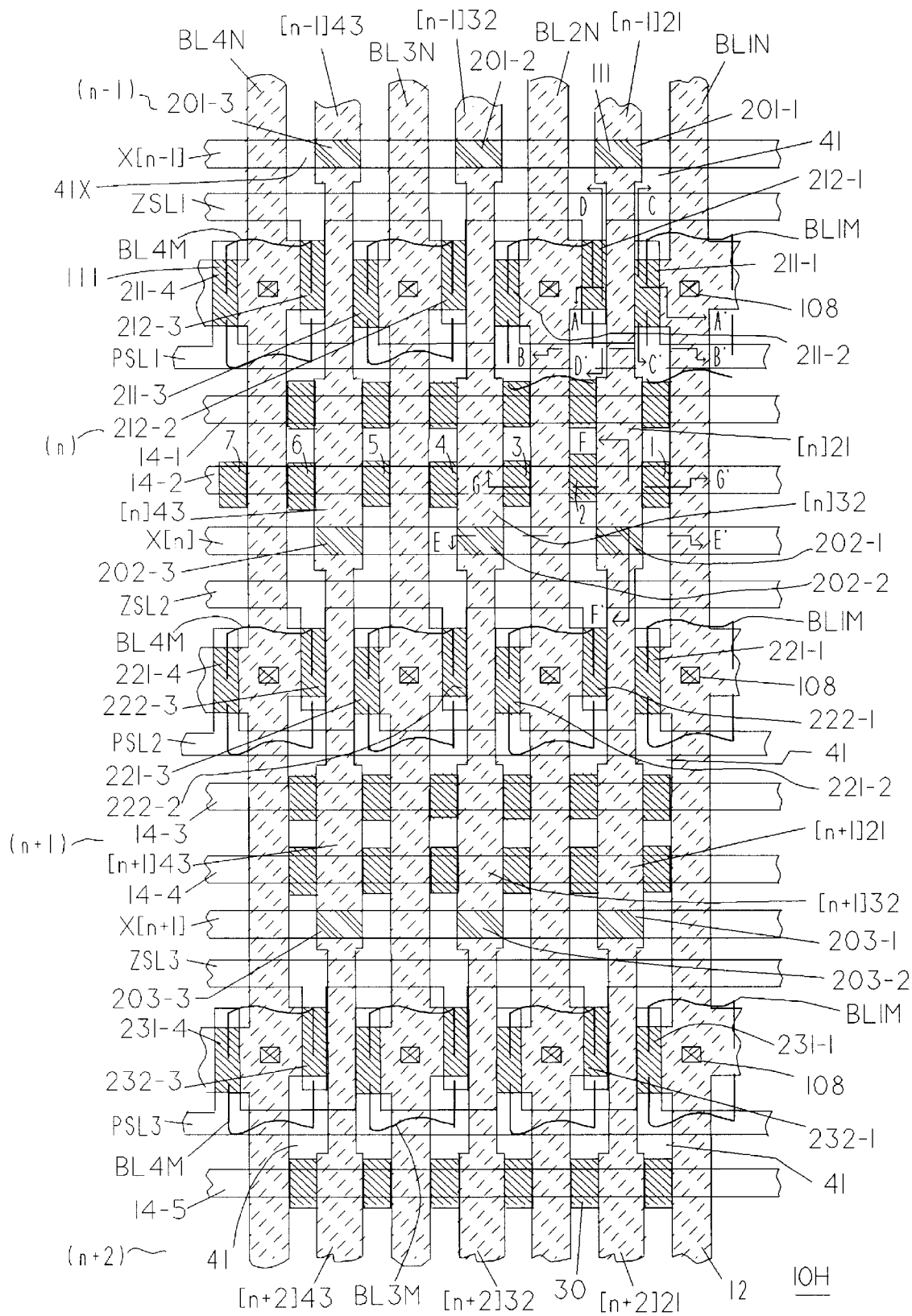
FIG. 30 is a plan view of memory array 10H according to the ninth embodiment of the present invention with fewer select lines per memory cell array segment for the selection of an embedded bit-line diffusion. The memory array includes memory cells that have only one read word line in a row and in which the end cap of the floating gate is short and is not disposed under other conductive layer that is adjacent to the read word line.

The individual memory cell of the ninth embodiment is shown in FIG. 26, which is a section cut along line x—x' of FIG. 30. Continuous diffusion source regions are formed, for example [n]21, to be in parallel to the regions 28 of FIG. 26, which is also marked as numeral 12 or BL1N, BL2N, BL3N or BL4N in FIG. 30 (these access bit-lines will be referred to collectively as a group as BLiN in the explanation below). The continuous segmented source diffusion bit-line regions of this ninth embodiment (FIG. 30) that are formed, and are indicated as [n]21 or [n]32 or [n]43 (these bit-lines will be refereed to collectively as a group as [n]jk in the explanation below). Once the access bit-line regions BLiN and bit-line regions [n]jk are formed, the elongated continuous polysilicon strips 30 are etched to form the isolated floating gates 30 of FIG. 30, so that an additional floating gate 30 is formed in essentially the same wafer surface area of the memory cell of FIG. 17 of the fifth embodiment. The additional floating gate 30 is defined as a part of another memory cell so that the array of this ninth embodiment contains about two physical memory cells in the same substrate area that contained only one memory cell of the fifth embodiment. Of course each of the physical memory cells of all the embodiments disclosed in this application can be used to store one digital binary bit or plurality of digital bits or analog charges as was disclosed for example in the above referenced U.S. Pat. No. 5,278,785.

In FIG. 30 there are several other features that contribute to the increase in the packing density of the number of memory cells per unit area of a memory chip that uses the array architecture of array 10H, which result in reduced manufacturing cost of the memory chip. These features include the polysilicon select line X[n−1] which is connected to segment border MOSFETs 201-i, select line X[n] which is connected to MOSFETs 202-i and select line X[n+1] which is connected to MOSFETs 203-i. Other features that contribute to the reduction of the size of the array 10H are the polysilicon select line ZSL1 which is connected to MOSFETs 212-i and its neighbor the select line PSL1 which is connected to MOSFETs 211-i, polysilicon select line ZSL2 which is connected to MOSFETs 222-i and its neighbor the select line PSL2 which is connected to MOSFETs 221-i, and polysilicon select line ZSL3 which is connected to MOSFETs 232-i and its neighbor the select line PSL3 which is connected to MOSFETs 231-i. The above mentioned select lines of array 10H are insulatively disposed on the substrate 25 and are defined to run along an axis that is parallel to the read word lines 14 and generally to run in perpendicular to the bit line axis.

The way transistors 211-i are incorporated into the array 10H of FIG. 30 can be described in reference to transistor 211-1. Transistor 211-1 has its source connected to diffusion of embedded bit-line [n]21, its drain connected to diffusion of bit line BL1N and its gate to select line PSL1. Transistor 211-2 has its source connected to diffusion of embedded bit-line [n]32, its drain connected to diffusion of bit line BL2N and its gate to select line PSL1. Transistor 211-3 has its source connected to diffusion of embedded bit-line [n]43, its drain connected to diffusion of bit line BL3N and its gate to select line PSL1. The way transistors 212-i are incorporated into the array 10H of FIG. 30 can be described in reference to transistor 212-1. Transistor 212-1 has its source connected to diffusion of embedded bit-line [n]21, its drain connected to diffusion of access bit line BL2N and its gate to select line ZSL1. Transistor 212-2 has its source connected to diffusion of embedded bit-line [n]32, its drain connected to diffusion of bit line BL3N and its gate to select line ZSL1. Transistor 212-3 has its source connected to diffusion of embedded bit-line [n]43, its drain connected to diffusion of bit line BL4N and its gate to select line ZSL1.

The way transistors 221-i are incorporated into the array 10H of FIG. 30 can be described in reference to transistor 221-1. Transistor 221-1 has its source connected to diffusion of embedded bit-line [n+1]21, its drain connected to diffusion of bit line BL1N and its gate to select line PSL2. Transistor 221-2 has its source connected to diffusion of embedded bit-line [n+1]32, its drain connected to diffusion of bit line BL2N and its gate to select line PSL2. Transistor 221-3 has its source connected to diffusion of embedded bit-line [n+1]43, its drain connected to diffusion of bit line BL3N and its gate to select line PSL2. The way transistors 222-i are incorporated into the array 10H of FIG. 30 can be described in reference to transistor 222-1. Transistor 222-1 has its source connected to diffusion of embedded bit-line [n+1]21, its drain connected to diffusion of bit line BL2N and its gate to select line ZSL2. Transistor 222-2 has its source connected to diffusion of embedded bit-line [n+1]32, its drain connected to diffusion of bit line BL3N and its gate to select line ZSL2. Transistor 222-3 has its source connected to diffusion of embedded bit-line [n+1]43, its drain connected to diffusion of bit line BL4N and its gate to select line ZSL2.

The way transistors 231-i are incorporated into the array 10H of FIG. 30 can be described in reference to transistor 231-1. Transistor 231-1 has its source connected to diffusion of embedded bit-line [n+2]21, its drain connected to diffusion of bit line BL1N and its gate to select line PSL3. Transistor 231-2 has its source connected to diffusion of embedded bit-line [n+2]32, its drain connected to diffusion of bit line BL2N and its gate to select line PSL3. Transistor 231-3 has its source connected to diffusion of embedded bit-line [n+2]43, its drain connected to diffusion of bit line BL3N and its gate to select line PSL3. The way transistors 232-i are incorporated into the array 10H of FIG. 30 can be described in reference to transistor 232-1. Transistor 232-1 has its source connected to diffusion of embedded bit-line [n+2]21, its drain connected to diffusion of bit line BL2N and its gate to select line ZSL3. Transistor 232-2 has its source connected to diffusion of embedded bit-line [n+2]32, its drain connected to diffusion of bit line BL3N and its gate to select line ZSL3. Transistor 232-3 has its source connected to diffusion of embedded bit-line [n+2]43, its drain connected to diffusion of bit line BL4N and its gate to select line ZSL3.

The way segment border transistors 201-i are incorporated into the array 10H of FIG. 30 can be described in reference to transistor 201-1. Transistor 201-1 has its source connected to diffusion of embedded bit-line [n−1]21, its drain connected to diffusion of embedded bit line [n]21 and its gate to select line X[n−1]. Transistor 201-2 has its source connected to diffusion of embedded bit-line [n−1]32, its drain connected to diffusion of embedded bit line [n]32 and its gate to select line X[n−1]. Transistor 201-3 has its source connected to diffusion of embedded bit-line [n−1]43, its drain connected to diffusion of embedded bit line [n]43 and its gate to select line X[n−1]. The way transistors 202-i are incorporated into the array 10H of FIG. 30 can be described in reference to transistor 202-1. Transistor 202-1 has its source connected to diffusion of embedded bit-line [n]21, its drain connected to diffusion of embedded bit line [n+1]21 and its gate to select line X[n]. Transistor 202-2 has its source connected to diffusion of embedded bit-line [n]32, its drain connected to diffusion of embedded bit line [n+1]32 and its gate to select line X[n]. Transistor 202-3 has its source connected to diffusion of embedded bit-line [n]43, its drain connected to diffusion of embedded bit line [n+1]43 and its gate to select line X[n]. The way transistors 203-i are incorporated into the array 10H of FIG. 30 can be described in reference to transistor 203-1. Transistor 203-1 has its source connected to diffusion of embedded bit-line segment [n+1]21, its drain connected to diffusion of embedded bit line segment [n+2]21 and its gate to select line X[n+1]. Transistor 203-2 has its source connected to diffusion of embedded bit-line [n+1]32, its drain connected to diffusion of embedded bit line [n+2]32 and its gate to select line X[n+1]. Transistor 203-3 has its source connected to diffusion of embedded bit-line [n+1]43, its drain connected to diffusion of embedded bit line segment [n+2]43 and its gate to select line X[n+1].

The gates of selecting MOSFETs 211-i, 212-i, 221-i, 222-i, 231-i and 232-i are formed simultaneously with floating gates 30 using the same process that is used to form the floating gates 30 of sub-lithographic dimensions, thereby reducing the space between diffusion bit lines as compared with the wider oxide isolation or as compared with a polysilicon gate that is defined by a conventional photo-lithographic equipment. The select lined ZSLi and PSLi are formed from the same polysilicon 33 of the word lines 14 in a manner that enables a physical contact between select lines ZSLi and PSLi and the corresponding select gates of MOS-FETs 211-i, 212-i, 221-i, 222-i, 231-i and 232-i as was detailed above and as shown in FIG. 30. This is done by selectively removing (for example by etching) the interpoly dielectric layers 31, 50p and 32 from (see FIG. 26) select gates of MOSFETs 211-i, 212-i, 221-i, 222-i, 231-i and 232-i, but retaining these dielectric layers over the floating gates 30.

The threshold voltage of MOSFET transistors 201-i, 202-i, 203-i, 211-i, 212-i, 221-i, 222-i, 231-i and 232-i is 0.7 volts.

The select lines ZSLi and PSLi of array 10H of FIG. 30 enable selective electrical access from the continuous diffusion bit lines BLiN to the embedded-bit-line segments [n]21, [n]32 or [n]43, so that a selected memory cell (numbered 1 to 6) that includes a floating gate 30 can be programmed and the data can be read out to a sense amplifier. Each of the memory cells 1 to 6 is associated with its own column of memory cells that is oriented along an axis that is parallel to the axis of the access bit lines. The number designation (n) is the number of the segment of the array 10H that includes at least one row of memory cells with its associated word line 14, but preferably a segment should have at least 64 rows of which only two are shown in FIG. 30. Each array segment includes plurality of embedded-bit-line segments which are positioned between the continuous access bit lines BLiN and carry the respective numeral [n]. The number of word lines 14 within a segment (n) can be odd or even. An array segment (n) is defined on its upper side by select line X[n−1] and on its lower side by select line X[n] and includes one associated select line ZSLi and one associated select line PSLi, for example segment (n) include select line ZSL1 and select line PSL1. The adjacent array segments which are continuous with and are in contact with array segment (n) are numbered (n−1) on the upper side of the segment (n), and are numbered (n+1) on the lower side of the segment (n). The upper and lower sides are direction used herein to simplify the explanation and will mean the top of the page and the bottom of the page of FIG. 30 respectively as viewed from the reader's point of observation. In other words if an xy coordinate system is placed on the sheet of paper that includes FIG. 30 so that the origin x=0, y=0, is placed within the segment (n) and so that the x axis is parallel to a word line 14 and the positive direction extends to the right side of the page, than the positive y direction will be the upper side and the negative y direction will be the lower side of the array 10H of FIG. 30. Isolation regions 41X are formed of 7000 angstroms thick silicon oxide so that during the program, erase or read operations of the memory chip there is no current conduction between the diffusion bit lines in the area of the substrate that is disposed under this region 41X.

As stated above each segment (n) of this ninth embodiment typically include more than 64 rows of memory cells and any number of columns of the same memory cells. This large number of rows causes increase in the total sheet resistance from one end to the other end of the embedded-bit-line segment [n]21 diffusion which extends from transistor 201-1 to transistor 202-1. In order to lower the resistance of an embedded bit line the eighth embodiment used four select lines per array segment, whereby two selected lines are activated simultaneously to select a given array segment of the memory array of the eighth embodiment as shown in FIG. 25.

Figure 32:
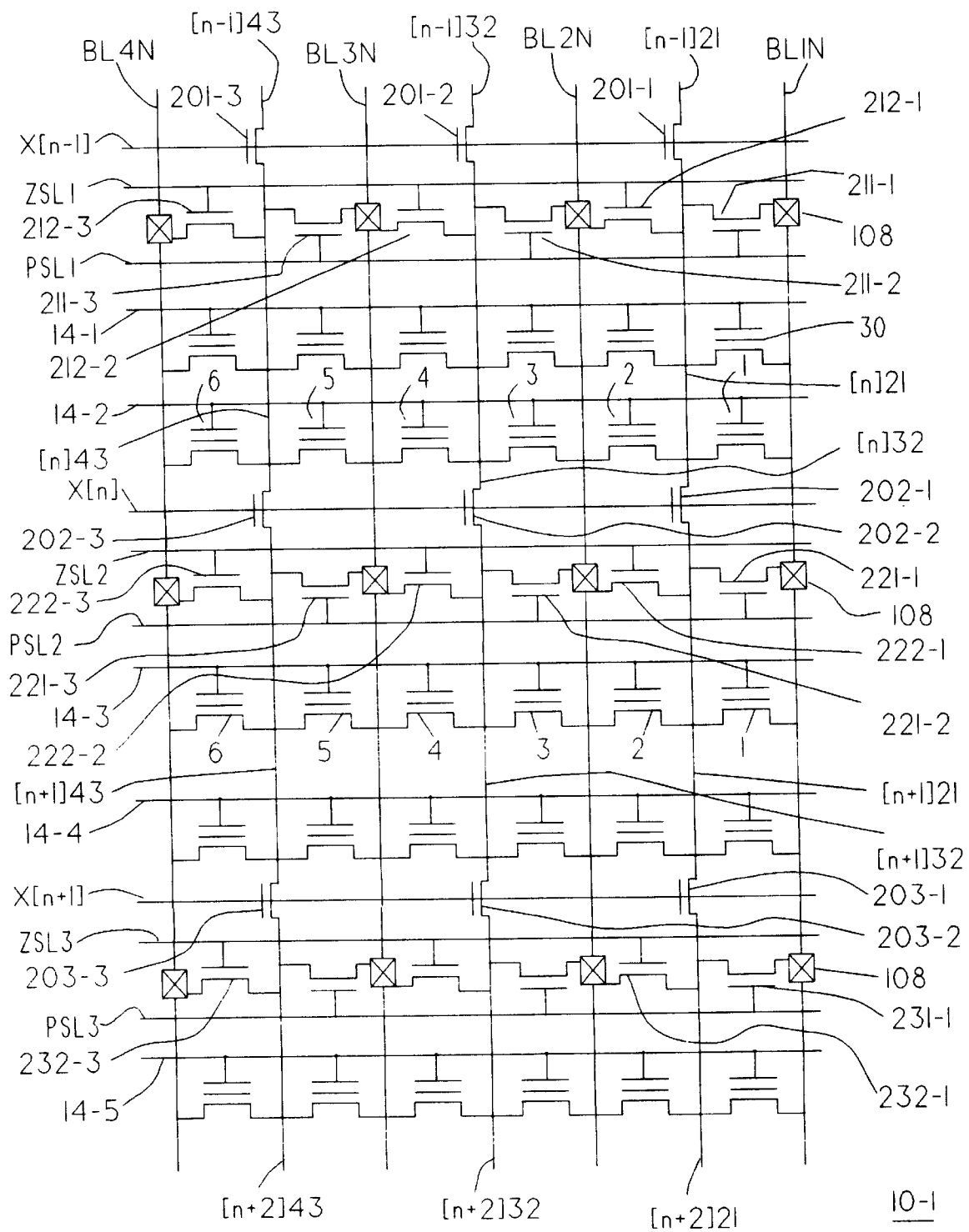
FIG. 32 is an electrical schematic of the array of FIG. 30.

As shown in FIGS. 30 and 32 the ninth embodiment uses only three select lines per array segment. This is advantageous because the savings of one select line per array segment translates into a significant reduction in array size and therefore increases the yield of good memory chips per wafer. For example a memory array that is organized as 8192 row by 8192 columns will form a memory array of 67,108, 864 physical cells also known as a 64 megabit memory array which may be divided into four sub arrays on the same die. In this 64 megabit array the use of 64 rows per array segment will result in 128 sub arrays. Because the ninth embodiment uses only three select lines per array segment instead of four select lines per array segment it results in the savings of chip area for 128 select lines. Because a select line takes an area that is approximately consumed by a word line, the savings of 128 select lines saves the space of 1,048,576 memory cells, which is the area of one megabit of memory cells array. This saving in memory chip area reduces the production cost of memory chips of this ninth embodiment while using wide metal bit lines BLiM that are less expensive to produce compare to the more expensive process that is required to form narrow metal bit lines that will fit into the sub-lithographic space that is created by the sub-lithographic size of the floating gates 30 and the diffusion bit lines 28.

The operation of the memory array 10H will be detailed further below.

In FIG. 30 of the ninth embodiment a group of memory cells whose drain is connected to a continuous bit line diffusion BLiN form a page PGBLiN. For example, the column of memory cells that includes memory cell 2 may number 4096 cells and the column of memory cells that includes memory cell 3 may also number 4096 cells, so that together the two columns form a page PGBL2N of 8192 memory cells. The column of memory cells that includes memory cell 4 may number 4096 cells and the column of memory cells that includes memory cell 5 may also number 4096 cells, so that together the two columns form a page PGBL3N of 8192 memory cells. Two pages PGBLiN form a memory block BKBLpq. For example page PGBL2N and page PGBL3N form block BKBL23 that include 16384 memory cells. The array 10H of FIG. 30 includes at least two blocks BKBLpq.

Figure 31A:
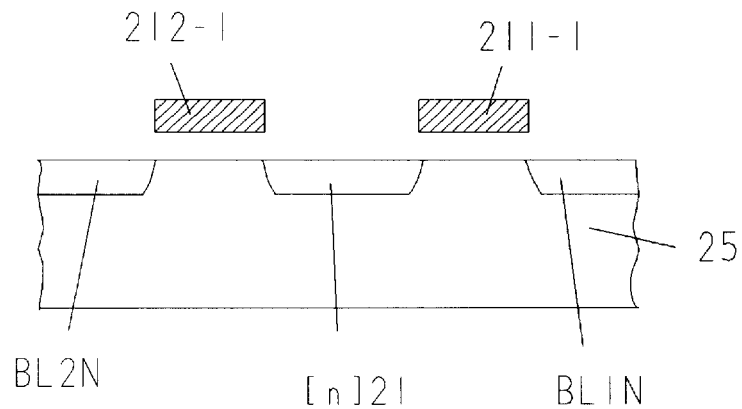
FIG. 31A is a section cut along line A—A' of FIG. 30.
Figure 31B:
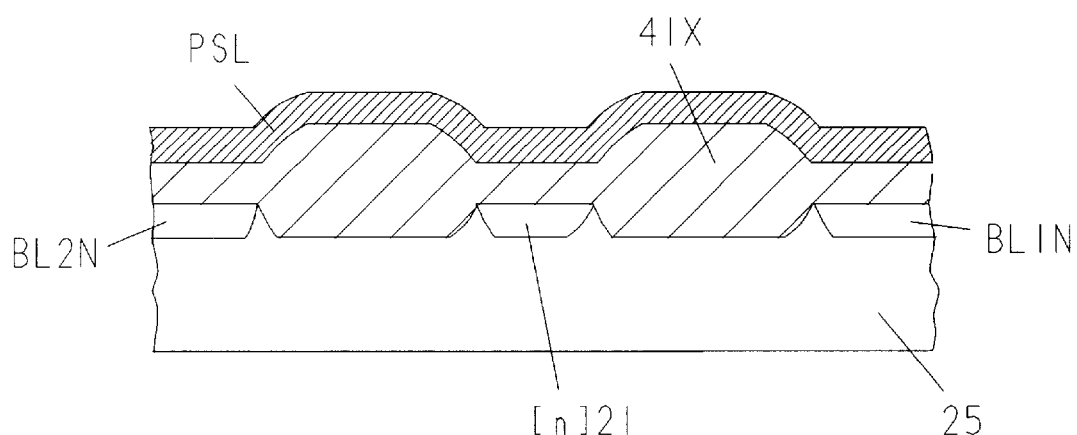
FIG. 31B is a section cut along line B—B' of FIG. 30.
Figure 31C:
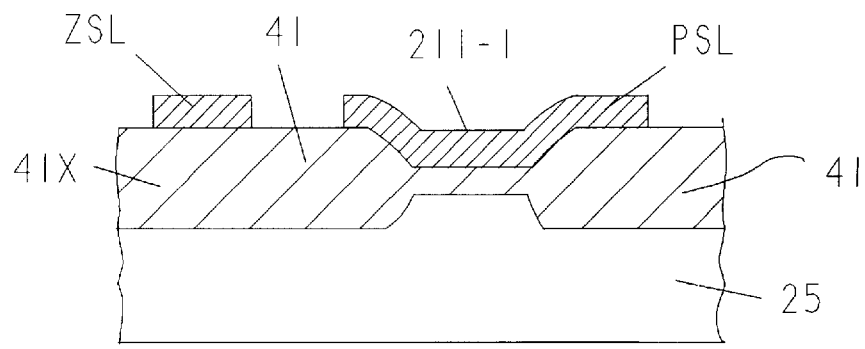
FIG. 31C is a section cut along line C—C' of FIG. 30.
Figure 31D:
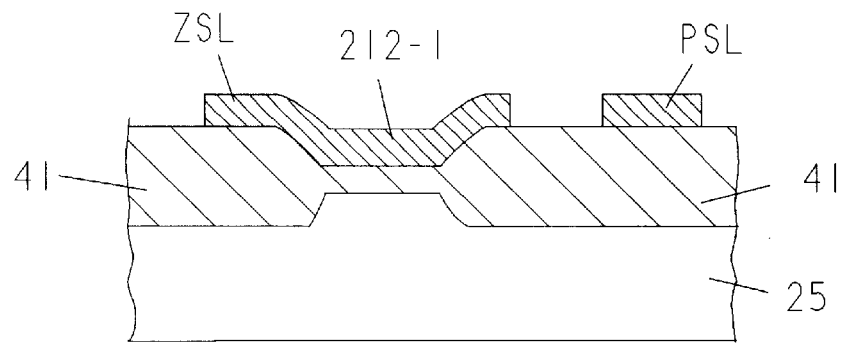
FIG. 31D is a section cut along line D—D' of FIG. 30.
Figure 31E:
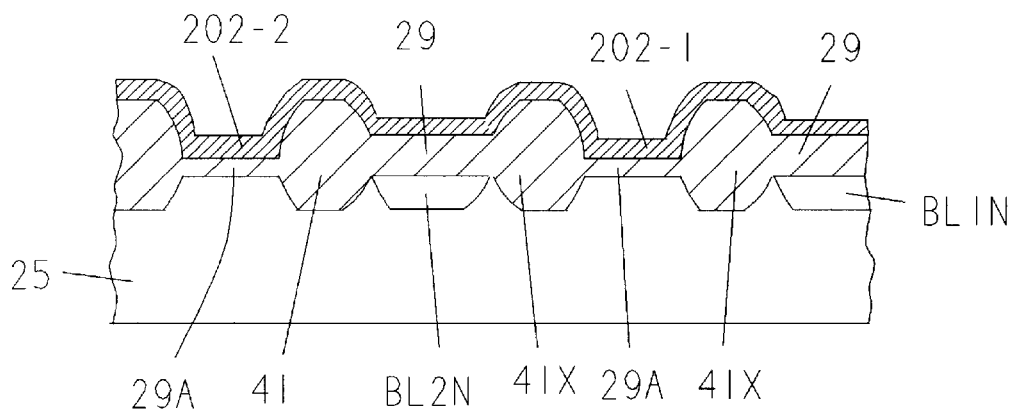
FIGS. 31E, 31F and 31G are simplified cross sections along lines E, F and G, respectively, of FIG. 30 (which omit the details of the gate oxide layers, the floating gate to drain overlap and the sandwich of thermal oxide and deposited oxide over the bit line diffusions regions).
Figure 31F:
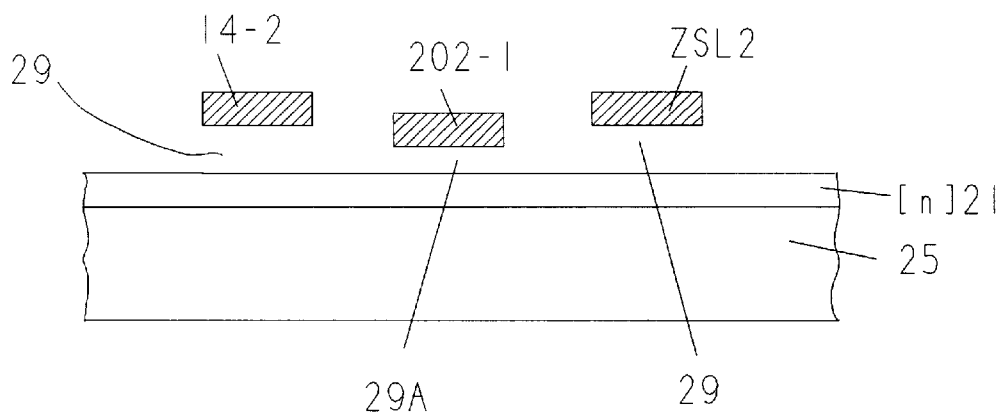
Figure 31G:
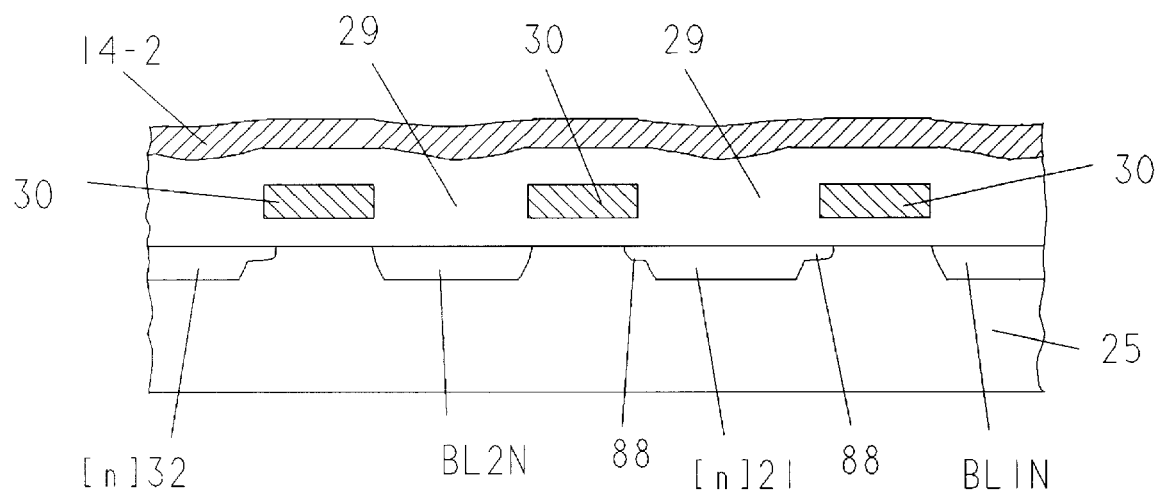

FIG. 31A is a section cut along line A—A' of FIG. 30. FIG. 31B is a section cut along line B—B' of FIG. 30. FIG. 31C is a section cut along line C—C' of FIG. 30. FIG. 31D is a section cut along line D—D' of FIG. 30. The thickness of gate oxide 29A of the select MOSFETs 201-i 202-i, 203-i, 211-i, 212-i, 221-i, 222-i, 231-i and 232-i of this ninth embodiment polysilicon 111 is 100 angstroms. FIGS. 31E, 31F and 31G are simplified cross sections along lines E, F and G of FIG. 30, which do not show the details of the gate oxide layers, the floating gate to drain overlap and do not show the sandwich of thermal oxide and deposited oxide over the bit line diffusions regions. These details are shown in FIG. 26.

The operation of the array 10H of FIG. 30 will now be described in reference to Table (8).

be understood that the memory operation described in a given line of Table (8) is performed during a time period that does not coincide with the time period in which another memory operation that is described in another line of Table (8) is performed. The erase operation of a memory cell of array 10H of FIG. 30 brings the threshold voltage to be about 0.8 volts.

To read a selected memory cell, for example cell 4 along word line WL14-2 of segment (n), the select lines X[n−1] and X[n+1] are biased at 0 volts in order to block current flow from segment (n) through MOSFET 201-2 to segment (n−1) and through MOSFET 203-2 to segment (n+2), thereby selectively isolating embedded bit line segment [n]32 from adjacent embedded bit line segment [n−1]32 and from embedded bit line segment [n+2]32, and so embedded bit line segment [n]32 is selectively isolatable electrically. Select line X[n] is biased at Vcc voltage of 3 volts to allow electrical access from the embedded bit line [n]32 to the select MOSFET 221-2 which turns "on" and to embedded bit line segment [n+1]32 thereby expanding the size of the selected bit line segment [n]32 to include bit line segment [n+1]32, and so embedded bit line segment [n]32 is selectively expandable electrically. The selected word line 14-2 and the select lines PSL1 and PSL2 are biased at Vcc voltage of 3 volts, select lines ZSL1 and ZSL2 are biased at Vss or GND voltage of 0 volts. This voltage biasing can be accomplished by the use of row address decoders that have their outputs connected to the word lines and to the select lines. The bit-line BL3N is biased at 2 volts and bit-line BL2N is biased at 0 volts. This can be accomplished by the use of a column decoder and column pull-up transistor. All other word lines of the array 10H are biased at 0 volts by the row decoder circuits. The bit-line BL3N is decoded by a column decoder and is coupled to the input of a sense amplifier that senses the state of the memory cell 4 of this example. If cell 4 is programmed to have a non-conductive MOSFET channel, then the sense amplifier will sense the 2 volts corresponding to a first logical state. However if memory cell 4 is erased or is programmed to conduct current representing a second logical state, current will flow from BL3N which functions as a current path, through the channel of MOSFET 4 to bit line [n]32 and from there the currents splits into two conductive paths that close the loop to ground. The first path is through select transistor 211-2 to bit line BL2N which functions as a current path, and to ground and the second path is through transistor 202-2, to embedded

TABLE 8

| | BL2N | BL3N | WL 14-2 | PSL1 and PSL2 | ZSL1 and ZSL2 | X [n − 1] and X [n + 1] | X [n] |
|---|---|---|---|---|---|---|---|
| Read Cell 4 | GND | 2v | Vcc | Vcc | GND | GND | Vcc |
| Read Cell 3 | 2v | GND | Vcc | GND | Vcc | GND | Vcc |
| Program Cell 4 | GND | 7v | Vpp | Vpp | GND | GND | Vpp |
| Program Cell 3 | 7v | GND | Vpp | GND | Vpp | GND | Vpp |
| Erase Page PGBL2N | Vpp | GND | GND | GND | GND | GND | GND |
| Erase Page PGBL3N | GND | Vpp | GND | GND | GND | GND | GND |
| Erase Block BKBL23 | Vpp | Vpp | GND | GND | GND | GND | GND |
| Flash Erase Of All The Memory | Vpp | Vpp | GND | GND | GND | GND | GND |

In Table (8), the notation GND is ground voltage of 0 volts, Vcc is 3 volts, Vpp is 12 volts, 2v is 2 volts which may be generated by an on chip voltage reference circuit, 7v is 7 volts which may be generated by an on chip voltage reference circuit, as is known by those skilled in the art. It is to bit line [n+1]32, through transistors 221-2 to bit-line BL2N and to ground voltage of 0 volts, thereby pulling the voltage of bit-line BL3N below 2 volts. When the voltage of BL3N is reduced to about 1 volt the sense amplifier senses a second logical state stored in the memory cell 4.

To read a selected memory cell, for example cell 3 along word line WL14-2 of segment (n), the select lines X[n−1] and [n+1] are biased at 0 volts in order to block current flow from segment (n) through MOSFETs 201-2 and 203-2. Select line X[n] is biased at Vcc voltage of 3 volts to allow access from the embedded bit line [n]32 to the select MOSFET 221-2. Select lines PSL1 and PSL2 are biased at GND voltage of 0 volts, select lines ZSL1 and ZSL2 and the word line 14-2 are biased at Vcc voltage of 3 volts. This voltage biasing can be accomplished by the use of row address decoders that have their outputs connected to the word lines and to the select lines. The bit-line BL2N is biased at 2 volts and bit-line BL3N is biased at 0 volts. This can be accomplished by the use of a column decoder and column pull-up transistor. All other word lines of the array 10H are biased at 0 volts by the row decoder circuits. The bit-line BL2N is decoded by a column decoder and is coupled to the input of a sense amplifier that senses the state of the memory cell 4 of this example. If cell 3 is programmed to have a non-conductive MOSFET channel, then the sense amplifier will sense the 2 volts corresponding to a first logical state. However if memory cell 3 is erased or is programmed to conduct current representing a second logical state, current will flow from BL2N through the channel of transistor 3 to embedded bit line [n]32 and from there the current splits into two conductive paths that close the loop to ground. The first path is through select transistor 211-3 to bit line BL3N and to ground and the second path is through transistor 202-2, to embedded bit line [n+1]32, through transistors 222-2 to bit-line BL3N and to ground voltage of 0 volts, thereby pulling the voltage of bit-line BL2N below 2 volts. When the voltage of BL2N is reduced to about 1 volt the sense amplifier senses a second logical state stored in the memory cell 3.

The programming operation of a memory cell of the array 10H of FIG. 30 will now be described. Before actual physical programming of the a memory cell occurs the memory cells are erased to have a threshold voltage of 0.8 volts using the erase mode procedure that is detailed below after the explanation of the programming operation.

To program a selected memory cell, for example cell 4 along word along word line WL14-2 of segment (n), the select lines X[n−1] and X[n+1] are biased at 0 volts in order to block current flow from segment (n) through MOSFETs 201-2 and 203-2. the selected word line 14-2 is biased at VPP voltage. Select line X[n] is biased at Vpp voltage of 12 volts to allow access from the embedded bit line [n]32 to the select MOSFET 221-2. Select lines PSL1 and PSL2 are biased at Vpp voltage of 12 volts, select lines ZSL1 and ZSL2 are biased at Vss or GND voltage of 0 volts. This voltage biasing can be accomplished by the use of row address decoders that have their outputs connected to the word lines and to the select lines. The bit-line BL3N is biased at 7 volts and bit-line BL2N is biased at 0 volts. This can be accomplished by the use of a column decoder and column pull-up transistor. All other word lines of the array 10H are biased at 0 volts by the row decoder circuits. Under these voltage bias conditions current will flow from BL3N through the channel of MOSFET 4 to bit line [n]32 and from there the currents splits into two conductive paths that close the loop to ground. The first path is through select transistor 211-2 to bit line BL2N and to ground and the second path is through transistor 202-2, to embedded bit line [n+1]32, through transistors 221-2 to bit-line BL2N and to ground voltage of 0 volts, thereby programming memory cell 4. Memory cell 4 programs from a state of a conductive channel to a state of a non-conductive MOSFET channel within 10 microseconds of the application of this bias of voltages. The voltage bias conditions create a strong current of electrons in the channel of which some hot electrons accelerate upward from the channel 34 of the substrate 25 and towards the floating gate 30 due to a strong electric field in the direction of the control gate 33 which is connected to the word line 14-2. The hot electrons that reach the conductive floating gate 30 remain trapped within it until an erase operation remove them. When sufficient number of hot electrons transfer to the floating gate 30 from the channel 34 of the transistor due to programming, the threshold voltage of the transistor increases to about 6 volts from the original threshold voltage of 0.8 volts. Because the 6 volts threshold voltage of a programmed memory transistor is higher than the 3 volts that are applied to the word line 14-2 during read mode operation, the channel of the programmed memory transistor 4 will not conduct current.

During programming of cell 4 it is important that neighboring memory cell transistors 3 and 5 that are connected to the same word line 14-2 are not programmed accidentally. Accidental programming of cell 3 is avoided because select transistor 211-2, whose only control gate is connected to select line PSL1, shorts bit line [n]32 to bit-line BL2N so that the drain voltage of memory transistor 3 is almost of the same value of its source voltage and consequently almost no current flows through the channel of transistor 3 and so no hot electron programming occurs. In addition MOSFETs 202-1 and 221-2 are also turned-on to short the other end of diffusion embedded-bit-line [n]32 to bit line BL2N. Accidental programming of cell 5 is avoided because select transistor 211-3 whose only control gate is also connected to select line PSL1, shorts bit line [n]43 to bit-line BL3N so that the drain voltage of memory transistor 5 is almost of the same value of its source voltage and consequently almost no current flows through the channel of transistor 5 and so no hot electron programming occurs. In addition MOSFETs 202-3 and 221-3 are also turned-on to short the other end of diffusion embedded-bit-line [n]43 to bit line BL3N.

Accidental programming of data cell 6 is avoided because of the asymmetry in the drain and source of all of the memory transistors. Memory transistor 6 has its drain connected to bit line [n]43 and its source connected to bit-line BL4N and so when 7 volts are applied to bit line BL3N, the voltage of bit line [n]43 rises only to 5 volts if memory transistor 6 is not programmed yet and so conducts current from its source at bit line [n]43 to its drain at bit line BL4N. The bit line BL4M is pulled to 5 volts because the source of memory transistor 6 is pulled only to 5 volts due to the strong back bias effect which increases the threshold voltage of this NMOS memory FET transistor when its source to substrate voltage increases. The 5 volts of BL4M or BL4N is not sufficient to cause parasitic programming of memory cell 7 whose drain is connected to bit line BL4N and whose source is at floating at a voltage that is higher than 0 volts. The memory transistor of this ninth embodiment does not program when its source voltage is higher than its drain voltage because the shallower source diffusion region 88c (FIG. 26) does not create favorable depletion region in the channel 34 for generating hot electrons for programming under the bias voltages that are as described in reference to memory transistor 6.

The parasitic programming of memory cell 7 can be further avoided by the use of circuits that are connected to the metal bit lines at the edge of the array. One such circuit will now be detailed. Memory transistor 6 has its source connected to bit line [n]43 and its drain connected to bit-line BL4N and so when 7 volts are applied to bit line BL3N, the voltage of bit line [n]43 (between cell 5 and cell 6) rises only to 5 volts due to MOSFET 211-3, if memory transistor 6 is not programmed yet and so cell 6 conducts current from its source at bit line [n]43 to its drain at bit line BL4N. The bit line BL4M is clamped at about 3.5 volts because of a pull-down PMOSFET that is configured during programming to be connected as a diode between BL4M and GND voltage of 0 volts. During programming operation this pull-down PMOSFET has its gate connected to 0 volts of the Vss rail of the chip, its source is connected to BL4M and its drain is connected to Vss rail voltage of 0 volts. This pull-down PMOSFET transistor has a long electrical channel length and a minimum channel width so when the voltage of the bit line BL4M is increased the current of this pull-down transistor increases significantly and so the voltage on [n]43 of about 3.5 volts is divided between transistor 6 and the pull-down PMOSFET. This voltage division ensures the BL4M is clamped at about 3.5 volts. During read operation mode the source and drain of this PMOSFET pull-down transistor are connected to the 2 volts reference voltage of the column pull-up NMOSFET transistor and therefore the pull-down PMOSFET does not conduct any current. The 3.5 volts of BL4M or BL4N during programming of cell 4 is not sufficient to cause parasitic programming of memory cell 7 whose drain is connected to bit line BL4N.

The erase operation of already programmed memory cells of the array 10H of FIG. 30 of the ninth embodiment will now be described in reference to Table (8). To erase a selected page of memory cells, for example page PGBL2N, the select lines PSLi, ZSLi and X[n−1] are biased at GND voltage of 0 volts. The word lines of all the array segments are biased at 0 volts. This voltage biasing can be accomplished by the use of row address decoders that have their outputs connected to the word lines and to the select lines. The bit-line BL3N is biased at 0 volts and bit-line BL2N is biased at Vpp voltage of 12 volts. This can be accomplished by the use of a column decoder and column pull-up transistor. Under these voltage bias conditions the programmed floating gate 30 that overlaps the diffusion of bit line BL2N will emit electrons to the drain diffusion 28 through the overlap area 29AD of the 100 angstroms thick gate oxide 29A shown in FIG. 26, thereby lowering the threshold voltage from 6 volts to a voltage that is below 0.8 volts. During the erasure of a selected page of this ninth embodiment the memory cells that are within adjacent pages are not erased, therefore when erasing page PGBL2N that includes cells 2 and 3 of bit line BL2N, bit lines BL1N, BL3N and BL4N are biased at 0 volts and memory cells 1, 4, 5, 6 and 7 are not erased. When erasing page PGBL3N that includes cells 4 and 5 of bit line BL3N, bit lines BL1N, BL2N and BL4N are biased at 0 volts and so memory cells 1, 2, 3, 6 and 7 are not erased.

In order to erase a selected block of memory cells the two bit lines of the selected block are biased at Vpp of 12 volts, the bit lines of the non-selected blocks are biased at 0 volts. The word lines and segment select lines are biased at 0 volts as in the case of page erase. For example, in order to erase block BKBL23, bit lines BL2N and BL3N are biased at Vpp voltage of 12 volts and the other continuous bit lines are biased at 0 volts. It is to be noted that several adjacent and not adjacent blocks may be erased at the same time without erasing the entire memory array. It is also possible to erase the entire memory array simultaneously. When all the blocks of the memory array of the ninth embodiment are erased simultaneously the mode of operation is called Flash erase.

The array of FIG. 30 can be modified for operation as a mask programmable read only memory (ROM) by avoiding the formation of the floating gates in the data storage memory cells and substituting the channel implant to an implant level that can represent a logical "0" or to an implant level that represents a logical "1". A dedicated photolithography mask is typically used for simultaneous programming the predetermined implant level in the different memory cells in the semiconductor fabrication factory. For the manufacturing of a mask-ROM only the read operation described above is applicable.

Figure 35:
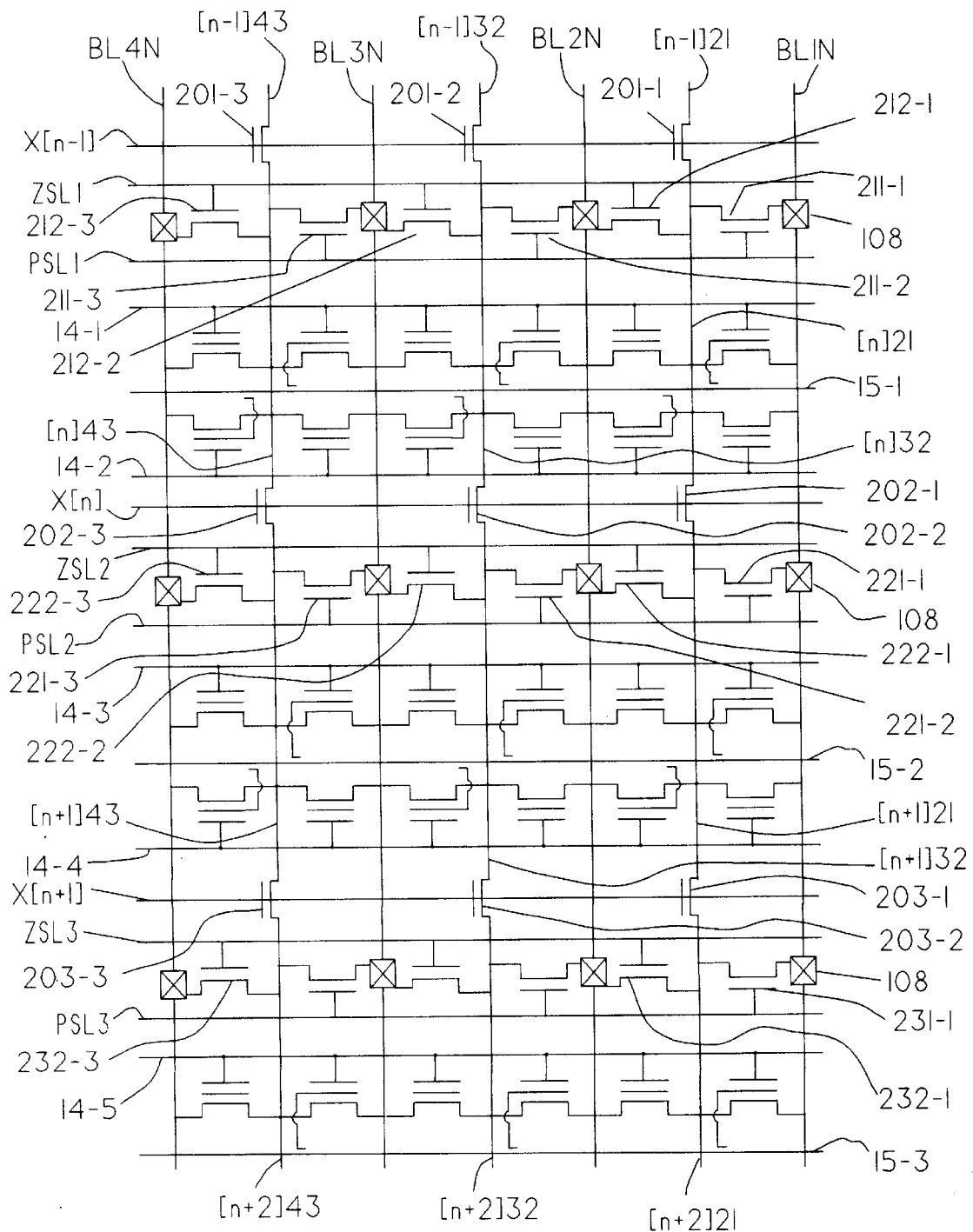
FIG. 35 illustrates an electrical schematic of the array of FIG. 33.
Figure 36:
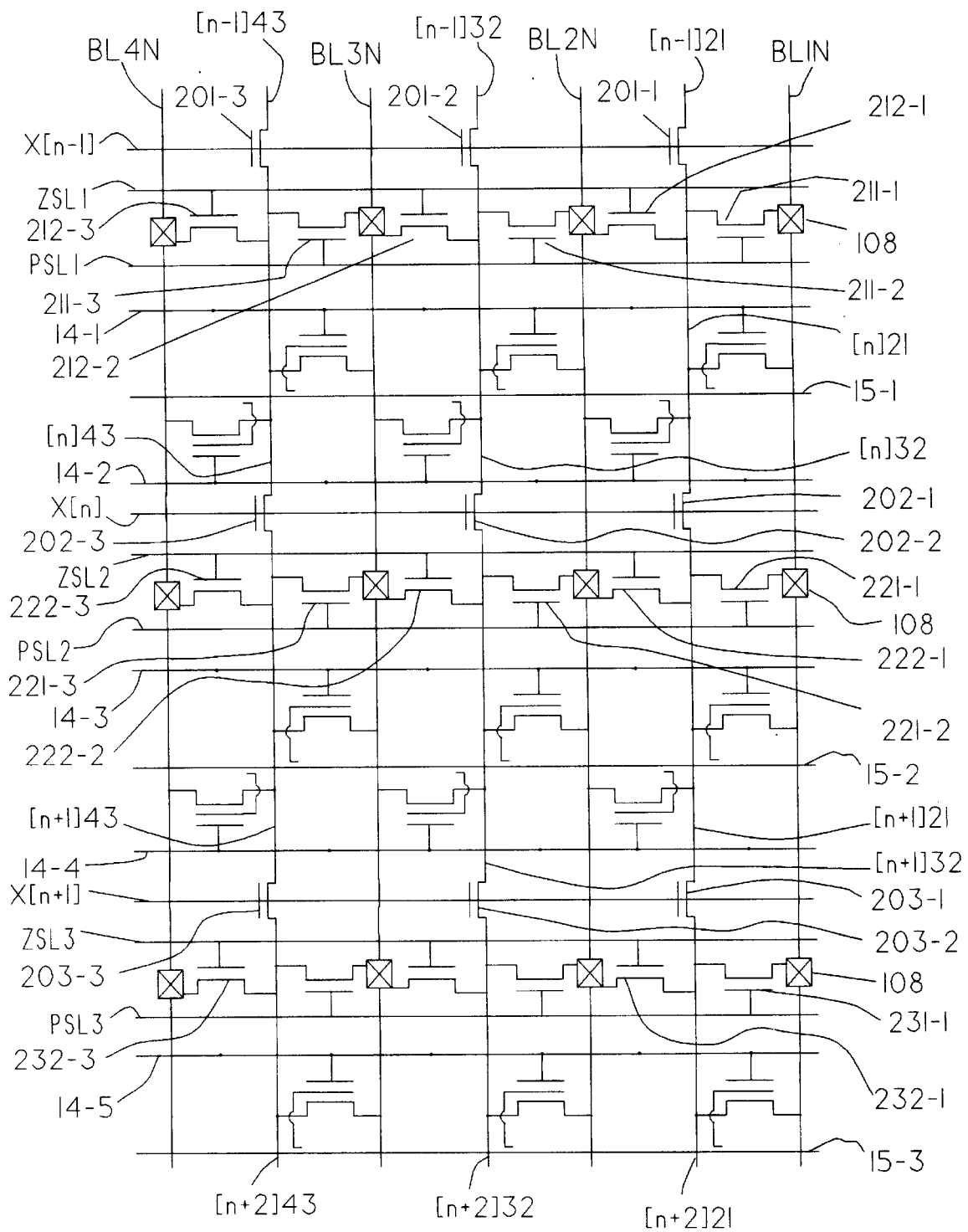
FIGS. 36 illustrates an alternative electrical schematic of the array of FIG. 33, in which transistors that are used as insulators are not shown.

The tenth embodiment of the present invention will now be described in reference to FIG. 33, which is a top view of a portion of a memory array matrix 10K, FIGS. 34a–c which are section cut along array 10K, and in reference to FIGS. 35 and 36 which are electrical schematics of the array of FIG. 33. The array 10K includes two types of memory cells which are interleaved in a checkerboard pattern. The first type of memory cell is a data memory cell 300D and it includes an elongated floating gate 30D, as measured along an axis that is parallel to the bit line axis. The second type of memory cell is an isolation cell 300K that includes a shorter floating gate 30K, as measured along an axis that is parallel to the bit line axis. The data memory cell 300D includes an erase gate 60se that is insulatively disposed over section 30s of the floating gate 30D, where the isolation memory cell 300K does not include this erase gate 60se.

The floating gate 30D is longer than the floating gate 30K as measured along an axis that is parallel to the bit line axis.

The fabrication process steps that are used to form the memory cells of array 10K of this tenth embodiment are the same process steps that were used to form the gate oxide 29A and the elongated first polysilicon strips 30 of the fifth embodiment, with the restriction on the definition of isolation regions 41 which are formed only in portions of the isolation regions 41 of FIG. 16b that are to be disposed under the polysilicon strips 30. Other process steps associated with the formation of the word-line 15 are also implemented in this tenth embodiment only so that word-lines 15 are formed to be connected to the erase gate 60se of the data memory cell 300D and not to be electrically coupled in any way to the isolation memory cells 300K, as shown in FIG. 34c and as detailed above in reference to the self aligned erase gate 60se of the sixth embodiment shown in FIG. 15j.

The operation of the individual data memory cell 300D of this tenth embodiment is similar to the cell of the alternative method of the fifth embodiment described above. The operation of the individual isolation memory cell 300K of this tenth embodiment is similar to the memory cell of the alternative method of the fifth embodiment only in the programming and reading operations, but this isolation cell 300K can not be erased electrically because it has no polysilicon erase gate 60se and its gate oxide 29A is about 250 angstroms thick to prevent electron tunneling from its floating gate 30K to the drain diffusion 28 under the operating voltages of the memory array 10K in all modes of operation. Each type of memory cell of this tenth embodiment retains the feature of asymmetry in programming and physical construction of the drain and source and of the fact that the cell has stronger drain to source current than source to drain current.

Figure 33:
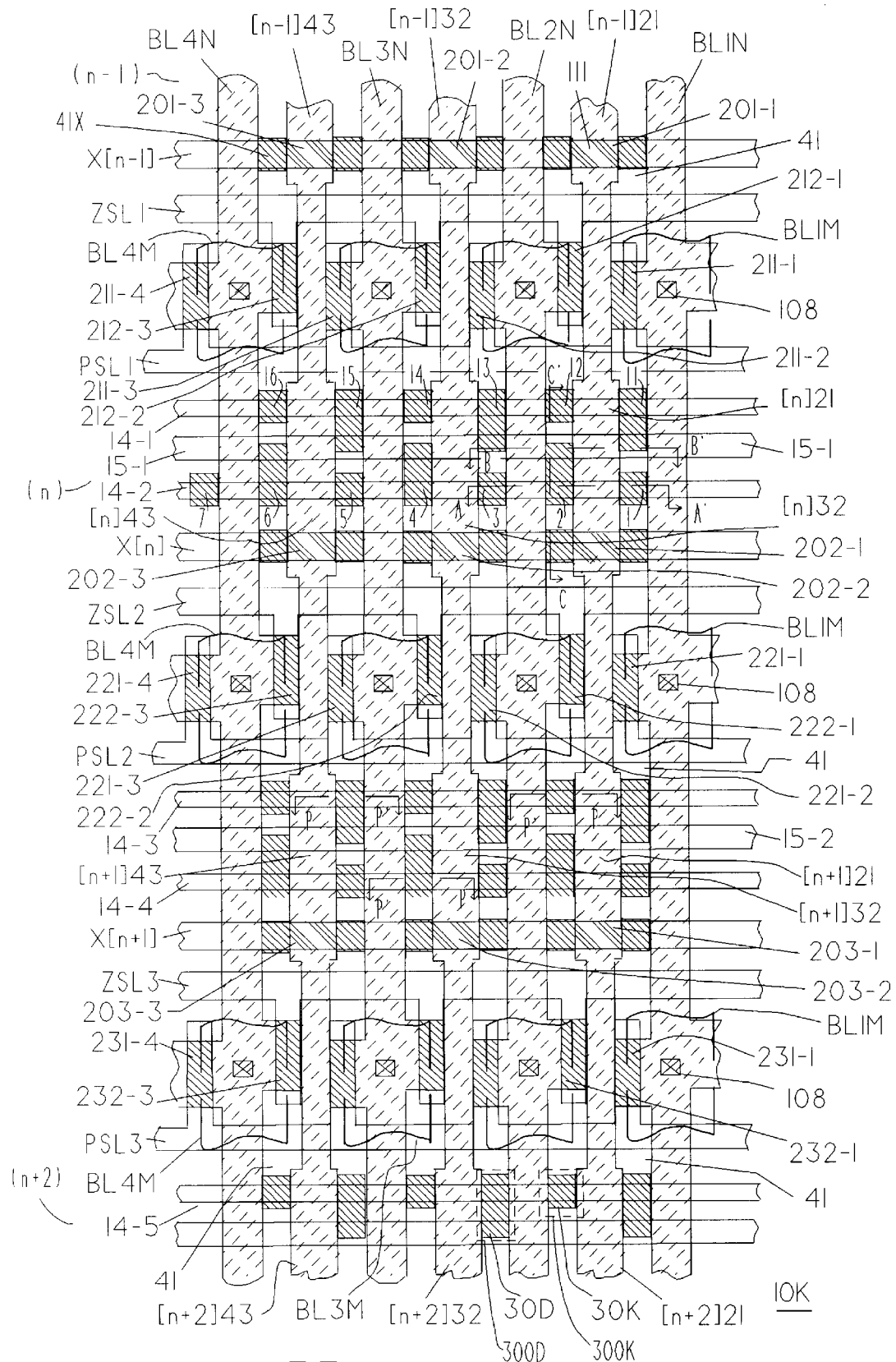
FIG. 33 is a plan view of memory array 10K according to the tenth embodiment of the present invention with fewer select lines per memory cell array segment for the selection of an embedded bit-line diffusion. The memory array includes memory cells in which the end cap of the floating gate extends over the isolation region and disposed under a conductive layer that is adjacent the read word line of the row.

A portion of each individual memory cell of this tenth embodiment is shown in FIG. 26, which is a section cut along line p—p' of FIG. 33 which runs along the program area of the floating gate 30 and also runs along the channel area 34. The thickness and the type of layers of the gate oxide 29A of this tenth embodiment are the same as those of the gate oxide 29A of the memory cell of the fifth embodiment of FIG. 20. The process for the formation of the other layers of the structure of FIG. 26 are the same as those as described above in reference to the eighth embodiment.

Additionally, continuous N+ diffusion source regions are formed, for example [n]21, to be in parallel to the regions 28 of FIG. 16b, which is also marked as numeral 12 or BL1N, BL2N, BL3N or BL4N in FIG. 33 (these access bit-lines will be referred to collectively as a group as BLiN in the explanation below). The continuous source diffusion bit-line regions of this tenth embodiment (FIG. 33) are indicated as [n]21 or [n]32 or [n]43 (these bit-line segments will be refereed to collectively as a group as [n]jk in the explanation below). Once the access bit-line regions BLiN and bit-line segment regions [n]jk are formed, the elongated continuous polysilicon strips 30 are etched to form the electrically isolated floating gates 30 of FIG. 33, so that an additional floating gate 30K is formed in essentially the same wafer surface area of the memory cell of FIG. 17 of the fifth embodiment. The additional floating gate 30K is defined as a part of another memory cell named here isolation memory cell 300K, so that the array of this tenth embodiment contains about two physical memory cells, 300K and 300D, in the same area of substrate 25 that contained only one memory cell of the fifth embodiment.

The memory array 10K of this tenth embodiment is optimized for the storage and fast retrieval of analog data and multi-bit electrostatic vertical recording (EVR) data that is stored in the data memory cell 300D. The fast data retrieval time results from the fact that every data cell 300D has an isolation cell 300K connected to its drain and another isolation cell 300K connected to its source. The isolation cells 300K are programmed before the chip that includes array 10K is sold to the customer so that their channel 34 does not conduct current during subsequent memory operations. This results in fast settling time of the bit line of the selected physical data cell 300D, thereby the stored data is sensed faster to the output of the chip. As a result of the improved data sensing ability from the physical data cell 300D it is possible to store into by programming (writing) and retrieve from by sensing (reading) low value of stored charge (such as electrons) from the data memory cell 300D, thereby effectively increasing the storage capacity per given substrate area. For example each data memory cell 300D can store one of 512 electron charge values representing 16 logical binary bits storage, thereby a physical memory array 10K that includes 64 Megabits of physical data cells 300D stores 1 gigabit of logical binary bits. The programming of a particular charge level into the physical memory cell 300D to represent a particular 16 bits digital data value presented at the input of the memory chip of array 10k can be accomplished by a digital-to-analog converter as detailed in the above referenced U.S. Pat. No. 5,278,785. The sensing of a particular electron charge level from memory cell 300D into a 16 bits digital value at the output of the memory chip of array 10k can be accomplished by use of an analog-to-digital converter as detailed in the above referenced U.S. Pat. No. 5,278,785.

In FIG. 33 there are several other features that contribute to the increase in the packing density of the number of memory cells per unit area of a memory chip that uses the array architecture of array 10K, which result in reduced manufacturing cost of the memory chip. These features include the polysilicon select line X[n−1] which is connected to MOSFETs 201-i, select line X[n] which is connected to MOSFETs 202-i and select line X[n+1] which is connected to MOSFETs 203-i. Other features that contribute to the reduction of the size of the array 10K are the polysilicon select line ZSL1 which is connected to MOS-FETs 212-i and its neighbor the select line PSL1 which is connected to MOSFETs 211-i, polysilicon select line ZSL2 which is connected to MOSFETs 222-i and its neighbor the select line PSL2 which is connected to MOSFETs 221-i, and polysilicon select line ZSL3 which is connected to MOSFETs 232-i and its neighbor the select line PSL3 which is connected to MOSFETs 231-i. The above mentioned select lines of array 10K are insulatively disposed on the substrate 25 and are defined to run along an axis that is parallel to the read word lines 14 and generally to run in perpendicular to the bit line axis.

The way transistors 211-i are incorporated into the array 10K of FIG. 33 can be described in reference to transistor 211-1 Transistor 211-1 has its source connected to diffusion of embedded bit-line [n]21, its drain connected to diffusion of bit line BL1N and its gate to select line PSL1. Transistor 211-2 has its source connected to diffusion of embedded bit-line [n]32, its drain connected to diffusion of bit line BL2N and its gate to select line PSL1. Transistor 211-3 has its source connected to diffusion of embedded bit-line [n]43, its drain connected to diffusion of bit line BL3N and its gate to select line PSL1. The way transistors 212-i are incorporated into the array 10K of FIG. 33 can be described in reference to transistor 212-1. Transistor 212-1 has its source connected to diffusion of embedded bit-line [n]21, its drain connected to diffusion of bit line BL2N and its gate to select line ZSL1. Transistor 212-2 has its source connected to diffusion of embedded bit-line [n]32, its drain connected to diffusion of bit line BL3N and its gate to select line ZSL1. Transistor 212-3 has its source connected to diffusion of embedded bit-line [n]43, its drain connected to diffusion of bit line BL4N and its gate to select line ZSL1.

The way transistors 221-i are incorporated into the array 10K of FIG. 33 can be described in reference to transistor 221-1. Transistor 221-1 has its source connected to diffusion of embedded bit-line [n+1]21, its drain connected to diffusion of bit line BL1N and its gate to select line PSL2. Transistor 221-2 has its source connected to diffusion of embedded bit-line [n+1]32, its drain connected to diffusion of bit line BL2N and its gate to select line PSL2. Transistor 221-3 has its source connected to diffusion of embedded bit-line [n+1]43, its drain connected to diffusion of bit line BL3N and its gate to select line PSL2. The way transistors 222-i are incorporated into the array 10K of FIG. 33 can be described in reference to transistor 222-1. Transistor 222-1 has its source connected to diffusion of embedded bit-line [n+1]21, its drain connected to diffusion of bit line BL2N and its gate to select line ZSL2. Transistor 222-2 has its source connected to diffusion of embedded bit-line [n+1]32, its drain connected to diffusion of bit line BL3N and its gate to select line ZSL2. Transistor 222-3 has its source connected to diffusion of embedded bit-line [n+1]43, its drain connected to diffusion of bit line BL4N and its gate to select line ZSL2.

The way transistors 231-i are incorporated into the array 10K of FIG. 33 can be described in reference to transistor 231-1. Transistor 231-1 has its source connected to diffusion of embedded bit-line [n+2]21, its drain connected to diffusion of bit line BL1N and its gate to select line PSL3. Transistor 231-2 has its source connected to diffusion of embedded bit-line [n+2]32, its drain connected to diffusion of bit line BL2N and its gate to select line PSL3. Transistor 231-3 has its source connected to diffusion of embedded bit-line [n+2]43, its drain connected to diffusion of bit line BL3N and its gate to select line PSL3. The way transistors 232-i are incorporated into the array 10K of FIG. 33 can be described in reference to transistor 232-1. Transistor 232-1 has its source connected to diffusion of embedded bit-line [n+2]21, its drain connected to diffusion of bit line BL2N and its gate to select line ZSL3. Transistor 232-2 has its source connected to diffusion of embedded bit-line [n+2]32, its drain connected to diffusion of bit line BL3N and its gate to select line ZSL3. Transistor 232-3 has its source connected to diffusion of embedded bit-line [n+2]43, its drain connected to diffusion of bit line BL4N and its gate to select line ZSL3.

The way transistors 201-i are incorporated into the array 10K of FIG. 33 can be described in reference to transistor 201-1. Transistor 201-1 has its source connected to diffusion of embedded bit-line [n−1]21, its drain connected to diffusion of embedded bit line [n]21 and its gate to select line X[n−1]. Transistor 201-2 has its source connected to diffusion of embedded bit-line [n−1]32, its drain connected to diffusion of embedded bit line [n]32 and its gate to select line X[n−1]. Transistor 201-3 has its source connected to diffusion of embedded bit-line [n−1]43, its drain connected to diffusion of embedded bit line [n]43 and its gate to select line X[n−1]. The way transistors 202-i are incorporated into the array 10K of FIG. 33 can be described in reference to transistor 202-1. Transistor 202-1 has its source connected to diffusion of embedded bit-line [n]21, its drain connected to diffusion of embedded bit line [n+1]21 and its gate to select line X[n]. Transistor 202-2 has its source connected to diffusion of embedded bit-line [n]32, its drain connected to diffusion of embedded bit line [n+1]32 and its gate to select line X[n]. Transistor 202-3 has its source connected to diffusion of embedded bit-line [n]43, its drain connected to diffusion of embedded bit line [n+1]43 and its gate to select line X[n]. The way transistors 203-i are incorporated into the array 10K of FIG. 33 can be described in reference to transistor 203-1. Transistor 203-1 has its source connected to diffusion of embedded bit-line [n+1]21, its drain connected to diffusion of embedded bit line [n+2]21 and its gate to select line X[n+1]. Transistor 203-2 has its source connected to diffusion of embedded bit-line [n+1]32, its drain connected to diffusion of embedded bit line [n+2]32 and its gate to select line X[n+1]. Transistor 203-3 has its source connected to diffusion of embedded bit-line [n+1]43, its drain connected to diffusion of embedded bit line [n+2]43 and its gate to select line X[n+1].

The gates of selecting MOSFETs 211-i, 212-i, 221-i, 222-i, 231-i and 232-i are formed simultaneously with floating gates 30 using the same process that is used to form the floating gates 30 of sub-lithographic dimensions, thereby reducing the space between diffusion bit lines as compared with the wider oxide isolation or as compared with a polysilicon gate that is defined by a conventional photolithographic equipment. The select lined ZSLi and PSLi are formed from the same polysilicon 33 of the word lines 14 in a manner that enables a physical contact between select lines ZSLi and PSLi and the corresponding select gates of MOSFETs 211-i, 212-i, 221-i, 222-i, 231-i and 232-i as was detailed above and as shown in FIG. 33. This is done by selectively removing (for example by etching) the interpoly dielectric layers 31, 50p and 32 from (see FIG. 26) select gates of MOSFETs 211-i, 212-i, 221-i, 222-i, 231-i and 232-i, but retaining these dielectric layers over the floating gates 30.

The threshold voltage of MOSFET transistors 201-i, 202-i, 203-i, 211-i, 212-i, 221-i, 222-i, 231-i and 232-i is 0.7 volts.

The select lines ZSLi and PSLi of array 10K of FIG. 33 enable selective electrical access from the continuous diffusion of access bit lines BLiN to the embedded-bit-line segments [n]21, [n]32 or [n]43, so that a selected memory cell (numbered 1 to 6) that includes a floating gate 30 can be programmed and the data can be read out to a sense amplifier. Each of the memory cells 1 to 6 is associated with its own column of memory cells that is oriented along an axis that is parallel to the axis of the access bit lines. The number designation (n) is the number of the segment of the array 10K that includes at least one row of memory cells with its associated word line 14, but preferably a segment should have at least 64 rows of which only two are shown in FIG. 33. Each array segment includes plurality of embedded-bit-lines which are positioned between the continuous bit lines BLiN and carry the respective numeral [n]. The number of word lines 14 within a segment (n) can be odd or even. An array segment (n) is defined on its upper side by select line X[n−1] and on its lower side by select line X[n] and includes one associated select line ZSLi and one associated select line PSLi, for example segment (n) include select line ZSL1 and select line PSL1. The adjacent array segments which are continuous with and are in contact with array segment (n) are numbered (n−1) on the upper side of the segment (n), and are numbered (n+1) on the lower side of the segment (n). The upper and lower sides are direction used herein to simplify the explanation and will mean the top of the page and the bottom of the page of FIG. 33 respectively as viewed from the reader's point of observation. In other words if an xy coordinate system is placed on the sheet of paper that includes FIG. 33 so that the origin x=0, y=0, is placed within the segment (n) and so that the x axis is parallel to a word line 14 and the positive direction extends to the right side of the page, than the positive y direction will be the upper side and the negative y direction will be the lower side of the array 10K of FIG. 33. Isolation regions 41X are formed of 7000 angstroms thick silicon oxide so that during the program, erase or read operations of the memory chip there is no current conduction between the diffusion bit lines in the area of the substrate that is disposed under this region 41X.

As stated above each segment (n) of this tenth embodiment typically include more than 64 rows of memory cells and any number of columns of the same memory cells. This large number of rows causes increase in the total sheet resistance from one end to the other end of the embedded-bit-line [n]21 diffusion which extends from transistor 201-1 to transistor 202-1. As shown in FIGS. 33, 35 and 36 the tenth embodiment uses only three select lines per array segment with the resulting advantages of reduced diffusion bit-line resistance, reduced chip area and the accommodation of wider metal bit-lines BLiM, that were describe above in reference to the ninth embodiment. The operation of the memory array 10K will be detailed further below.

In FIG. 33 of the tenth embodiment a group of data memory cells 300D whose control gate 33 is connected to a word line 14-i of FIG. 33 form a page PGWL1. For example, the row of data memory cells 300D that includes data memory cell 2 along word line 14-2 may number 4096 cells that form a page PGWL2, and the row of memory cells 300D that includes data memory cell 11 along word line 14-1 may also number 4096 data cells 300D that form a page PGWL1. The data memory cell 300D of page PGWL1 and of page PGWL2 share an erase line 15-1 which is connected to the erase gates 60se of data cells 300D in these two pages. Erase line 15-1 is insulatively disposed between the read word lines 14-1 and 14-2 as was explained in explanation referring to the fifth embodiment. Erase line 15-1 is also insulatively disposed over the contiguous diffusion bit lines BLiN and over the embedded bit lines [n]jk. The insulation layers between the diffusion bit lines and the erase lines 15 and the read word lines 14 are formed as described above in reference to the first embodiment from a thin silicon dioxide and a thicker deposited TEOS silicon dioxide to prevent voltage breakdown of the oxide during electrical operations of the memory.

Two adjacent pages PGWLi and PGWLi+1 that include and share an erase line 15-i form a block BAWL-i-(i+1), that include 8192 memory cells. The array 10K of FIG. 33 includes at least two blocks BKWLpq. For example the two adjacent pages PGWL1 and PGWL2 that include and share an erase line 15-1 form a block BAWL-1-2.

Figure 34A:
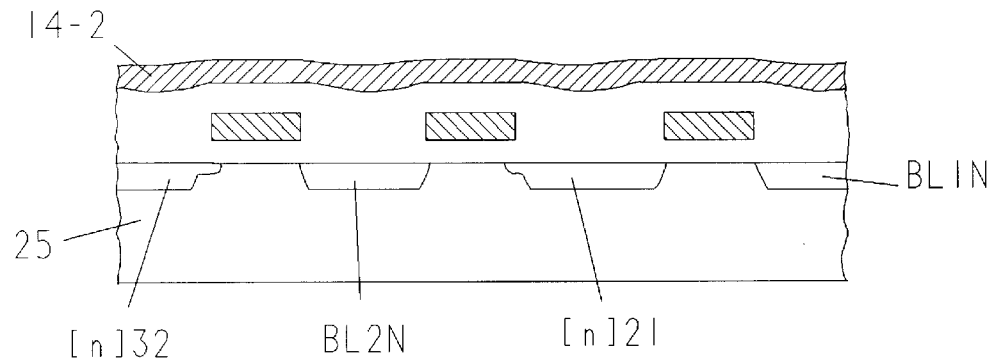
FIG. 34A is a section cut along line A—A' of FIG. 33.
Figure 34B:
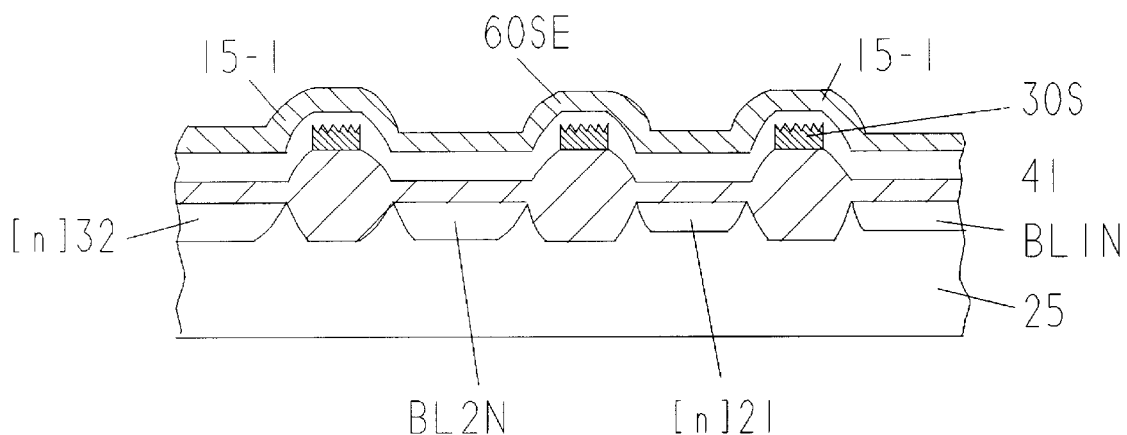
FIG. 34B is a section cut along line B—B' of FIG. 33.
Figure 34C:
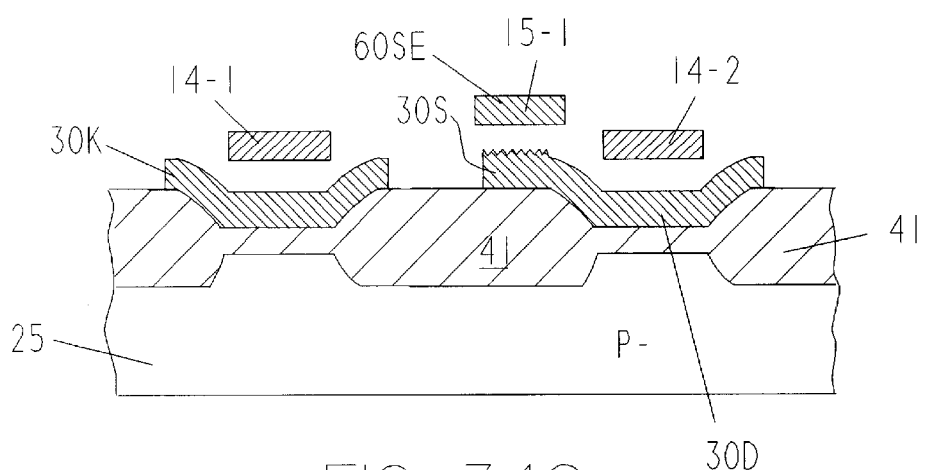
FIG. 34C is a section cut along line C—C' of FIG. 33.

FIG. 34A is a section cut along line A—A' of FIG. 33. FIG. 34B is a section cut along line B—B' of FIG. 33. FIG. 34C is a section cut along line C—C' of FIG. 33. The thickness of gate oxide 29A of the select MOSFETs 201-i, 202-i, 203-i, 211-i, 212-i, 221-i, 222-i, 231-i and 232-i of this tenth embodiment under gate polysilicon 111 is 250 angstroms. FIGS. 34A, 34B and 34C are simplified cross sections along lines A, B and C of FIG. 33, which do not show the details of the gate oxide layers, the floating gate to drain overlap and do not show the sandwich of thermal oxide and deposited oxide over the bit line diffusions regions. These details are shown in FIG. 26.

The operation of the array 10K of FIG. 33 will now be described in reference to Table (9).

[n]32 to the select MOSFET 221-2 which turns "on" and to embedded bit line segment [n+1]32 thereby expanding the size of the selected bit line segment [n]32 to include bit line segment [n+1]32, and so embedded bit line segment [n]32 is selectively expandable electrically. Select lines PSL1 and PSL2 are biased at Vcc voltage of 3 volts, select lines ZSL1 and ZSL2 are biased at Vss or GND voltage of 0 volts. The selected word line 14-2 is biased at 3 volts and the erase line 15-1 is biased at 0 volts. This voltage biasing can be accomplished by the use of row address decoders that have their outputs connected to the word lines and to the select lines. The bit-line BL3N is biased at 2 volts and bit-line BL2N is biased at 0 volts. This can be accomplished by the use of a column decoder and column pull-up transistor. All other read word lines 14 and erase lines 15 of the array 10K are biased at 0 volts by the row decoder circuits. The bit-line BL3N is decoded by a column decoder and is coupled to the input of a sense amplifier that senses the state of the memory cell 4 of this example. If cell 4 is programmed to have a non-conductive MOSFET channel, then the sense amplifier will sense the 2 volts corresponding to a first logical state. However if memory cell 4 is erased or is programmed to conduct current representing a second logical state, current will flow from BL3N which functions as a current path, through the channel of MOSFET 4 to bit line [n]32 and from there the currents splits into two conductive paths that close

TABLE 9

|  | EL 15-1 | WL 14-1 | BL2N | BL3N | WL 14-2 | PSL1 and PSL2 | ZSL1 and ZSL2 | X [n − 1] and X [n + 1] | X [n] |
|---|---|---|---|---|---|---|---|---|---|
| Read Cell 4 | GND | GND | GND | 2v | Vcc | Vcc | GND | GND | Vcc |
| Read Cell 3 For Testing | GND | GND | 2v | GND | Vcc | GND | Vcc | GND | Vcc |
| Program Cell 4 | 3v | GND | GND | 7v | Vpp | Vpp | GND | GND | Vpp |
| Program Cell 3 | 3v | GND | 7v | GND | Vpp | GND | Vpp | GND | Vpp |
| Erase Page PGWL1 | Vpp | GND | GND | GND | Vpp | GND | GND | GND | GND |
| Erase Page PGWL2 | Vpp | Vpp | GND | GND | GND | GND | GND | GND | GND |
| Erase Block BAWL-1-2 | Vpp | GND | GND | GND | GND | GND | GND | GND | GND |
| Flash Erase Of All The Memory | Vpp | GND | GND | GND | GND | GND | GND | GND | GND |

In Table (9), the notation GND is ground voltage of 0 volts, Vcc is 3 volts, Vpp is 12 volts, 2v is 2 volts, 3v is 3 volts, 7v is 7 volts which may be generated by an on-chip or off-chip voltage reference circuit, as is known by those with ordinary skill in the art. It is to be understood that the memory operation described in a given line of Table (9) is performed during a time period that does not coincide with the time period in which another memory operation that is described in another line of Table (9) is performed. The erase operation of a memory cell of array 10K of FIG. 33 brings the threshold voltage to be about 0.8 volts.

To read a selected memory cell 300D, for example cell 4 along word line WL14-2 of segment (n), the select lines X[n−1] and X[n+1] are biased at 0 volts in order to block current flow from segment (n) through MOSFET 201-2 to segment (n−1) and through MOSFET 203-2 to segment (n+2), thereby selectively isolating embedded bit line segment [n]32 from adjacent embedded bit line segment [n−1]32 and from embedded bit line segment [n+2]32, and so embedded bit line segment [n]32 is selectively isolatable electrically. Select line X[n] is biased at Vcc voltage of 3 volts to allow electrical access from the embedded bit line the loop to ground. The first path is through select transistor 211-2 to bit line BL2N which functions as a current path, and to ground and the second path is through transistor 202-2, to embedded bit line [n+1]32, through transistors 221-2 to bit-line BL2N and to ground voltage of 0 volts, thereby pulling the voltage of bit-line BL3N below 2 volts. When the voltage of BL3N is reduced to about 1 volt the sense amplifier senses a second logical state stored in the memory cell 4.

To read a selected isolation memory cell 300K for testing purposes, for example cell 3 along word line WL14-2 of segment (n), the select lines X[n−1] and X[n+1] are biased at 0 volts in order to block current flow from segment (n) through MOSFETs 201-2 and 203-2. Select line X[n] is biased at Vcc voltage of 3 volts to allow access from the embedded bit line [n]32 to the select MOSFET 221-2. Select lines PSL1 and PSL2 are biased at GND voltage of 0 volts, select lines ZSL1 and ZSL2 are biased at Vcc voltage of 3 volts. The selected word line 14-2 is biased at 3 volts and the erase line 15 is biased at 0 volts. This voltage biasing can be accomplished by the use of row address decoders that have their outputs connected to the word lines and to the select lines. The bit-line BL2N is biased at 2 volts and bit-line BL3N is biased at 0 volts. This can be accomplished by the use of a column decoder and column pull-up transistor. All other word lines of the array 10K are biased at 0 volts by the row decoder circuits. The bit-line BL2N is decoded by a column decoder and is coupled to the input of a sense amplifier that senses the state of the memory cell 4 of this example. When isolation cell 3 is programmed to have a non-conductive MOSFET channel, then the sense amplifier will sense the 2 volts corresponding to a first logical state. However if memory cell 3 is not programmed because of some defect in the materials then cell 3 will conduct current that will flow from BL2N through the channel of transistor 3 to embedded bit line [n]32 and from there the current splits into two conductive paths that close the loop to ground. The first path is through select transistor 211-3 to bit line BL3N and to ground and the second path is through transistor 202-2, to embedded bit line [n+1]32, through transistors 222-2 to bit-line BL3N and to ground voltage of 0 volts, thereby pulling the voltage of bit-line BL2N below 2 volts. When the voltage of BL2N is undesirable reduced the sense amplifier senses the small voltage change and flags to inform a memory test instrument that is connected to the address input of the array 10K of the problem. Corrective measures are then taken to permanently disable word line 14-2 so that when memory cells that are connected to word line 14-2 are addressed, a redundancy circuitry routs the memory to a redundancy memory segment (nR), not shown in the figures, to read the requested data.

The programming operation of a memory cell of the array 10K of FIG. 33 will now be described. Before actual physical programming of the a data memory cells 300D occurs (after the final testing by the manufacturer) the memory cells 300D are erased to have a threshold voltage of 0.8 volts using the erase mode procedure that is detailed below after the explanation of the programming operation. To program a selected data memory cell 300D, for example cell 4 along word along word line WL14-2 of segment (n), the select lines X[n–1] and X[n+1] are biased at 0 volts in order to block current flow from segment (n) through MOSFETs 201-2 and 203-2. Select line X[n] is biased at Vpp voltage of 12 volts to allow access from the embedded bit line [n]32 to the select MOSFET 221-2. Select lines PSL1 and PSL2 are biased at Vpp voltage of 12 volts, select lines ZSL1 and ZSL2 are biased at Vss or GND voltage of 0 volts. The selected word line 14-2 is biased at Vpp of 12 volts and the erase line 15-1 is biased at 3 volts.

This voltage biasing can be accomplished by the use of row address decoders that have their outputs connected to the word lines and to the select lines. The bit-line BL3N is biased at 7 volts and bit-line BL2N is biased at 0 volts. This can be accomplished by the use of a column decoder and column pull-up transistor. All other word lines, select lines and erase lines of the array 10K are biased at 0 volts by the row decoder circuits. Under these voltage bias conditions current will flow from BL3N through the channel of MOSFET 4 to bit line [n]32 and from there the currents splits into two conductive paths that close the loop to ground. The first path is through select transistor 211-2 to bit line BL2N and to ground and the second path is through transistor 202-2, to embedded bit line [n+1]32, through transistors 221-2 to bit-line BL2N and to ground voltage of 0 volts, thereby programming memory cell 4. Memory cell 4 programs from a state of a conductive channel to a state of a non-conductive MOSFET channel within 10 microseconds of the application of this bias of voltages. The voltage bias conditions create a strong current of electrons in the channel 34 of which some hot electrons accelerate upward from the channel 34 of the substrate 25 and towards the floating gate 30 due to a strong electric field in the direction of the control gate 33 which is connected to the word line 14-2. The hot electrons that reach the conductive floating gate 30 remain trapped within it until an erase operation remove them. When sufficient number of hot electrons transfer to the floating gate 30 from the channel 34 of the transistor due to programming, the threshold voltage of the transistor increases to about 6 volts from the original threshold voltage of 0.8 volts. Because the 6 volts threshold voltage of a programmed memory transistor is higher than the 3 volts that are applied to the word line 14-2 during read mode operation, the channel of the programmed memory transistor 4 will not conduct current.

During programming of cell 4 it is important that neighboring isolation memory cell 300K transistors 3 and 5 that are connected to the same word line 14-2 are not programmed accidentally further than is needed to provide electrical isolation between the diffusion layers of the bit lines, as is verified during the testing of the memory array 10K. This is because the memory cells 300D and 300K are placed very close to each other, in some instances 0.25 micrometers apart, and therefore the substrate 25 may not be able to supply enough hot electrons to program more than one memory cell of two immediately adjacent cells within a specified and desirable programming period and during adverse high temperature conditions of the environment. Accidental additional programming of cell 3 is avoided because select transistor 211-2, whose only control gate is connected to select line PSL1, shorts bit line [n]32 to bit-line BL2N so that the drain voltage of memory transistor 3 is almost of the same value of its source voltage and consequently almost no current flows through the channel of transistor 3 and so no hot electron programming occurs. In addition MOSFETs 202-1 and 221-2 are also turned-on to short the other end of diffusion embedded-bit-line [n]32 to bit line BL2N. Accidental additional programming of cell 5 is avoided because select transistor 211-3 whose only control gate is also connected to select line PSL1, shorts bit line [n]43 to bit-line BL3N so that the drain voltage of memory transistor 5 is almost of the same value of its source voltage and consequently almost no current flows through the channel of transistor 5 and so no hot electron programming occurs. In addition MOSFETs 202-3 and 221-3 are also turned-on to short the other end of diffusion embedded-bit-line,[n]43 to bit line BL3N.

Accidental programming of data memory cell 6 is avoided because of the asymmetry in the drain and source of all of the memory transistors. Memory transistor 6 has its drain connected to bit line [n]43 and its source connected to bit-line BL4N and so when 7 volts are applied to bit line BL3N, the voltage of bit line [n]43 rises only to 5 volts if memory transistor 6 is not programmed yet and so it conducts current from its source at bit line [n]43 to its drain at bit line BL4N. The bit line BL4M is pulled to 5 volts because the source of memory transistor 6 is pulled only to 5 volts due to the strong back bias effect which increases the threshold voltage of this NMOS memory FET transistor when its source to substrate voltage increases. The 5 volts of BL4M or BL4N is not sufficient to cause parasitic programming of memory cell 7 whose drain is connected to bit line BL4N and whose source is at floating at a voltage that is higher than 0 volts. The memory transistor of this tenth embodiment does not program when its source voltage is higher than its drain voltage because the shallower source diffusion region 88 (FIG. 26) does not create favorable depletion region in the channel 34 for generating hot electrons for programming under the bias voltages that are as described in reference to memory transistor 6. The parasitic programming of memory isolation memory cell 7 can be further avoided by the use of circuits that are connected to the metal bit lines at the edge of the array. One such circuit will now be detailed. Memory transistor 6 has its source connected to bit line [n]43 and its drain connected to bit-line BL4N and so when 7 volts are applied to bit line BL3N, the voltage of bit line [n]43 (between cell 5 and cell 6) rises only to 5 volts due to MOSFET 211-3, if memory transistor 6 is not programmed yet and so cell 6 conducts current from its source at bit line [n]43 to its drain at bit line BL4N. The bit line BL4M is clamped at about 3.5 volts because of a pull-down PMOSFET that is configured during programming to be connected as a diode between BL4M and GND voltage of 0 volts. During programming operation this pull-down PMOSFET has its gate connected to 0 volts of the Vss rail of the chip, its source is connected to BL4M and its drain is connected to Vss rail voltage of 0 volts. This pull-down PMOSFET transistor has a long electrical channel length and a minimum channel width so when the voltage of the bit line BL4M is increased the current of this pull-down transistor increases significantly and so the voltage on [n]43 of about 3.5 volts is divided between transistor 6 and the pull-down PMOSFET. This voltage division ensures the BL4M is clamped at about 3.5 volts. During read operation mode the source and drain of this PMOSFET pull-down transistor are connected to the 2 volts reference voltage of the column pull-up NMOSFET transistor and therefore the pull-down PMOSFET does not conduct any current. The 3.5 volts of BL4M or BL4N during programming of cell 4 is not sufficient to cause parasitic programming of memory cell 7 whose drain is connected to bit line BL4N.

The erase operation of already programmed data memory cells 300D of the array 10K of FIG. 33 of the tenth embodiment will now be described in reference to Table (9). To erase a selected page of memory cells, for example page PGWL2, the select lines PSLi, ZSLi and X[ni] are biased at GND voltage of 0 volts. The selected read word line 14-2 is biased at 0 volts, word line 14-1 is biased at Vpp and the erase line 15-1 is biased at Vpp of 12 volts. The word lines 14-i and the erase lines 15-i of all the other pages and other array segments are biased at 0 volts. This voltage biasing can be accomplished by the use of row address decoders that have their outputs connected to the word lines and to the select lines. All the bit-line BLiN are biased at 0 volts. Under these voltage bias conditions the programmed floating gate 30D of a data memory cell 300D will emit electrons from its erase section 30s to the erase polysilicon gate 60se which is also the word line 15-1. This reduces the threshold voltage from 6 volts to a voltage of about 0.8 volts. During the erasure of a selected page of this tenth embodiment the memory cells that are within adjacent pages are not erased, therefore when erasing page PGWL2 that includes cells 1 to 6, data cells 11 to 16 along word line 14-1 of page PGWL1 are not erased. When erasing page PGWL1 that includes cells 11 to 16, data cells 1 to 6 along word line 14-2 of page PGWL1 are not erased.

In order to erase a selected block of memory cells the two read word 14-i lines of the selected block BAWL-i-(i+1) are biased at Vss of 0 volts, the associated erase line 15-i is biased at Vpp of 12 volts and the word lines 14-i and erase lines 15-i of the non-selected blocks are also biased at 0 volts. The segment select lines are biased at 0 volts as in the case of page erase. All bit lines BLiN are biased at 0 volts. It is to be noted that several adjacent and not adjacent blocks may be erased at the same time without erasing the entire memory array. It is also possible to erase the entire memory array simultaneously. When all the blocks of the memory array are erased simultaneously the mode of operation is called Flash erase.

Preferred embodiments of the invention have now been described. Various substitutions and alterations to these embodiments will be apparent to persons with ordinary skill in the art apprised by the teaching of this patent. It is therefore not intended that the invention be limited to the described embodiments, but that the invention be defined by the appended claims.

What is claimed is:

1. A process for fabricating a field-effect semiconductor memory device comprising the steps of:

(a) providing a structure including: (i) a silicon substrate of a first conductivity type having first conductivity type first region that forms a channel region of said device that has a first surface, and a second conductivity type second region that forms a drain region and a spaced apart source region of said device, and said channel is situated between said drain region and source region and having a drain area adjacent said drain region and having source area adjacent said source region; (ii) a first member disposed over said drain area and over at least a portion of said drain region of said substrate, said first member comprising a first gate dielectric layer having a first thickness disposed on said substrate, and a first conductive layer disposed on said first gate dielectric layer, wherein said first conductive layer having sidewalls including a first sidewall that is disposed over and insulated from said channel region and is laterally spaced apart from said drain region and is near said source area;

(b) growing a second dielectric of thermal oxide by oxidation of at least said first sidewall of said first conductive layer of said first member to a third thickness to form a thermally-grown portion of a gap-of-insulation-wall that is substantially perpendicular to said first surface of said channel region and by oxidation of said source area of the channel;

(c) depositing a third dielectric layer to a fourth thickness to be in contact with and conformal to said second thermal oxide over said source area and said third dielectric also forming a deposited portion of said gap-of-insulation-wall; and (d) forming a second conductive layer to be disposed over said first conductive layer in a manner to be insulated therefrom, and said second conductive layer is also formed to be in contact with said gap-of-insulation-wall including at the location that is opposite said first sidewall of said first conductive layer and in contact with said third dielectric layer over at least a portion of said source area thereby said first conductive layer and said second conductive layer forming a floating gate and a control gate respectively of an electrically programmable non-volatile transistor.

2. The process as defined in claim 1, wherein growing said second thermal oxide in step (b) is performed in a manner that retains said first thickness of said first gate dielectric layer substantially unchanged.

3. The process as defined in claim 1, wherein said second thermal oxide in step (b) is grown to said third thickness and said third dielectric layer of step (c) is a deposited TEOS based silicon dioxide that is formed to have said fourth thickness that is thicker than said third thickness of said second thermal oxide.

4. The process as defined in claim 3, wherein said second thermal oxide in step (b) and said third dielectric layer of step (c) form a second gate dielectric layer that is adjacent said first gate dielectric layer.

5. The process as defined in claim 2, wherein said first gate dielectric layer of step (a) consists of a first layer of thermal oxide that is disposed on and in contact with said substrate and a second layer of TEOS based silicon dioxide that is disposed on said first layer of thermal oxide.

6. The process as defined in claim 1, wherein at least a portion of said first conductive layer is formed of conductive silicon and at least a portion of said second conductive layer is formed of conductive silicon.

7. A process for fabricating a field-effect semiconductor device comprising the steps of:
  (a) providing an apparatus including: (i) a silicon substrate of a first conductivity type having first conductivity type first region that forms a channel region of said device that has a first surface, and a second conductivity type second region that forms a drain region of said device, and said channel having a drain area adjacent said drain region and having a source area; (ii) a first member disposed over said drain area and over at least a portion of said drain region of said substrate, said first member comprising a first gate dielectric layer having a first thickness disposed on said substrate, and a first conductive layer disposed on said first gate dielectric layer, wherein said first conductive layer having sidewalls including a first sidewall that is disposed over and insulated from said channel region and is laterally spaced apart from said drain region and is near said source area;
  (b) growing a second dielectric of thermal oxide by oxidation of at least said first sidewall of said first conductive layer of said first member to a third thickness to form a thermally-grown portion of a gap-of-insulation-wall that is substantially perpendicular to said first surface of said channel region and by oxidation of said source area of the channel;
  (c) depositing a third dielectric layer to a fourth thickness to be in contact with and conformal to said second thermal oxide over said source area and said third dielectric also forming a deposited portion of said gap-of-insulation-wall; and
  (d) forming a second conductive layer to be disposed over said first conductive layer in a manner to be insulated therefrom, and said second conductive layer is also formed to be in contact with said gap-of-insulation-wall including at the location that is opposite said first sidewall of said first conductive layer and in contact with said third dielectric layer over at least a portion of said source area.

8. The process as defined in claim 7 further comprising the step of:
  (e) forming a second conductivity type source region in said substrate so that said source region is adjacent said source area of said channel and laterally spaced apart from said drain region, thereby said first conductive layer and said second conductive layer forming a floating gate and a control gate respectively of an electrically programmable non-volatile device.

9. The process as defined in claim 7, wherein growing said second thermal oxide in step (b) is performed in a manner that retains said first thickness of said first gate dielectric layer substantially unchanged.

10. The process as defined in claim 1, wherein said second thermal oxide in step (b) is grown to said third thickness and said third dielectric layer of step (c) is a deposited TEOS based silicon dioxide that is formed to have said fourth thickness that is thicker than said third thickness of said second thermal oxide.

11. The process as defined in claim 8, wherein said first gate dielectric layer of step (a) consists of a first layer of thermal oxide that is disposed on and in contact with said substrate and a second layer of TEOS based silicon dioxide that is disposed on said first layer of thermal oxide.

12. A process for fabricating a field-effect semiconductor device comprising the steps of:
  (a) providing a structure including: (i) a silicon substrate of a first conductivity type having first conductivity type first region that forms a channel region of said device that has a first surface, and a second conductivity type second region that forms a drain region of said device, and said channel having a drain area adjacent said drain region and having a source area; (ii) a first member disposed over said drain area of said substrate, said first member comprising a first gate dielectric layer having a first thickness disposed on said substrate, and a first conductive layer disposed on said first gate dielectric layer, wherein said first conductive layer having sidewalls including a first sidewall that is disposed over and insulated from said channel region and is laterally spaced apart from said drain region and is near said source area;
  (b) growing a second dielectric of thermal oxide by oxidation of at least said first sidewall of said first conductive layer of said first member to a third thickness to form a thermally-grown portion of a gap-of-insulation-wall that is substantially perpendicular to said first surface of said channel region and by oxidation of said source area of the channel;
  (c) depositing a third dielectric layer to a fourth thickness to be in contact with and conformal to said second thermal oxide over said source area and said third dielectric also forming a deposited portion of said gap-of-insulation-wall; and
  (d) forming a second conductive layer to be disposed over said first conductive layer in a manner to be insulated therefrom, and said second conductive layer is also formed to be in contact with said gap-of-insulation-wall including at the location that is opposite said first sidewall of said first conductive layer and in contact with said third dielectric layer over at least a portion of said source area.

13. The process as defined in claim 12 further comprising the step of:
  (e) forming a second conductivity type source region in said substrate so that said source region is adjacent said source area of said channel and laterally spaced apart from said drain region, thereby said first conductive layer and said second conductive layer forming a floating gate and a control gate respectively of an electrically programmable non-volatile device.

14. The process as defined in claim 12, wherein growing said second thermal oxide in step (b) is performed in a manner that retains said first thickness of said first gate dielectric layer substantially unchanged.

15. The process as defined in claim 1, wherein said second thermal oxide in step (b) is grown to said third thickness and said third dielectric layer of step (c) is a deposited TEOS based silicon dioxide that is formed to have said fourth thickness that is thicker than said third thickness of said second thermal oxide.

16. The process as defined in claim 13, wherein said first gate dielectric layer of step (a) consists of a first layer of thermal oxide that is disposed on and in contact with said substrate and a second layer of TEOS based silicon dioxide that is disposed on said first layer of thermal oxide.

17. A process for fabricating a field-effect semiconductor device comprising the steps of:
  (a) providing a structure including: (i) a semiconductor substrate of a first-conductivity type having first-conductivity type first region that has a first surface, a first area and an adjacent second area, and a first second-conductivity type second region; (ii) a first member disposed over first area of said first region and comprising a first dielectric layer having a first thickness disposed on said substrate, and a first conductive layer disposed on said first dielectric layer wherein said first conductive layer having sidewalls including a first sidewall that is disposed over and insulated from said first conductivity type first region and said first sidewall is laterally spaced apart from said second-conductivity type second region and is adjacent said first-conductivity type second area;
  (b) growing and retaining a second dielectric of thermal oxide by oxidation of at least said first sidewall of said first-conductive layer to a third thickness and by oxidation of said first-conductivity type second area; and
  (c) depositing a third dielectric layer to be in permanent contact with and conformal to said second thermal oxide to form a first gap-of-insulation-wall that is perpendicular to said first surface of said first-conductivity type first region of said substrate and so that said first gap-of-insulation-wall is in contact with said first sidewall of said first conductive layer;
  (d) forming a second second-conductivity type second region to form a source region in said substrate so that said source region is adjacent said second area and is laterally spaced apart from said first second-conductivity type second region; and
  (e) forming a second conductive layer to be disposed over said first conductive layer in a manner to be insulated therefrom, and said second conductive layer is also formed to be in contact with said gap-of-insulation-wall including at the location that is opposite said first sidewall of said first conductive layer and in contact with said third dielectric layer over said second area, thereby said first second-conductivity type second region forms a drain region of said device, and said first conductivity type first region forms a channel region of said device, said first area and a second area of said channel forming drain area and source area respectively of said channel, and said first dielectric layer forms a first gate oxide, and said first conductive layer and said second conductive layer forming a floating gate and a control gate respectively of a programmable non-volatile device.

18. The process as defined in claim 17, wherein said second thermal oxide of step (b) and said third dielectric of step (c) form a second gate oxide that is adjacent said first gate oxide.

19. The process as defined in claim 18, wherein said second thermal oxide of step (b) is grown to a first thickness and said third dielectric of step ( c) is a TEOS based deposited oxide that is thicker than said first thickness of said second thermal oxide that is disposed on said first layer of thermal oxide.

20. The process as defined in claim 17 wherein said growth of said second oxide at said first conductivity type second area of said substrate is carried out at a temperature of less than 875° C. in a wet oxidation process.

21. The process as defined in claim 17 wherein said first dielectric layer is capable of exhibiting electric charge transport between said first conductive layer and said substrate.

22. The process as defined in claim 17 wherein said first dielectric layer transports tunneling current between one of said conductivity type second regions and said first conductive layer.

23. The process as defined in claim 17 wherein said first dielectric layer is under 250 angstroms thick.

24. The process as defined in claim 17 wherein said second conductivity type second regions of said substrate are formed by implanting ions.

25. The process as defined in claim 17 herein one of said second regions is doped with an n-type dopant to a first level of doping and the other of said second regions is doped with an n-type dopant to a second level of doping, said first level of doping being different from said second level of doping.

26. The process as defined in claim 17 wherein one of said second regions is doped with an n-type dopant to a first depth of doping and the other of said second regions is doped with an n-type dopant to a second depth of doping, said first depth of doping being different from said second depth of doping.

27. The process as defined in claim 17 wherein one of said second regions is doped with an n-type dopant to a first level of doping and the other of said second regions is doped with an n-type dopant to a second level of doping, said first level of doping being higher than said second level of doping and wherein said second region with higher level of doping forms a drain of programmable field-effect transistor (FET) and said second regions with lower level of doping forms a source of said programmable FET.

28. The process as defined in claim 17 wherein one of said second regions is doped with an n-type dopant to a first depth of doping and the other of said second regions is doped with an n-type dopant to a second depth of doping, said first depth of doping being deeper than said second depth of doping and wherein said second region with deeper depth of doping form drains of a programmable field-effect transistor (FET) and said second region with shallower depth of doping forms a source of said programmable FET.

29. The process as defined in claim 17 further comprising the step of forming at least one spacer along said first conductive layer before the formation of said control gate, and permanently retaining at least a portion of said spacer under said control gate with a thin insulator there between, whereby said thin insulator is disposed over and in contact with said spacer and said thin insulator is disposed under and in contact with said control gate.

30. The process as defined in claim 17 wherein one of said second regions is doped with an n-type dopant to a first level of doping and the other of said second regions is doped with an n-type dopant to a second level of doping, said first level of doping being different from said second level of doping, and said substrate is a monocrystalline silicon that is p-type doped.

31. The process as defined in claim 17 wherein one of said second regions is doped with an n-type dopant to a first depth of doping and the other of said second regions is doped with an n-type dopant to a second depth of doping, said first depth of doping being different from said second depth of doping, and said silicon substrate is p-type doped.

* * * * *